United States Patent
Okazaki et al.

(10) Patent No.: US 8,305,109 B2
(45) Date of Patent: Nov. 6, 2012

(54) LOGIC CIRCUIT, LIGHT EMITTING DEVICE, SEMICONDUCTOR DEVICE, AND ELECTRONIC DEVICE

(75) Inventors: Kenichi Okazaki, Tochigi (JP);
Yoshiaki Oikawa, Kanagawa (JP);
Hotaka Maruyama, Tochigi (JP);
Hiromichi Godo, Kanagawa (JP);
Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/880,312

(22) Filed: Sep. 13, 2010

(65) Prior Publication Data
US 2011/0062992 A1    Mar. 17, 2011

(30) Foreign Application Priority Data
Sep. 16, 2009   (JP) ................. 2009-215081

(51) Int. Cl.
*H03K 17/16* (2006.01)
*H03K 19/003* (2006.01)
(52) U.S. Cl. .......... 326/25; 326/102; 326/113; 257/205; 257/392
(58) Field of Classification Search ............... 326/25, 326/102, 112–113; 257/205, 392
See application file for complete search history.

(56) References Cited

U.S. PATENT DOCUMENTS

| | | |
|---|---|---|
| 5,338,959 A | 8/1994 | Kim et al. |
| 5,731,856 A | 3/1998 | Kim et al. |
| 5,744,864 A | 4/1998 | Cillessen et al. |
| 5,847,410 A | 12/1998 | Nakajima |
| 5,949,397 A * | 9/1999 | Koyama et al. ............... 345/100 |
| 6,294,274 B1 | 9/2001 | Kawazoe et al. |
| 6,295,047 B1 | 9/2001 | Koyama et al. |
| 6,476,791 B2 | 11/2002 | Koyama et al. |

(Continued)

FOREIGN PATENT DOCUMENTS
EP       1737044 A      12/2006
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Jason M Crawford
(74) *Attorney, Agent, or Firm* — Eric J. Robinson; Robinson Intellectual Property Law Office, P.C.

(57) ABSTRACT

An object is to obtain a desired threshold voltage of a thin film transistor using an oxide semiconductor. Another object is to suppress a change of the threshold voltage over time. Specifically, an object is to apply the thin film transistor to a logic circuit formed using a transistor having a desired threshold voltage. In order to achieve the above object, thin film transistors including oxide semiconductor layers with different thicknesses may be formed over the same substrate, and the thin film transistors whose threshold voltages are controlled by the thicknesses of the oxide semiconductor layers may be used to form a logic circuit. In addition, by using an oxide semiconductor film in contact with an oxide insulating film formed after dehydration or dehydrogenation treatment, a change in threshold voltage over time is suppressed and the reliability of a logic circuit can be improved.

24 Claims, 33 Drawing Sheets

U.S. PATENT DOCUMENTS

| | | | |
|---|---|---|---|
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,897,847 B2 | 5/2005 | Koyama et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,119,784 B2 | 10/2006 | Koyama et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,348,956 B2 | 3/2008 | Koyama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,987 B2 | 2/2009 | Genrikh et al. |
| 7,501,293 B2 | 3/2009 | Ito et al. |
| 7,674,650 B2 | 3/2010 | Akimoto et al. |
| 7,732,819 B2 * | 6/2010 | Akimoto et al. ............... 257/72 |
| 7,952,392 B2 | 5/2011 | Koyama et al. |
| 8,067,775 B2 | 11/2011 | Miyairi et al. |
| 8,106,400 B2 | 1/2012 | Miyairi et al. |
| 2001/0030323 A1 | 10/2001 | Ikeda |
| 2001/0046027 A1 | 11/2001 | Tai et al. |
| 2002/0024497 A1 | 2/2002 | Koyama et al. |
| 2002/0043662 A1 | 4/2002 | Yamazaki et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2003/0102519 A1 | 6/2003 | Koyama et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0051823 A1 | 3/2004 | Choi |
| 2004/0127038 A1 | 7/2004 | Carcia et al. |
| 2004/0184027 A1 | 9/2004 | Mizutani et al. |
| 2004/0257135 A1 * | 12/2004 | Karaki ............... 327/199 |
| 2005/0017302 A1 | 1/2005 | Hoffman |
| 2005/0162579 A1 | 7/2005 | Jeong et al. |
| 2005/0179636 A1 | 8/2005 | Koyama et al. |
| 2005/0199959 A1 | 9/2005 | Chiang et al. |
| 2005/0199960 A1 | 9/2005 | Hoffman et al. |
| 2005/0206607 A1 | 9/2005 | Koyama et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292726 A1 | 12/2006 | Akimoto et al. |
| 2006/0292777 A1 | 12/2006 | Dunbar |
| 2007/0024187 A1 | 2/2007 | Shin et al. |
| 2007/0024569 A1 | 2/2007 | Koyama et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0178710 A1 * | 8/2007 | Muyres et al. ............... 438/778 |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0262793 A1 * | 11/2007 | Kapoor ............... 326/101 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042217 A1 | 2/2008 | Jeong et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025678 A1 | 2/2010 | Yamazaki et al. |
| 2010/0065844 A1 | 3/2010 | Tokunaga |
| 2010/0084650 A1 | 4/2010 | Yamazaki et al. |
| 2010/0084651 A1 | 4/2010 | Yamazaki et al. |
| 2010/0085081 A1 * | 4/2010 | Ofuji et al. ............... 326/102 |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0136743 A1 | 6/2010 | Akimoto et al. |
| 2010/0163868 A1 | 7/2010 | Yamazaki et al. |
| 2010/0252826 A1 | 10/2010 | Yamazaki et al. |
| 2010/0301326 A1 | 12/2010 | Miyairi et al. |
| 2012/0061668 A1 | 3/2012 | Miyairi et al. |
| 2012/0104386 A1 | 5/2012 | Miyairi et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 2226847 A | 9/2010 |
| JP | 60-198861 A | 10/1985 |

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-156676 A | 6/1990 |
| JP | 03-231472 A | 10/1991 |
| JP | 05-251705 A | 9/1993 |
| JP | 06-202156 A | 7/1994 |
| JP | 08-264794 A | 10/1996 |
| JP | 10-290012 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273228 A | 9/2003 |
| JP | 2003-280034 A | 10/2003 |
| JP | 2003-309266 A | 10/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 A | 5/2007 |
| JP | 2007-133434 A | 5/2007 |
| JP | 2007-150158 A | 6/2007 |
| JP | 2007-250983 A | 9/2007 |
| JP | 2007-529119 | 10/2007 |
| JP | 2008-171989 A | 7/2008 |
| JP | 2009-004733 A | 1/2009 |
| WO | WO-2004/114391 | 12/2004 |
| WO | WO-2005/093850 | 10/2005 |
| WO | WO-2007/119386 | 10/2007 |
| WO | WO-2008/143304 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Cho.Y et al., "Characteristics of a-Si:H Dual-Gate TFTS Using ITO Electrode for LCD Driver,", AM-FPD '08 Digest of Technical Papers, Jul. 2, 2008, pp. 229-232.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15TH International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350°C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Takahashi et al., "4p-N-10 Back-channel control in amorphous In-Ga-Zn-O TFTs,", 69th Japan Society of Applied Physics, Sep. 1, 2008, No. 2, p. 851.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD +08 Digest of Technical Papers, Jul. 2, 2008, pp. 251-252, The Japan Society of Applied Physics.

International Search Report (Application No. PCT/JP2009/067289) Dated Nov. 2, 2009.

Written Opinion (Application No. PCT/JP2009/067289) Dated Nov. 2, 2009.

Jeong.J et al., "3.1: Distinguished Paper: 12.1-Inch WXGA AMOLED Display Driven by Indium-Gallium-Zinc Oxide TFTs Array," , SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H at al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering, ", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '09 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000 °C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Eng.Phys. Rev. Lett. (Physical Review Letters), Jan. 26, 2007, vol. 98, pp. 045501-1-045501-4.

Park.J at al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers, ", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/065672) Dated Nov. 22, 2010.

Written Opinion (Application No. PCT/JP2010/065672) Dated Nov. 22, 2010.

* cited by examiner

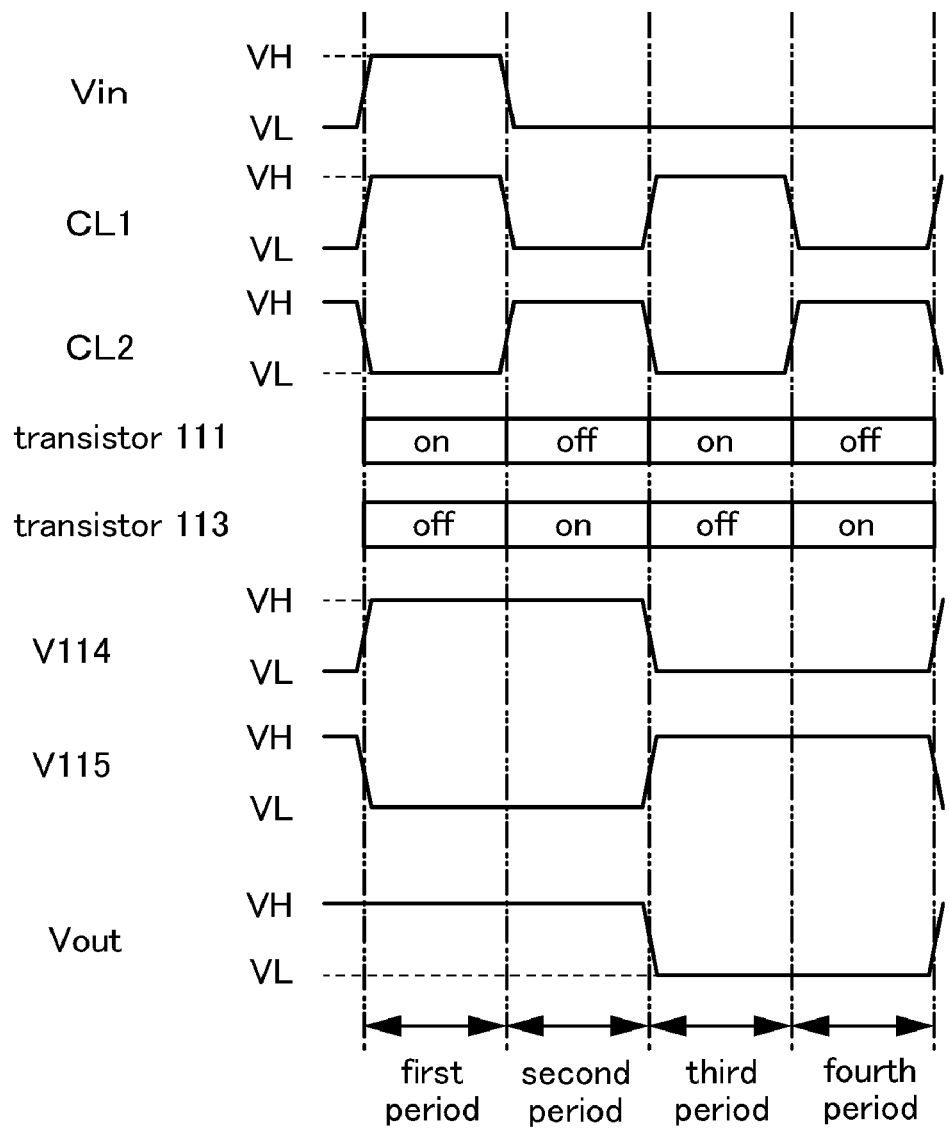

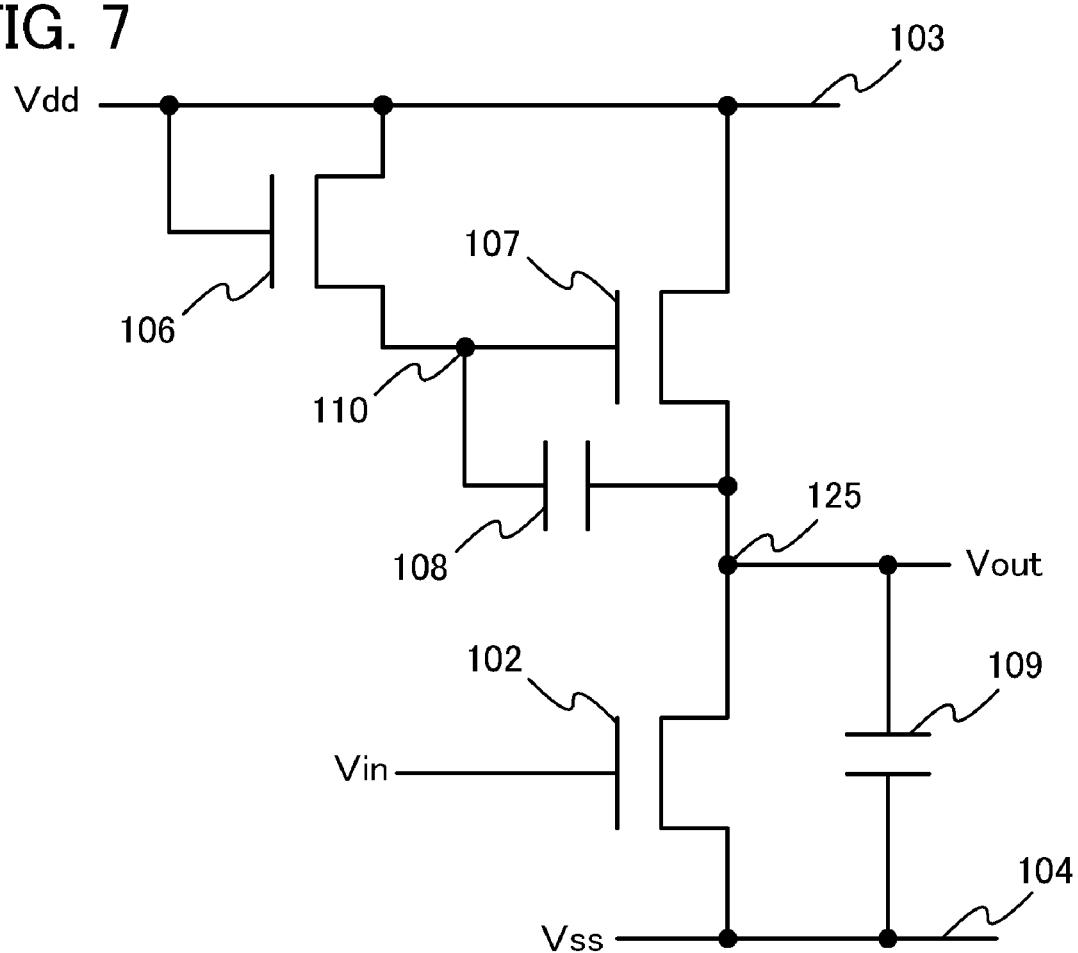

FIG. 23A1
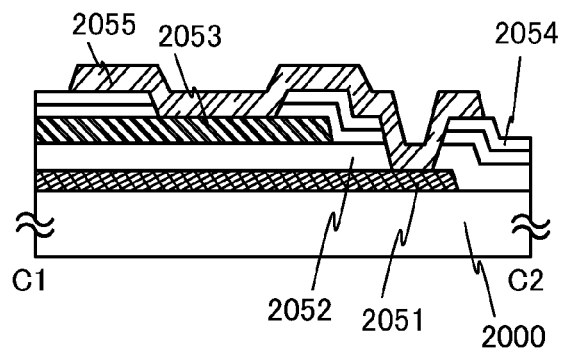
FIG. 23A2
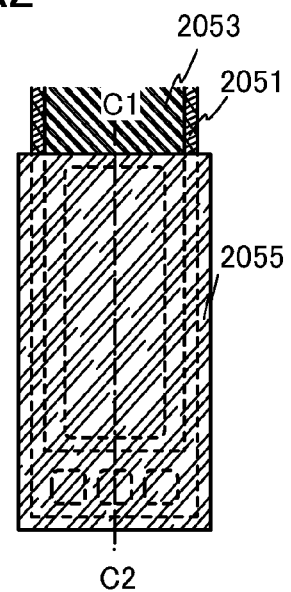
FIG. 23B1
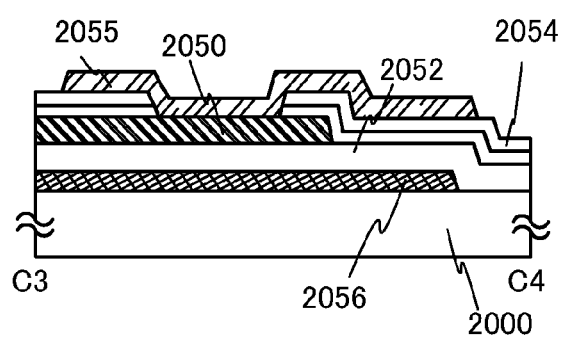
FIG. 23B2
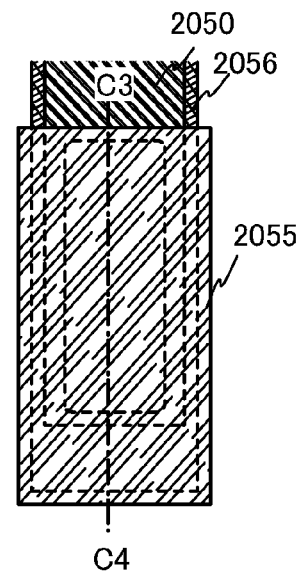

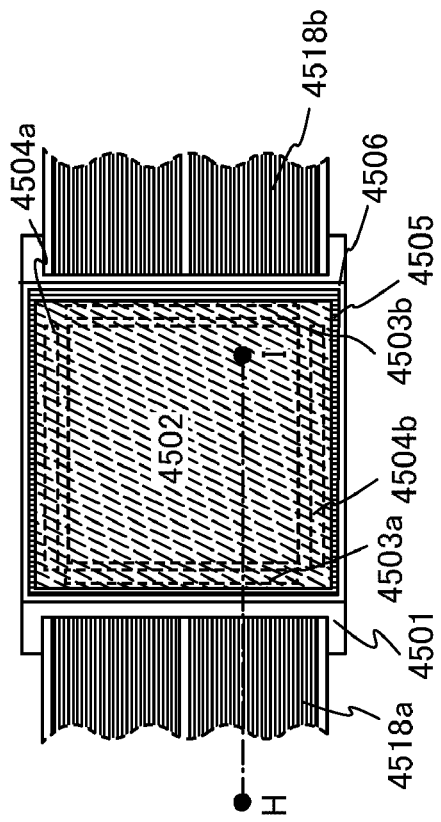
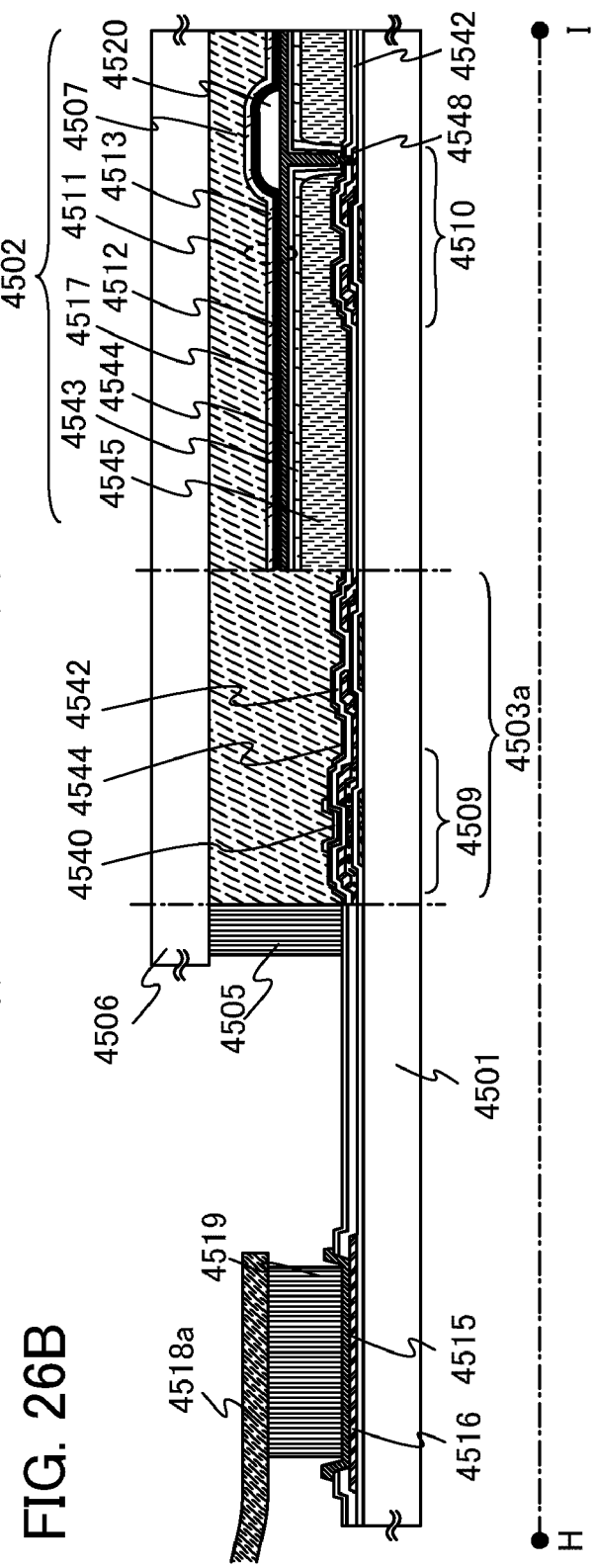
FIG. 26A
FIG. 26B

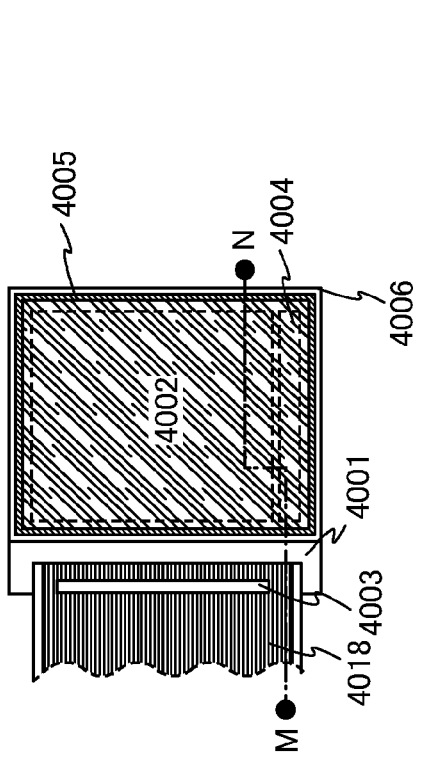
FIG. 29A1
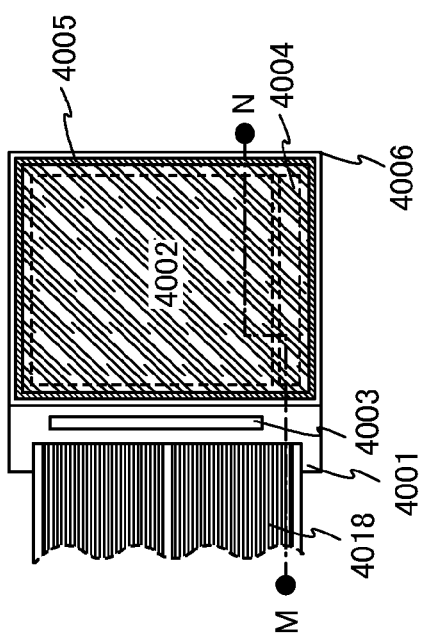
FIG. 29A2
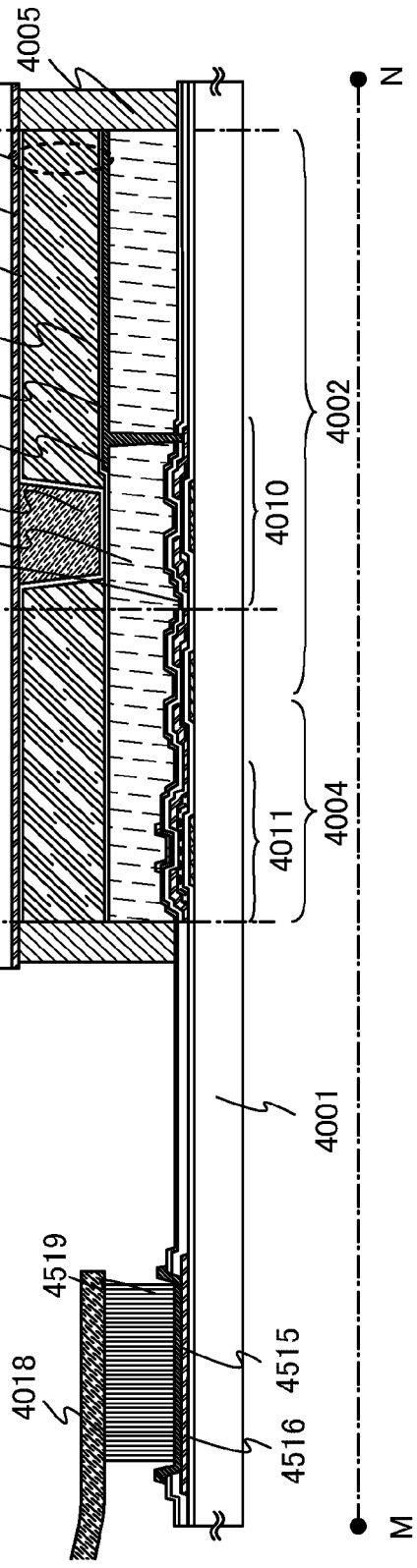
FIG. 29B

LOGIC CIRCUIT, LIGHT EMITTING DEVICE, SEMICONDUCTOR DEVICE, AND ELECTRONIC DEVICE

TECHNICAL FIELD

The present invention relates to a circuit including a thin film transistor using an oxide semiconductor. Specifically, the present invention relates to a logic circuit.

BACKGROUND ART

A thin film transistor (TFT) formed over a flat plate such as a glass substrate, which is typically used in a liquid crystal display device, is generally formed using a semiconductor material such as amorphous silicon or polycrystalline silicon. While a TFT using amorphous silicon has low field effect mobility, the TFT can be relatively easily formed over a large-area glass substrate. On the other hand, while a TFT using polycrystalline silicon has high field effect mobility, the TFT requires a crystallization step such as laser annealing and cannot necessarily be easily formed over a large-area glass substrate.

Thus, a technique in which a TFT is formed using an oxide semiconductor as a semiconductor material and applied to an electronic device or an optical device has attracted attention. For example, Patent Documents 1 and 2 each disclose a technique in which a TFT is formed using zinc oxide or an In—Ga—Zn—O-based oxide semiconductor as a semiconductor material and used for a switching element or the like in an image display device.

A TFT using an oxide semiconductor for a channel formation region (also referred to as a channel region) can have a higher field effect mobility than a TFT using amorphous silicon. An oxide semiconductor film can be formed at a temperature of 300° C. or lower by a sputtering method or the like, and a manufacturing process of the TFT using an oxide semiconductor is simpler than that of the TFT using polycrystalline silicon.

TFTs which are formed using such an oxide semiconductor over a glass substrate, a plastic substrate, or the like are expected to be applied to display devices such as a liquid crystal display, an electroluminescent display (also referred to as an EL display), and electronic paper.

In the case where the TFTs using an oxide semiconductor are applied to a display device, the TFTs can be applied to, for example, TFTs included in a pixel portion or TFTs included in a driver circuit. Note that a driver circuit of a display device includes, for example, a shift register circuit, a buffer circuit, or the like, and the shift register circuit and the buffer circuit further include a logic circuit. By applying the TFT using an oxide semiconductor to a logic circuit of a driver circuit, the driver circuit can be driven at higher speed than in the case of applying a TFT using amorphous silicon.

In addition, the logic circuit can be formed with TFTs all having the same conductivity type. By manufacturing a logic circuit using TFTs all having the same conductivity type, a process can be simplified.

REFERENCES

[Patent Document 1] Japanese Published Patent Application No. 2007-123861
[Patent Document 2] Japanese Published Patent Application No. 2007-96055

DISCLOSURE OF INVENTION

However, a conventional TFT using an oxide semiconductor tends to be a depletion-type TFT, which is normally on, and the threshold voltage of the TFT shifts over time. Accordingly, it has been difficult to apply the conventional TFT using the oxide semiconductor to a logic circuit formed using a transistor having a desired threshold voltage, for example, an enhancement-type transistor, which is normally off.

In view of the above problems, an object is to obtain a desired threshold voltage of a thin film transistor using an oxide semiconductor. Another object is to suppress a change of the threshold voltage over time. Specifically, an object is to apply the thin film transistor to a logic circuit formed using a transistor having a desired threshold voltage.

In order to achieve the above object, thin film transistors including oxide semiconductor layers with different thicknesses are formed over the same substrate, and the thin film transistors whose threshold voltages are controlled by the thicknesses of the oxide semiconductor layers are used to form a logic circuit. In addition, by using an oxide semiconductor film in contact with an oxide insulating film which is formed after dehydration or dehydrogenation treatment, a change of the threshold voltage over time is suppressed and the reliability of a logic circuit can be improved.

In other words, an embodiment of the present invention is a logic circuit as described as follows. The logic circuit includes a depletion-type transistor in which a high power supply potential is applied to one of a source and a drain and a gate is connected to the other of the source and the drain, and an enhancement-type transistor in which one of a source and a drain is connected to the gate of the depletion-type transistor and a low power supply potential is applied to the other of the source and the drain. The depletion-type transistor and the enhancement-type transistor each include a gate electrode, a gate insulating film over the gate electrode, an oxide semiconductor layer over the gate insulating film, a source electrode and a drain electrode which edge portions of the gate electrode overlap and which are in contact with the oxide semiconductor layer, and an oxide insulating film in contact with the oxide semiconductor layer and over a channel formation region. The thickness of the oxide semiconductor layer of the depletion-type transistor is larger than the thickness of the oxide semiconductor layer of the enhancement-type transistor. Then, a first signal is input to the gate electrode of the enhancement-type transistor, and a potential of a portion where the enhancement-type transistor and the depletion-type transistor are connected to each other is output as a second signal.

An embodiment of the present invention is a logic circuit as described as follows. The logic circuit includes a first transistor in which a first clock signal is input to a gate and an input signal is input to one of a source and a drain, a first inverter circuit whose input terminal is electrically connected to the other of the source and the drain of the first transistor, a second inverter circuit whose input terminal is electrically connected to an output terminal of the first inverter circuit, a third inverter circuit whose input terminal is electrically connected to the output terminal of the first inverter circuit and which outputs an output signal from an output terminal, and a second transistor in which a second clock signal is input to a gate, one of a source and a drain is electrically connected to the other of the source and the drain of the first transistor, and the other of the source and the drain is electrically connected to an output terminal of the second inverter circuit. The first inverter circuit and the second inverter circuit include the above-described logic circuit.

In an embodiment of the present invention, the oxide semiconductor layer of the above-described logic circuit may include indium, gallium, and zinc.

An embodiment of the present invention is a logic circuit as described as follows. The logic circuit includes a depletion-type transistor in which a high power supply potential is applied to one of a source and a drain and a gate is connected to the other of the source and the drain, and an enhancement-type transistor in which one of a source and a drain is connected to the gate of the depletion-type transistor and a low power supply potential is applied to the other of the source and the drain. The depletion-type transistor and the enhancement-type transistor each include a gate electrode, a gate insulating film over the gate electrode, and a source electrode and a drain electrode which edge portions of the gate electrode overlap and which are provided over the gate insulating film. The transistors also each include an oxide semiconductor layer covering the edge portion of the source electrode and the drain electrode over the gate electrode, and an oxide insulating film in contact with the oxide semiconductor layer and over a channel formation region. The thickness of the oxide semiconductor layer of the depletion-type transistor is larger than the thickness of the oxide semiconductor layer of the enhancement-type transistor. In addition, a first signal is input to the gate electrode of the enhancement-type transistor, and a potential of a portion where the enhancement-type transistor and the depletion-type transistor are connected to each other is output as a second signal.

An embodiment of the present invention is a logic circuit as described as follows. The logic circuit includes a first transistor in which a first clock signal is input to a gate and an input signal is input to one of a source and a drain, a first inverter circuit whose input terminal is electrically connected to the other of the source and the drain of the first transistor, a second inverter circuit whose input terminal is electrically connected to an output terminal of the first inverter circuit, a third inverter circuit whose input terminal is electrically connected to the output terminal of the first inverter circuit and which outputs an output signal from an output terminal, and a second transistor in which a second clock signal is input to a gate, one of a source and a drain is electrically connected to the other of the source and the drain of the first transistor, and the other of the source and the drain is electrically connected to an output terminal of the second inverter circuit. The first inverter circuit and the second inverter circuit include the above-described logic circuit.

In an embodiment of the present invention, the oxide semiconductor layer of the above-described logic circuit may include indium, gallium, and zinc.

Note that the expression "B is formed on A" or "B is formed over A" in this specification does not necessarily mean that B is formed on and in direct contact with A, but includes the case where B is not in direct contact with A, namely, the case where another object is provided between A and B. Here, each of A and B corresponds to an object (e.g., a device, an element, a circuit, a wiring, an electrode, a terminal, a film, or a layer).

Therefore, for example, the expression "a layer B is formed on a layer A" or "a layer B is formed over a layer A" includes both the case where the layer B is formed on and in direct contact with the layer A and the case where another layer (e.g., a layer C or a layer D) is formed on and in direct contact with the layer A and the layer B is formed on and in direct contact with the layer C or D. Note that the other layer (e.g., the layer C or the layer D) may be a single layer or a plurality of layers.

Note that a transistor which can be regarded as having no drain current flowing therein when a gate voltage applied to a gate electrode is 0 V and a voltage applied between a source and a drain is at least 1 V is defined as a normally off transistor in this specification. In addition, a transistor which can be regarded as having a drain current flowing therein when a gate voltage applied to a gate electrode is 0 V and a voltage applied between a source and a drain is at least 1 V is defined as a normally on transistor.

Alternatively, an n-channel transistor having a positive threshold voltage is defined as a normally off transistor in this specification, and an n-channel transistor having a negative threshold voltage is defined as a normally on transistor. In addition, a p-channel transistor having a negative threshold voltage is defined as a normally off transistor, and a p-channel transistor having a positive threshold voltage is defined as a normally on transistor.

More specifically, an n-channel transistor having a positive gate voltage when drain current-gate voltage characteristics are measured and a drain current is $1\times10^{-12}$ is defined as a normally off transistor in this specification. In addition, an n-channel transistor having a negative gate voltage when drain current-gate voltage characteristics are measured and a drain current is $1\times10^{-12}$ A is defined as a normally on transistor.

Note that in this specification, a light emitting device includes an image display device (a light emitting display device), a light source (including a lighting device) or the like. Furthermore, the light emitting device includes all of the following modules in its category: a module in which a connector such as a flexible printed circuit (FPC), a tape automated bonding (TAB) tape, or a tape carrier package (TCP) is attached to a light emitting device; a module having a TAB tape or a TCP provided with a printed wiring board at the end thereof; and a module having an integrated circuit (IC) directly mounted by a chip-on-glass (COG) method on a substrate provided with a light emitting element.

With the use of an oxide semiconductor having high field effect mobility, an enhancement-type thin film transistor having a suppressed change in threshold voltage over time can be provided. In addition, by application of the thin film transistor, a logic circuit which can be driven at high speed and has high reliability can be provided.

BRIEF DESCRIPTION OF DRAWINGS

FIG. 6 is a timing chart illustrating operation of a logic circuit in Embodiment 1.

FIG. 7 is a circuit diagram illustrating a circuit configuration of a logic circuit in Embodiment 1.

FIGS. 23A1, 23A2, 23B1, and 23B2 each illustrate a structure of a wiring terminal portion in a display device in Embodiment 7.

FIGS. 26A and 26B are a top view and a cross-sectional view illustrating a structure of a display device in Embodiment 8.

FIGS. 29A1, 29A2, and 29B are top views and a cross-sectional view illustrating a structure of a display device in Embodiment 10.

BEST MODE FOR CARRYING OUT THE INVENTION

Figure 1:
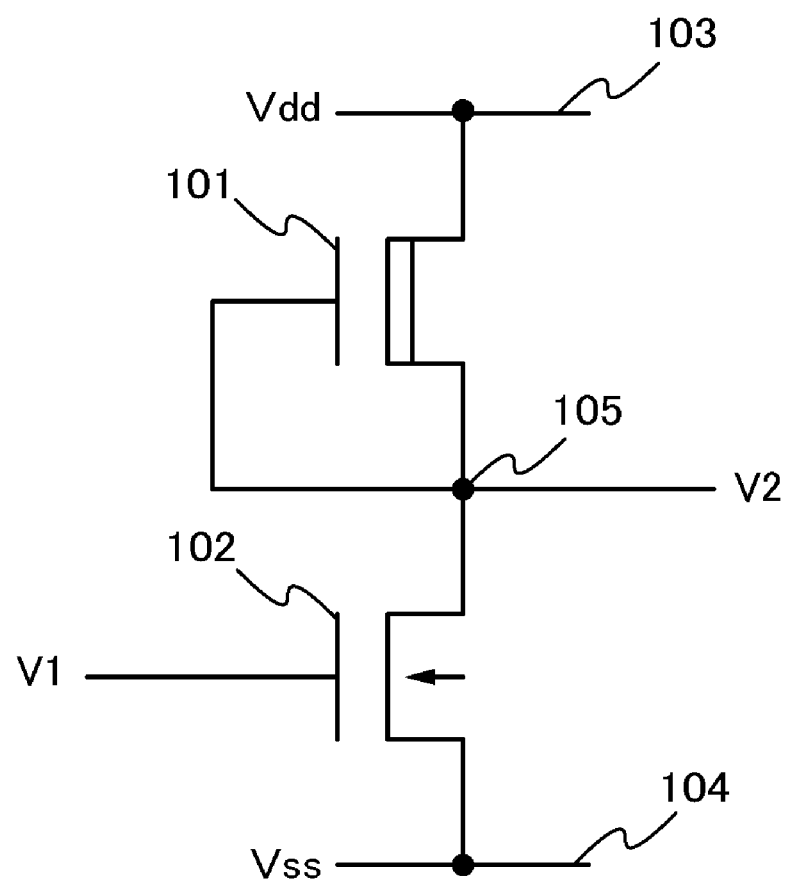
FIG. 1 is a circuit diagram illustrating a circuit configuration of a logic circuit in Embodiment 1.

Embodiments of the present invention will be described in detail with reference to the accompanying drawings. Note that the present invention is not limited to the following description, and various changes and modifications for the modes and details thereof will be apparent to those skilled in the art unless such changes and modifications depart from the spirit and scope of the invention. Therefore, the present invention should not be interpreted as being limited to the description in the embodiments below. Note that the same portions or portions having similar functions are commonly denoted by the same reference numerals in different drawings, and repetitive description thereof is omitted.

Embodiment 1

In this embodiment, one embodiment of a logic circuit will be described.

First, a circuit configuration of a logic circuit in this embodiment will be described with reference to FIG. 1. FIG. 1 is a circuit diagram illustrating a circuit configuration of a logic circuit in this embodiment.

The logic circuit illustrated in FIG. 1 is a combinational logic circuit including a transistor 101 and a transistor 102.

Note that in this document (the specification, the claims, the drawings, and the like), a transistor has at least three terminals of a gate, a source, and a drain.

The gate is the entire gate electrode and gate wiring or part thereof. The gate wiring is a wiring for electrically connecting a gate electrode of at least one transistor to another electrode or another wiring, and includes a scan line in a display device in its category, for example.

The source is the entire source region, source electrode, and source wiring or part thereof. The source region refers to a region in a semiconductor layer, where the resistivity is equal to or less than a given value. The source electrode refers to part of a conductive layer, which is connected to the source region. The source wiring refers to a wiring for electrically connecting a source electrode of at least one transistor to another electrode or another wiring. For example, in the case where a signal line in a display device is electrically connected to a source electrode, the source wiring includes the signal line in its category.

The drain is the entire drain region, drain electrode, and drain wiring or part thereof. The drain region refers to a region in a semiconductor layer, where the resistivity is equal to or less than a given value. The drain electrode refers to part of a conductive layer, which is connected to the drain region. The drain wiring refers to a wiring for electrically connecting a drain electrode of at least one transistor to another electrode or another wiring. For example, in the case where a signal line in a display device is electrically connected to a drain electrode, the drain wiring includes the signal line in its category.

In addition, in this document (the specification, the claims, the drawings, and the like), a source and a drain of a transistor change depending on the structure, the operating conditions, or the like of the transistor; therefore, it is difficult to determine which is the source and which is the drain. Accordingly, in this document (the specification, the claims, the drawings, and the like), one terminal which is freely selected from the source and the drain is referred to as one of the source and the drain, whereas the other terminal is referred to as the other of the source and the drain.

The transistor 101 is a depletion-type transistor (also referred to as a depletion transistor). One of a source and a drain of the transistor 101 is electrically connected to a power supply line 103, and a high power supply potential (Vdd) is applied to one of the source and the drain through the power supply line 103. Moreover, a gate and the other of the source and the drain of the transistor 101 are electrically connected to each other (i.e., the transistor 101 is diode-connected). Note that an example of a depletion transistor is an n-channel transistor having a negative threshold voltage.

The transistor 102 is an enhancement-type transistor (also referred to as an enhancement transistor). One of a source and a drain of the transistor 102 is electrically connected to the other of the source and the drain of the transistor 101. The other of the source and the drain of the transistor 102 is electrically connected to a power supply line 104, and a low power supply potential (Vss) is applied to one of the source and the drain of the transistor 102 through the power supply line 104. The low power supply potential is a ground potential (VGND) or a given potential, for example. Note that an example of an enhancement transistor is an n-channel transistor having a positive threshold voltage.

The high power supply potential has a value relatively larger than that of the low power supply potential. The low power supply potential has a value relatively smaller than that of the high power supply potential. Each value is set as appropriate in accordance with specifications of a circuit or the like, and thus there is no particular limitation on the value. For example, when Vdd>Vss, |Vdd|>|Vss| is not always satisfied. Moreover, when Vdd>Vss, VGND≧Vss is not always satisfied.

Further, transistors of the same conductivity type can be used for the transistors 101 and 102. In this embodiment, the case where the transistors 101 and 102 are n-channel transistors is described as an example.

Next, operation of the logic circuit illustrated in FIG. 1 will be described. In the logic circuit in this embodiment, a first signal is input to a gate of the transistor 102, and a potential of a portion (also referred to as a node) 105 where the transistors 101 and 102 are connected to each other is output as a second signal. The specific operation will be described below.

Figure 2A:
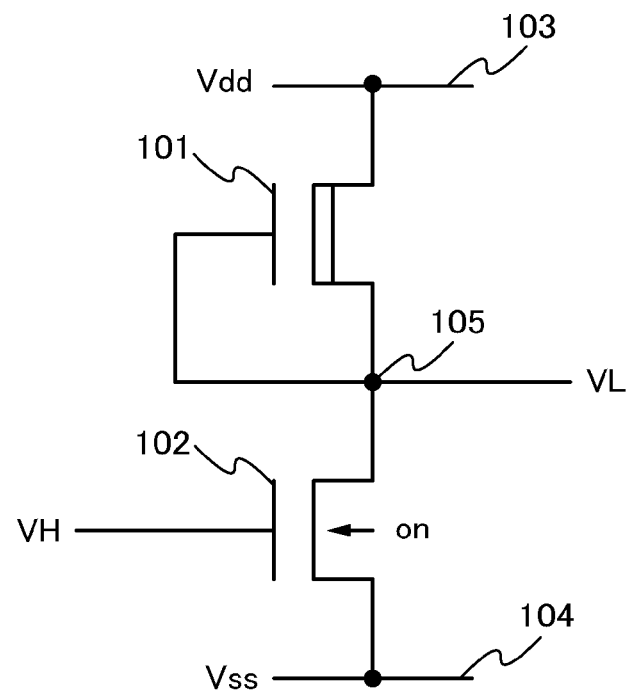
FIGS. 2A and 2B are circuit diagrams for illustrating operation of a logic circuit in Embodiment 1.
Figure 2B:
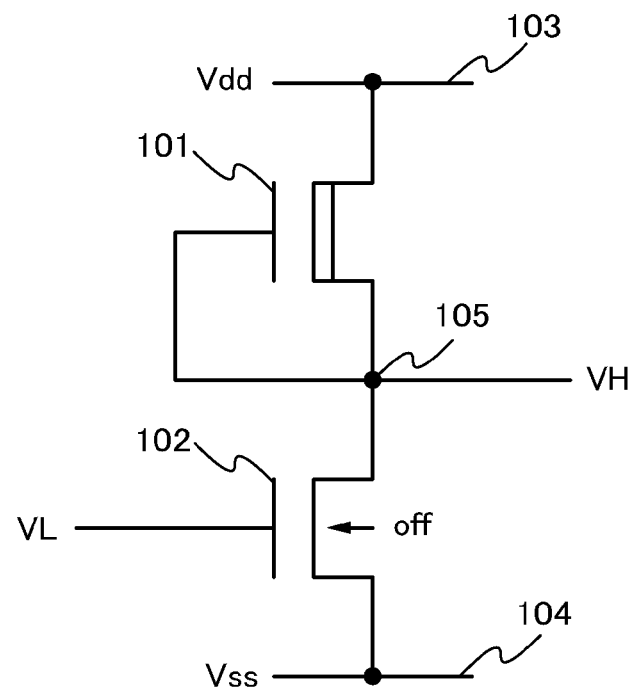

The operation of the logic circuit in this embodiment can be classified into two categories depending on whether the first signal is in a low state or a high state. A low state is a state where a potential is relatively low as compared to a high state, and a high state is a state where a potential is relatively high as compared to a low state. Both cases will be described with reference to FIGS. 2A and 2B. FIGS. 2A and 2B illustrate operation of the logic circuit in this embodiment. Note that in this embodiment, the case where data is 0 in a low state and data is 1 in a high state is described as an example; however, one embodiment of the invention is not limited thereto, and data can be 1 in a low state and can be 0 in a high state. Note that a potential in a low state is referred to as a low potential (VL), and a potential in a high state is referred to as a high potential (VH). Values of the low potential and the high potential are not limited to specific values, and the low potential should be equal to or lower than a given value and the high potential should be equal to or higher than the given value.

FIG. 2A illustrates the operation in the case where a potential (V1) of the first signal is high (i.e., V1=VH). As illustrated in FIG. 2A, in the case where V1=VH, the transistor 102 is turned on. When the transistor 102 is on, the resistance (R102) of the transistor 102 is lower than the resistance (R101) of the transistor 101 (i.e., R102<R101); accordingly, a potential (V105) of the node 105 is VL and a potential (V2) of the second signal is VL.

FIG. 2B illustrates the operation in the case where V1=VL. As illustrated in FIG. 2B, in the case where V1=VL, the transistor 102 is turned off. When the transistor 102 is off, R102 is higher than R101, so that V105 is VH and V2 is VH. At this time, when the threshold voltage of the transistor 101 is Vth101, the value of VH, which is the potential of the second signal, is (Vdd−Vth101). The above is the operation of the logic circuit illustrated in FIG. 1.

Figure 3:
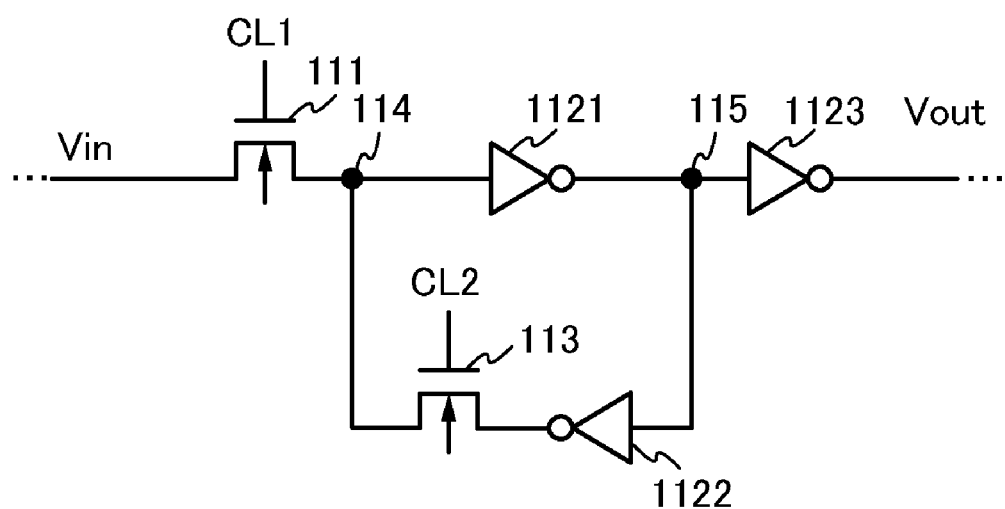
FIG. 3 is a circuit diagram illustrating a circuit configuration of a logic circuit in Embodiment 1.

Further, a sequential logic circuit can be formed using the combinational logic circuit illustrated in FIG. 1. A circuit configuration of a logic circuit using a combinational circuit will be described with reference to FIG. 3. FIG. 3 is a circuit diagram illustrating a circuit configuration of a logic circuit in this embodiment.

A logic circuit illustrated in FIG. 3 includes a transistor 111, an inverter 1121, an inverter 1122, an inverter 1123, and a transistor 113.

A first clock signal (CL1) is input to a gate of the transistor 111, and a signal is input to one of a source and a drain of the transistor 111. The signal input to one of the source and the drain is referred to as an input signal.

An input terminal of the inverter 1121 is electrically connected to the other of the source and the drain of the transistor 111.

An input terminal of the inverter 1122 is electrically connected to an output terminal of the inverter 1121.

An input terminal of the inverter 1123 is electrically connected to the output terminal of the inverter 1121. A second signal is output from an output terminal of the inverter 1123.

The logic circuit illustrated in FIG. 1 can be applied to each of the inverters 1121 to 1123.

A second clock signal (CL2) is input to a gate of the transistor 113. One of a source and a drain of the transistor 113 is electrically connected to the other of the source and the drain of the transistor 111. The other of the source and the drain of the transistor 113 is electrically connected to an output terminal of the inverter 1122.

The first clock signal and the second clock signal each have two states of a high state and a low state. A potential in a high state is a high potential, and a potential in a low state is a low potential.

Moreover, the first clock signal and the second clock signal have opposite phases. For example, in a predetermined period, the second clock signal is low when the first clock signal is high, whereas the second clock signal is high when the first clock signal is low.

Note that in this embodiment, the case is described in which the first clock signal is input to the gate of the transistor 111 and the second clock signal is input to the gate of the transistor 113; however, one embodiment of the invention is not limited thereto, and a structure can be employed in which the second clock signal is input to the gate of the transistor 111 and the first clock signal is input to the gate of the transistor 113.

Next, operation of the logic circuit illustrated in FIG. 3 will be described with reference to FIGS. 4A and 4B, FIGS. 5A and 5B, and FIG. 6. FIGS. 4A and 4B and FIGS. 5A and 5B illustrate the operation of the logic circuit in FIG. 3. FIG. 6 is a timing chart illustrating the operation of the logic circuit in FIG. 3.

The operation of the logic circuit illustrated in FIG. 3 is mainly classified into four periods. Each period will be described below.

Figure 4A:
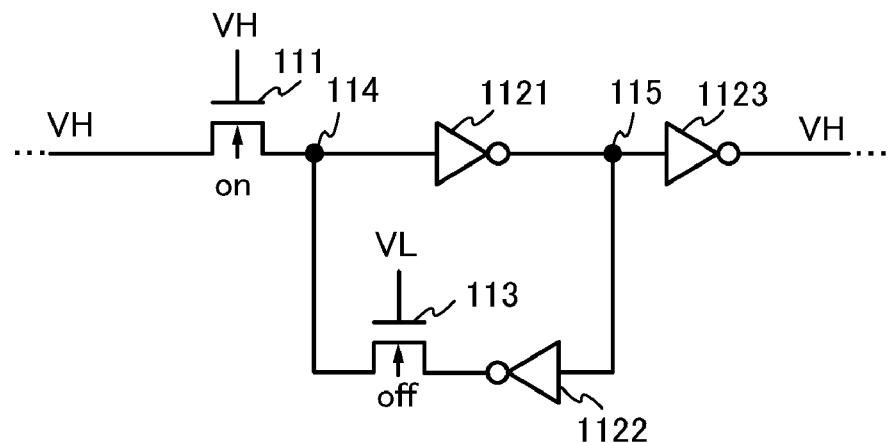
FIGS. 4A and 4B are circuit diagrams for illustrating operation of a logic circuit in Embodiment 1.

First, in a first period, as illustrated in FIG. 6, the first clock signal is high, that is, CL1 is VH and the second clock signal is low, that is, CL2 is VL. Accordingly, the transistor 111 is turned on and the transistor 113 is turned off as illustrated in FIG. 4A. Moreover, a potential (Vin) of the input signal is a high potential, that is, Vin is VH.

At this time, since the transistor 111 is on, a potential (V114) of a node 114 is VH. Since the potential of the node 114 is applied to the input terminal of the inverter 1121, a signal of VL is output from the inverter 1121, and a potential (V115) of a node 115 is VL. Further, since the potential of the node 115 is applied to the input terminal of the inverter 1122, a signal of VH is output from the inverter 1122. However, the potential of the output signal from the inverter 1122 is not applied to the node 114 because the transistor 113 is off. The potential of the node 115 is also applied to the input terminal of the inverter 1123, and therefore a signal of VH is output from the inverter 1123 as illustrated in FIG. 4A. The above is the operation in the first period.

Figure 4B:
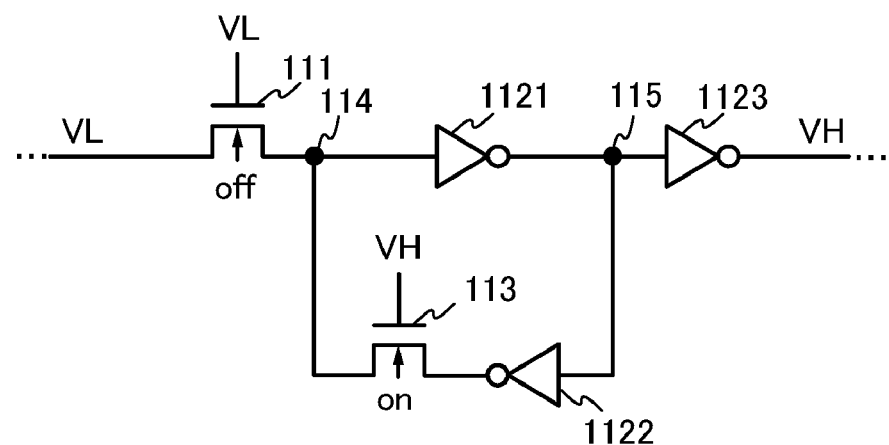

Next, in a second period, as illustrated in FIG. 6, CL1 is VL and CL2 is VH; accordingly, the transistor 111 is turned off and the transistor 113 is turned on as illustrated in FIG. 4B. Moreover, Vin is VL.

At this time, since the transistor 111 is off, V114 remains at VH even when Vin is VL. Since the potential of the node 114 is applied to the input terminal of the inverter 1121, a signal of VL is output from the inverter 1121, and V115 remains at VL. Further, the potential of the node 115 is applied to the input terminal of the inverter 1122, and a signal of VH is output from the inverter 1122. Moreover, since the transistor 113 is on, the potential of the signal from the inverter 1122 is applied to the node 114. The potential of the node 115 is also applied to the input terminal of the inverter 1123, and therefore a signal of VH is output from the inverter 1123 as illustrated in FIG. 4B. The above is the operation in the second period.

Figure 5A:
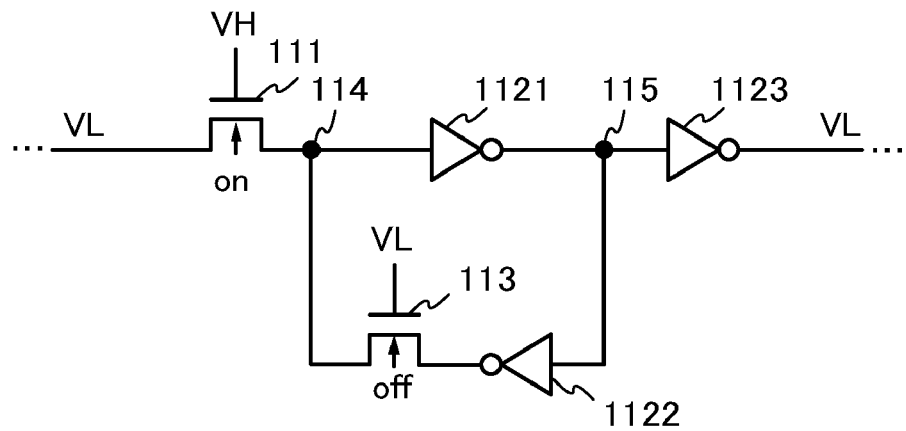
FIGS. 5A and 5B are circuit diagrams for illustrating operation of a logic circuit in Embodiment 1.

Next, in a third period, as illustrated in FIG. 6, CL1 is VH and CL2 is VL; accordingly, the transistor 111 is turned on and the transistor 113 is turned off as illustrated in FIG. 5A. Moreover, Vin remains at VL.

At this time, since the transistor 111 is on, V114 is VL. Since the potential of the node 114 is applied to the input terminal of the inverter 1121, a signal of VH is output from the inverter 1121, and V115 is VH. Further, since the potential of the node 115 is applied to the input terminal of the inverter 1122, a signal of VL is output from the inverter 1122. However, the potential of the output signal from the inverter 1122 is not applied to the node 114 because the transistor 113 is off. Moreover, the potential of the node 115 is also applied to the input terminal of the inverter 1123, and therefore a signal of VL is output from the inverter 1123 as illustrated in FIG. 5A. The above is the operation in the third period.

Figure 5B:
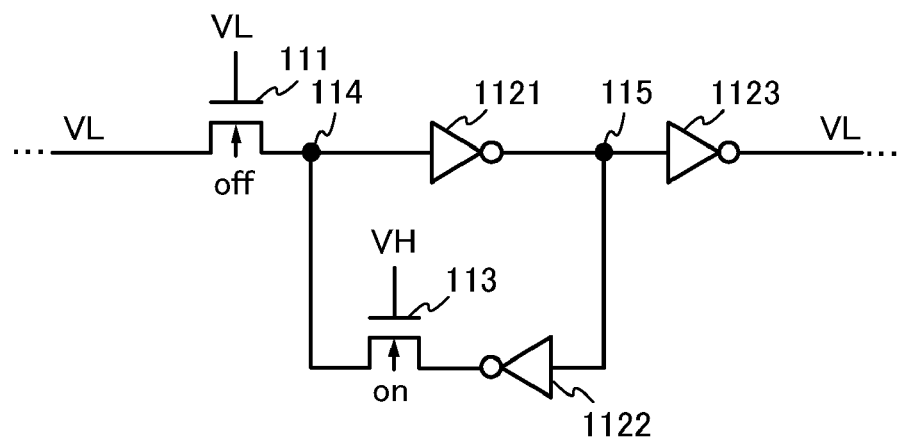

Next, in a fourth period, as illustrated in FIG. 6, CL1 is VL and CL2 is VH; accordingly, the transistor 111 is turned off and the transistor 113 is turned on as illustrated in FIG. 5B. Moreover, Vin remains at VL.

At this time, since the transistor 111 is off, V114 remains at VL. Since V114 is VL, a signal of VH is output from the inverter 1121, and V115 remains at VH. Further, since V115 is VH, a signal of VL is output from the inverter 1122, and since the transistor 113 is on, the potential of the signal from the inverter 1122 is applied to the node 114. Moreover, the potential of the node 115 is also applied to the input terminal of the inverter 1123, and therefore a signal of VL is output from the inverter 1123 as illustrated in FIG. 5B. The above is the operation in the fourth period.

Through the above operation, the logic circuit illustrated in FIG. 3 can generate an output signal based on a state of a signal input thereto.

Note that in the logic circuit illustrated in FIG. 3, a combinational logic circuit using a bootstrap method can also be applied to the inverter 1123. A logic circuit using a bootstrap method will be described with reference to FIG. 7. FIG. 7 is a circuit diagram illustrating a circuit configuration of a logic circuit using a bootstrap method in this embodiment.

The logic circuit illustrated in FIG. 7 includes a transistor 106, a capacitor 108, and a capacitor 109 in addition to the circuit configuration of the logic circuit illustrated in FIG. 1, and also includes a transistor 107 instead of the transistor 101. For the same portion of the logic circuit in FIG. 7 as that in the logic circuit in FIG. 1, the description of the logic circuit in FIG. 1 is employed as appropriate.

A gate and one of a source and a drain of the transistor 106 are electrically connected to the power supply line 103, and the high power supply potential is applied from the power supply line 103 to the gate and one of the source and the drain. The other of the source and the drain of the transistor 106 is electrically connected to a gate of the transistor 107.

One of a source and a drain of the transistor 107 is electrically connected to the power supply line 103, and the high power supply potential is applied to one of the source and the drain. The gate of the transistor 107 is electrically connected to the other of the source and the drain of the transistor 106.

The capacitor 108 has a first terminal and a second terminal. The first terminal is electrically connected to the other of the source and the drain of the transistor 106, and the second terminal is electrically connected to the other of the source and the drain of the transistor 107.

The capacitor 109 has a first terminal and a second terminal. The first terminal is electrically connected to the other of the source and the drain of the transistor 107. The second terminal is electrically connected to the power supply line 104, and the low power supply potential is applied to the second terminal.

Next, operation of the logic circuit illustrated in FIG. 7 will be described.

In the logic circuit in FIG. 7, as in the logic circuit in FIG. 1, the first signal is input to the gate of the transistor 102, and a potential of a node 125 between the transistors 107 and 102 is output as the second signal.

Figure 8A:
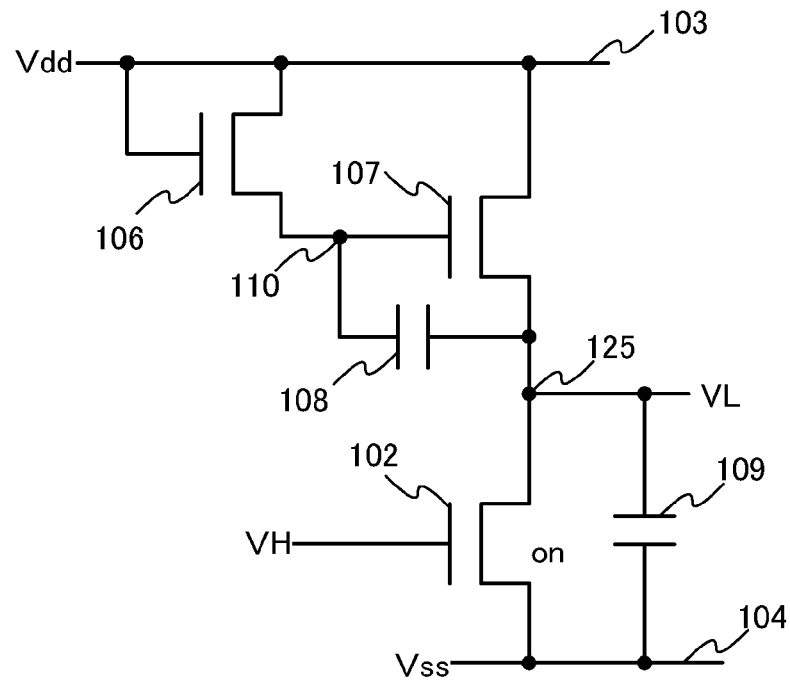
FIGS. 8A and 8B are diagrams for illustrating operation of a logic circuit in Embodiment 1.
Figure 8B:
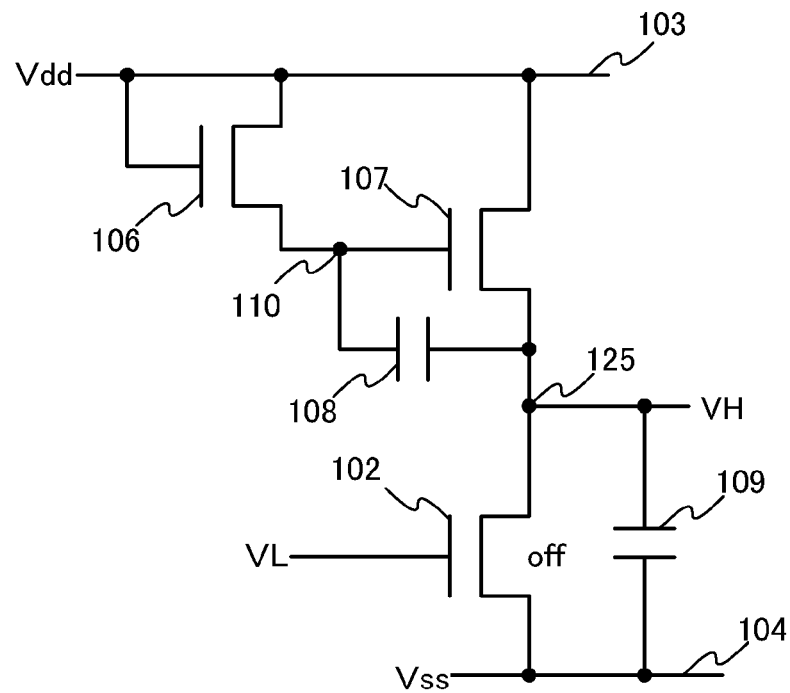

The operation of the logic circuit illustrated in FIG. 7 can be classified into two categories depending on whether the potential of the first signal is low or high. Both cases will be described with reference to FIGS. 8A and 8B. FIGS. 8A and 8B illustrate operation of the logic circuit in this embodiment. Note that in this embodiment, the case where data is 0 in a low state and data is 1 in a high state is described as an example; however, one embodiment of the invention is not limited thereto, and data can be 1 in a low state and can be 0 in a high state.

FIG. 8A illustrates the operation in the case where V1=VH. As illustrated in FIG. 8A, in the case where V1=VH, the transistor 102 is turned on. When the transistor 102 is on, the resistance of the transistor 102 is lower than the resistance (R107) of the transistor 107 (i.e., R102<R107), and a potential (V125) of the node 125 is VL; thus, V2 is VL. Further, the transistor 106 is turned off at the time when a potential of a node 110 between the other of the source and the drain of the transistor 106 and the gate of the transistor 107 becomes a value obtained by subtracting the threshold voltage (Vth106) of the transistor 106 from the high power supply potential, that is, (Vdd−Vth106), and the node 110 enters into a floating state.

FIG. 8B illustrates the operation in the case where V1=VL. As illustrated in FIG. 8B, in the case where V1=VL, the transistor 102 is turned off. When the transistor 102 is off, R102 is higher than R107, and the potential of the node 125 is increased and the potential of the node 110 is also increased by capacitive coupling with the capacitor 108. Thus, it follows that V2=V125=VH. At this time, the value of VH is larger than VH which is the potential of the second signal in the logic circuit illustrated in FIG. 1, and expressed as VH=Vdd. The above is the operation of the logic circuit illustrated in FIG. 7.

As described above, by using the logic circuit in FIG. 7 as the inverter 1123, the potential of the second signal can be amplified.

Figure 9A:
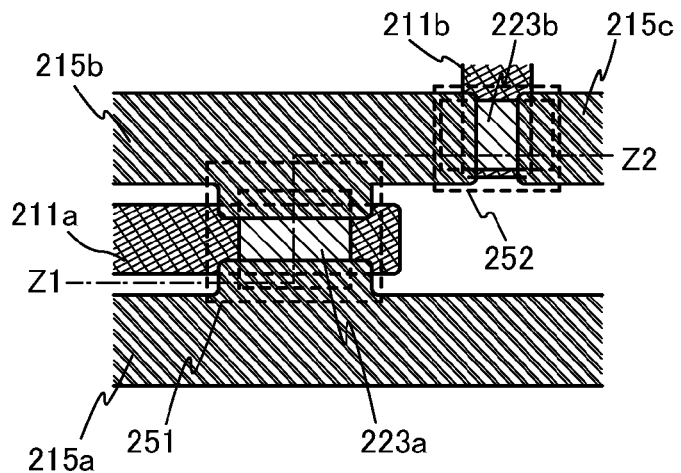
FIGS. 9A to 9C each illustrate a structure of a logic circuit in Embodiment 1.
Figure 9B:
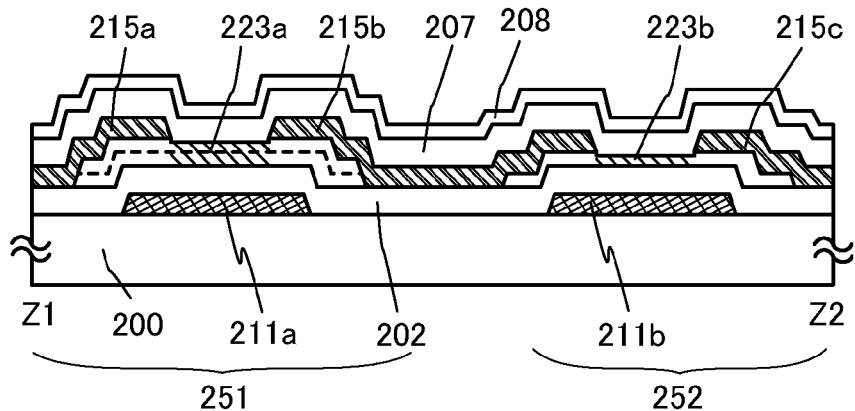
Figure 9C:
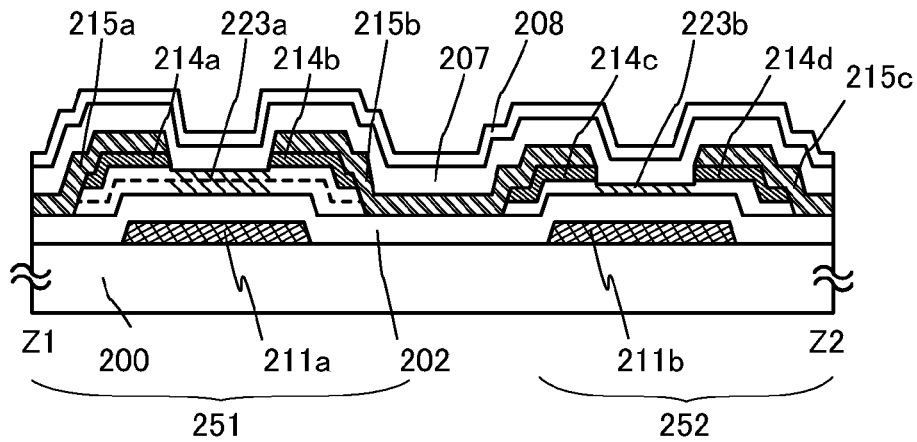

Next, a structure of the logic circuit in FIG. 1 will be described with reference to FIGS. 9A to 9C. FIGS. 9A to 9C each illustrate a structure of the logic circuit in FIG. 1. FIG. 9A is a top view. Each of FIGS. 9B and 9C is a cross-sectional view of the logic circuit along Z1-Z2 in FIG. 9A.

As illustrated in FIGS. 9A and 9B, the logic circuit in this embodiment includes a transistor 251 and a transistor 252. Specifically, the logic circuit includes a substrate 200, gate electrodes 211a and 211b over the substrate, a gate insulating layer 202 over the gate electrodes 211a and 211b, an oxide semiconductor layer 223a over the gate insulating layer 202 over the gate electrode 211a, an oxide semiconductor layer 223b over the gate insulating layer 202 over the gate electrode 211b, an oxide insulating film 207, and a protective insulating layer 208.

The transistor 251 corresponds to the transistor 101 in FIG. 1. The gate electrode 211a is provided over the substrate 200. The gate insulating layer 202 is provided over the gate electrode 211a. The oxide semiconductor layer 223a is provided over the gate insulating layer 202. A pair of electrodes, electrodes 215a and 215b, is provided in contact with the oxide semiconductor layer 223a. The oxide insulating film 207 is provided over the oxide semiconductor layer 223a.

The transistor 252 corresponds to the transistor 102 in FIG. 1. The gate electrode 211b is provided over the substrate 200. The gate insulating layer 202 is provided over the gate electrode 211b. The oxide semiconductor layer 223b is provided over the gate insulating layer 202. A pair of electrodes, electrodes 215b and 215c, is provided in contact with the oxide semiconductor layer 223b. The oxide insulating film 207 is provided over the oxide semiconductor layer 223b.

Not only is dehydration or dehydrogenation performed on the oxide semiconductor layers 223a and 223b, but the oxide insulating film 207 is formed in contact with the oxide semiconductor layers 223a and 223b. A thin film transistor, in which an oxide semiconductor layer subjected to dehydration or dehydrogenation and then provided with the oxide insulating film 207 thereover is used for a channel formation region, tends to have little Vth shift caused by long-term use or high load and thus has high reliability. Note that the dehydration or dehydrogenation and the formation of the oxide insulating film will be described in detail in Embodiment 5. Furthermore, the thickness of the oxide semiconductor layer 223a of the transistor 251 is larger than the thickness of the oxide semiconductor layer 223b of the transistor 252.

The oxide semiconductor layer included in a channel formation region of the thin film transistor of one embodiment of the invention, which has been subjected to dehydration or dehydrogenation and then provided with an oxide insulating film in contact with each other, has a suppressed carrier concentration. As a result, a transistor using a thin oxide semiconductor layer in a channel formation region behaves as an enhancement transistor.

In addition, as the thickness of the oxide semiconductor layer increases, the absolute value of a negative bias for the gate electrode which is needed to fully deplete the oxide semiconductor layer increases. As a result, a transistor using a thick oxide semiconductor layer in a channel formation region behaves as a depletion transistor.

The logic circuit of one embodiment of the present invention illustrated in FIG. 9C has a structure different from that of the logic circuit illustrated in FIG. 9B. Specifically, oxide semiconductor layers 214a and 214b serving as a pair of buffer layers are provided over the oxide semiconductor layer 223a. The electrodes 215a and 215b are provided as a pair in contact with the oxide semiconductor layers 214a and 214b, respectively. In addition, oxide semiconductor layers 214c and 214d serving as a pair of buffer layers are provided over the oxide semiconductor layer 223b. The electrodes 215b and 215c are provided as a pair in contact with the oxide semiconductor layers 214c and 214d, respectively.

The oxide semiconductor layers 214a and 214b have a higher conductivity than the oxide semiconductor layer 223a, and the oxide semiconductor layers 214c and 214d have a higher conductivity than the oxide semiconductor layer 223b. In addition, the oxide semiconductor layers 214a, 214b, 214c, and 214d function as source regions and drain regions of the transistors 251 and 252. Conductive oxide films can be given as examples of an oxide semiconductor film which has high conductivity and which can be used for the oxide semiconductor layers 214a, 214b, 214c, and 214d.

For example, for the oxide semiconductor layers (214a, 214b, 214c, and 214d), a visible light transmitting conductive material, such as an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide, can be used. The thickness thereof is set as appropriate in the range of from 1 nm to 300 nm. When a sputtering method is employed, it is preferable that film formation be performed using a target containing $SiO_2$ of 2 wt % to 10 wt % such that $SiO_x$ (x>0) which inhibits crystallization be contained in the light transmitting conductive film in order to prevent crystallization at the time of heat treatment for dehydration or dehydrogenation in a later step.

In the case where an In—Ga—Zn—O-based non-single-crystal film is used for the oxide semiconductor layers, the oxide semiconductor layers (223a and 223b) serving as channel formation regions and the oxide semiconductor layers (214a, 214b, 214c, and 214d) serving as source regions and drain regions can be separately formed under different film formation conditions.

For example, in the case of film formation by a sputtering method, the oxide semiconductor layers 214a, 214b, 214c, and 214d serving as source regions and drain regions, which are formed using an oxide semiconductor film formed in an argon gas, have n-type conductivity and have an activation energy ($\Delta E$) of 0.01 eV to 0.1 eV.

Note that in this embodiment, the oxide semiconductor layers 214a, 214b, 214c, and 214d are In—Ga—Zn—O-based non-single-crystal films and include at least amorphous components. Moreover, the oxide semiconductor layers 214a, 214b, 214c, and 214d may include crystal grains (nanocrystals). The crystal grains (the nanocrystals) in the oxide semiconductor layers 214a, 214b, 214c, and 214d have a diameter of approximately 1 nm to 10 nm, typically approximately 2 nm to 4 nm.

As described above, the oxide semiconductor layers (214a, 214b) functioning as a source region and a drain region are provided between the oxide semiconductor layer 223a functioning as a channel formation region and the electrodes (215a, 215b) functioning as a source electrode and a drain electrode, and the oxide semiconductor layers (214c, 214d) functioning as a source region and a drain region are provided between the oxide semiconductor layer 223b functioning as a channel formation region and the electrodes (215b, 215c) functioning as a source electrode and a drain electrode. Accordingly, electrically satisfactory junctions can be obtained between the oxide semiconductor layers 223a and 223b functioning as channel formation regions and the electrodes functioning as source and drain electrodes, and the transistors 251 and 252 can operate stably. Moreover, favorable mobility can be maintained even at a high drain voltage.

Note that the oxide semiconductor layers 214a, 214b, 214c, and 214d do not necessarily need to be provided. As illustrated in FIG. 9B, a structure where the oxide semiconductor layers 214a, 214b, 214c, and 214d are not provided may be employed.

Figure 10A:
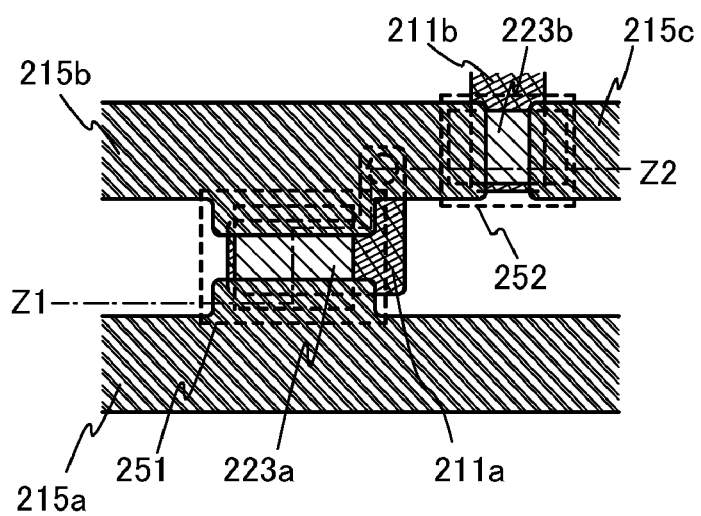
FIGS. 10A and 10B illustrate a structure of a logic circuit in Embodiment 1.
Figure 10B:
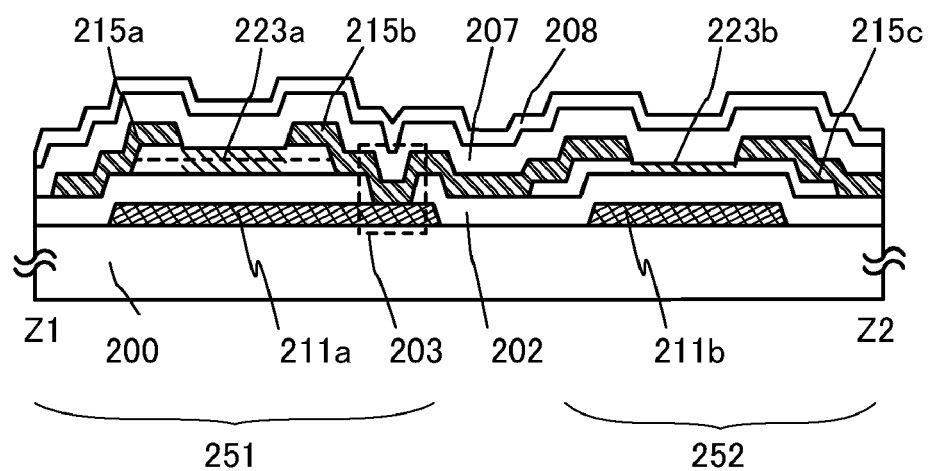

In addition, in the logic circuit in this embodiment, one of a source electrode and a drain electrode of one transistor may be in direct contact with a gate electrode of another transistor. The logic circuit with such a structure will be described with reference to FIGS. 10A and 10B. FIGS. 10A and 10B illustrate a structure of the logic circuit in this embodiment. FIG.

10A is a top view of the logic circuit. FIG. 10B is a cross-sectional view of the logic circuit along a section line Z1-Z2 in FIG. 10A. Note that for the same portion of the logic circuit illustrated in FIGS. 10A and 10B as that in the logic circuit in FIGS. 9A to 9C, the description of the logic circuit illustrated in FIGS. 9A to 9C is employed as appropriate.

Like the logic circuit in FIGS. 9A to 9C, the logic circuit in FIGS. 10A and 10B includes the transistors 251 and 252. Further, in the transistor 251 of the logic circuit in FIGS. 10A and 10B, the gate electrode 211a is in direct contact with the electrode 215b through a contact hole 203 provided in the gate insulating layer 202.

In the logic circuit using the transistor in which the gate electrode 211a and the electrode 215b are connected through the contact hole 203 provided in the gate insulating layer 202 as described above, satisfactory contact can be obtained, and contact resistance can be reduced. Accordingly, the number of openings can be reduced, which results in reducing the area occupied by the logic circuit.

As described above, a logic circuit can be provided using thin film transistors whose threshold voltages are made different by using oxide semiconductor layers with different thicknesses. In addition, by using the thin film transistors including an oxide semiconductor, the logic circuit can operate at high speed.

Note that this embodiment can be implemented in combination with any of other embodiments in this specification as appropriate.

Embodiment 2

In this embodiment, a shift register in an embodiment of the invention will be described. Note that a sequential logic circuit in which the sequential logic circuit in FIG. 3 in Embodiment 1 serves as a unit sequential logic circuit is described as an example.

Figure 11:
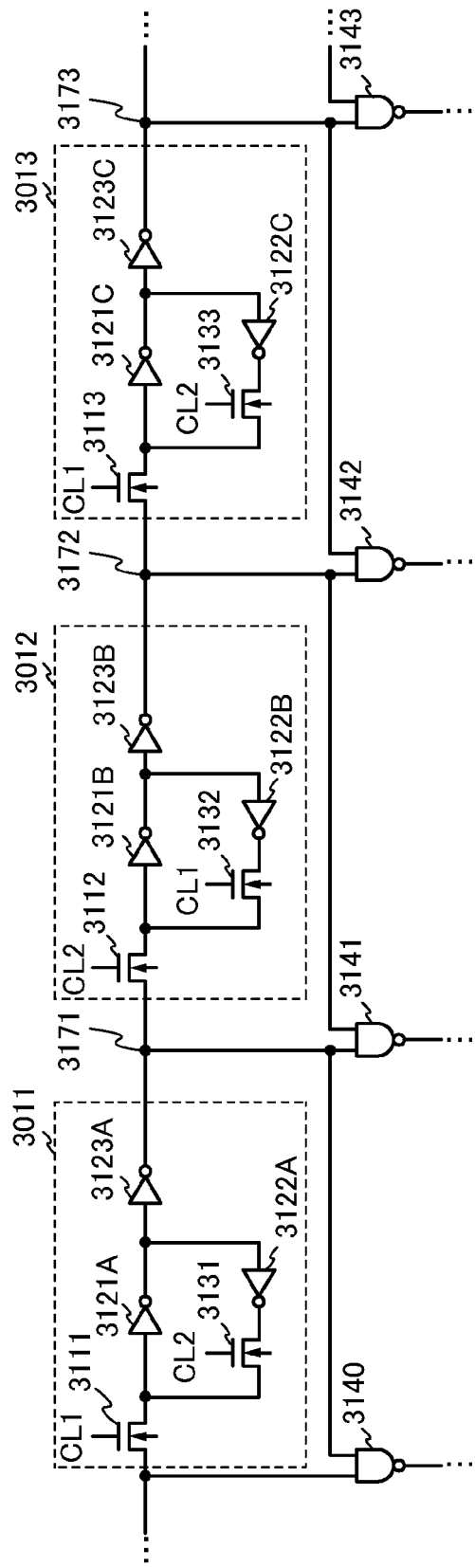
FIG. 11 is a circuit diagram illustrating a circuit configuration of a logic circuit in Embodiment 2.

The shift register in this embodiment includes a plurality of sequential logic circuits in FIG. 3 in Embodiment 1, which are electrically connected to each other in series. A specific structure will be described with reference to FIG. 11. FIG. 11 is a circuit diagram illustrating a configuration of the shift register in this embodiment.

The shift register illustrated in FIG. 11 includes a sequential logic circuit 3011, a sequential logic circuit 3012, a sequential logic circuit 3013, a NAND circuit 3140, a NAND circuit 3141, a NAND circuit 3142, and a NAND circuit 3143. Note that although FIG. 11 illustrates three (also referred to as three-stage) unit sequential logic circuits, one embodiment of the invention is not limited thereto and may include at least two-stage unit sequential logic circuits.

The sequential logic circuit 3011 includes a transistor 3111, an inverter 3121A, an inverter 3122A, an inverter 3123A, and a transistor 3131. The sequential logic circuit 3011 has the same configuration as the sequential logic circuit in FIG. 3. Specifically, the transistor 3111 corresponds to the transistor 111; the inverter 3121A, the inverter 1121; the inverter 3122A, the inverter 1122; the inverter 3123A, the inverter 1123; and the transistor 3131, the transistor 113. Therefore, the description of the sequential logic circuit in FIG. 3 is employed as appropriate for each element. Moreover, in the sequential logic circuit 3011, a first clock signal is input to a gate of the transistor 3111, and a second clock signal is input to a gate of the transistor 3131.

The sequential logic circuit 3012 includes a transistor 3112, an inverter 3121B, an inverter 3122B, an inverter 3123B, and a transistor 3132. The sequential logic circuit 3012 has the same configuration as the sequential logic circuit in FIG. 3. Specifically, the transistor 3112 corresponds to the transistor 111; the inverter 3121B, the inverter 1121; the inverter 3122B, the inverter 1122; the inverter 3123B, the inverter 1123; and the transistor 3132, the transistor 113. Therefore, the description of the sequential logic circuit in FIG. 3 is employed as appropriate for each element. Moreover, in the sequential logic circuit 3012, the second clock signal is input to a gate of the transistor 3112, and the first clock signal is input to a gate of the transistor 3132.

The sequential logic circuit 3013 includes a transistor 3113, an inverter 3121C, an inverter 3122C, an inverter 3123C, and a transistor 3133. The sequential logic circuit 3013 has the same configuration as the sequential logic circuit in FIG. 3. Specifically, the transistor 3113 corresponds to the transistor 111; the inverter 3121C, the inverter 1121; the inverter 3122C, the inverter 1122; the inverter 3123C, the inverter 1123; and the transistor 3133, the transistor 113. Therefore, the description of the sequential logic circuit in FIG. 3 is employed as appropriate for each element. Moreover, in the sequential logic circuit 3013, the first clock signal is input to a gate of the transistor 3113, and the second clock signal is input to a gate of the transistor 3133.

An output terminal of the inverter 3123A in the sequential logic circuit 3011 is electrically connected to one of a source and a drain of the transistor 3112 in the sequential logic circuit 3012. An output terminal of the inverter 3123B in the sequential logic circuit 3012 is electrically connected to one of a source and a drain of the transistor 3113 in the sequential logic circuit 3013.

Further, in the sequential logic circuit 3011, one of a source and a drain of the transistor 3111 is electrically connected to a first input terminal of the NAND circuit 3140, and the output terminal of the inverter 3123A is electrically connected to a second input terminal of the NAND circuit 3140 and to a first input terminal of the NAND circuit 3141. In the sequential logic circuit 3012, one of the source and the drain of the transistor 3112 is electrically connected to the second input terminal of the NAND circuit 3140 and to the first input terminal of the NAND circuit 3141, and the output terminal of the inverter 3123B is electrically connected to the second input terminal of the NAND circuit 3141 and to a first input terminal of the NAND circuit 3142. In the sequential logic circuit 3013, one of the source and the drain of the transistor 3113 is electrically connected to the second input terminal of the NAND circuit 3141 and to the first input terminal of the NAND circuit 3142, and an output terminal of the inverter 3123C is electrically connected to a second input terminal of the NAND circuit 3142 and to a first input terminal of the NAND circuit 3143.

Figure 12:
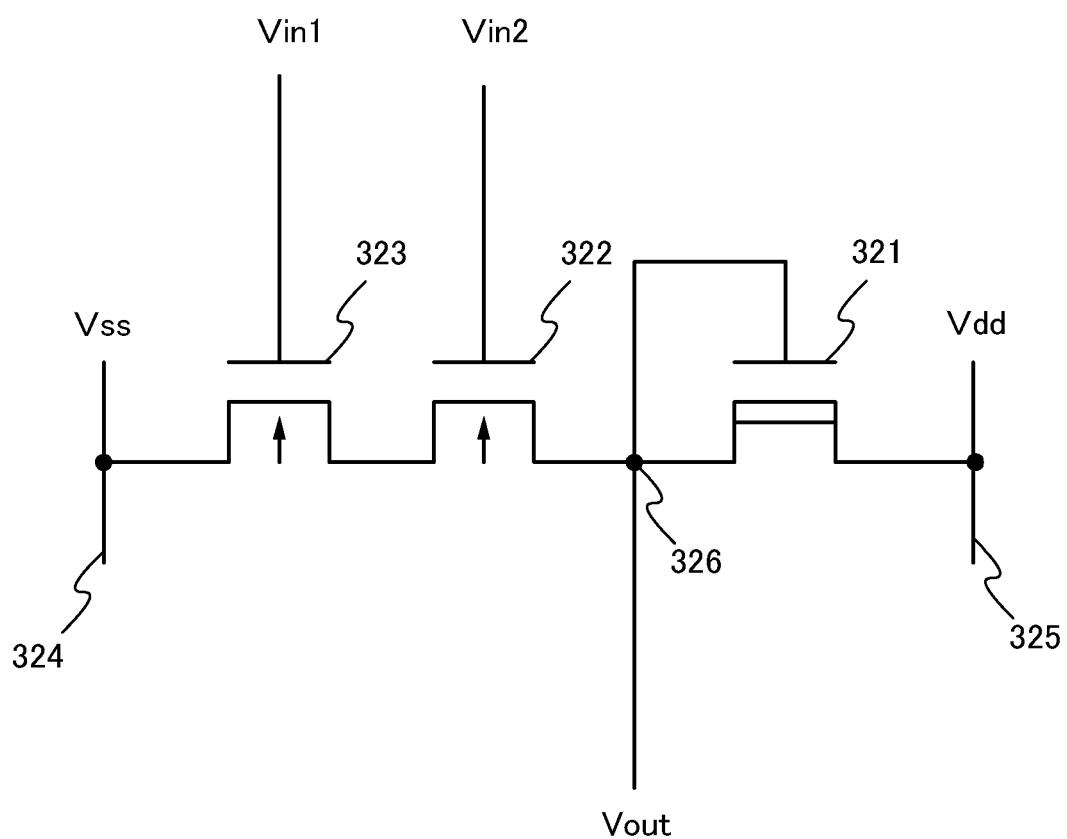
FIG. 12 is a circuit diagram illustrating a circuit configuration of a NAND circuit in Embodiment 2.

Each of the NAND circuits 3140 to 3143 can be formed using transistors having the same conductivity type as the transistors included in the sequential logic circuits 3011 to 3013. By using transistors of the same conductivity type, the NAND circuits 3140 to 3143 can be formed in the same process as the sequential logic circuits, and thus can be easily formed. A circuit configuration of a NAND circuit including transistors of the same conductivity type will be described with reference to FIG. 12. FIG. 12 is a circuit diagram illustrating a circuit configuration of a NAND circuit in this embodiment.

FIG. 12 illustrates an example of a configuration of a NAND circuit. The NAND circuit illustrated in FIG. 12 includes a transistor 321, a transistor 322, and a transistor 323.

The transistor 321 is a depletion transistor. One of a source and a drain of the transistor 321 is electrically connected to a power supply line 325 and supplied with a high power supply potential. A gate and the other of the source and the drain of the transistor 321 are electrically connected to each other.

The transistor 322 is an enhancement transistor. One of a source and a drain of the transistor 322 is electrically connected to the other of the source and the drain of the transistor 321.

The transistor 323 is an enhancement transistor. One of a source and a drain of the transistor 323 is electrically connected to the other of the source and the drain of the transistor 322. The other of the source and the drain of the transistor 323 is electrically connected to a power supply line 324 and supplied with a low power supply potential.

In the logic circuit in this embodiment, a first input signal is input to a gate of the transistor 323, a second input signal is input to a gate of the transistor 322, and a potential (V326) of a node 326 between the transistor 322 and the transistor 321 is output as an output signal.

Next, operation of the NAND circuit illustrated in FIG. 12 will be described.

Figure 13A:
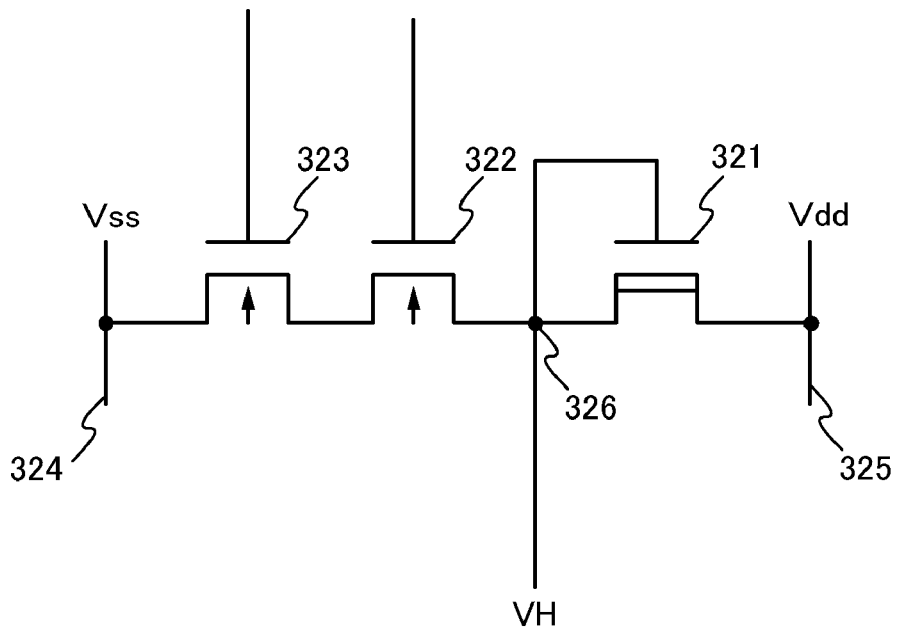
FIGS. 13A and 13B are circuit diagrams each illustrating operation of a NAND circuit in Embodiment 2.
Figure 13B:
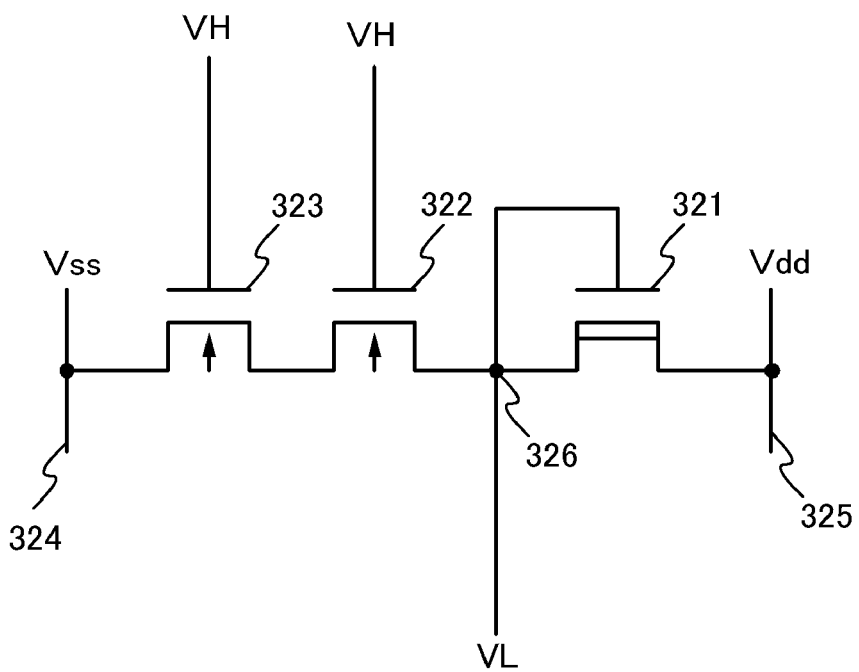

The operation of the NAND circuit in FIG. 12 can be classified into two categories depending on whether at least one of a potential (Vin1) of the first input signal and a potential (Vin2) of the second input signal is low or the potentials of the first and second input signals are high. Both cases will be described with reference to FIGS. 13A and 13B. FIGS. 13A and 13B illustrate operation of the logic circuit in this embodiment. Note that in this embodiment, the case where data is 0 in a low state and data is 1 in a high state is described as an example; however, one embodiment of the invention is not limited thereto, and data can be 1 in a low state and can be 0 in a high state.

FIG. 13A illustrates the operation in the case where Vin1=VH and Vin2=VL, the case where Vin1=VL and Vin2=VH, and the case where Vin1=VL and Vin2=VL. At this time, one or both of the transistors 322 and 323 is/are turned off, and the resistance (R322+R323) of the transistors 322 and 323 is higher than the resistance (R321) of the transistor 321, that is, (R322+R323)>R321; accordingly, V326 is VH, and a potential (Vout) of the output signal is VH.

FIG. 13B illustrates the operation in the case where Vin1=VH and Vin2=VH. At this time, the transistors 321 and 322 are turned on, and it follows that (R322+R323)<R321; accordingly, V326 is VL, and Vout is VL. The above is the operation of the NAND circuit illustrated in FIG. 12.

When the NAND circuit is formed using transistors of the same conductivity type as described above, it can be formed in the same process as another logic circuit. Moreover, one embodiment of the invention is not limited to the configuration in FIG. 12, and another circuit configuration can be employed if it has the same function as that in FIG. 12.

Figure 14:
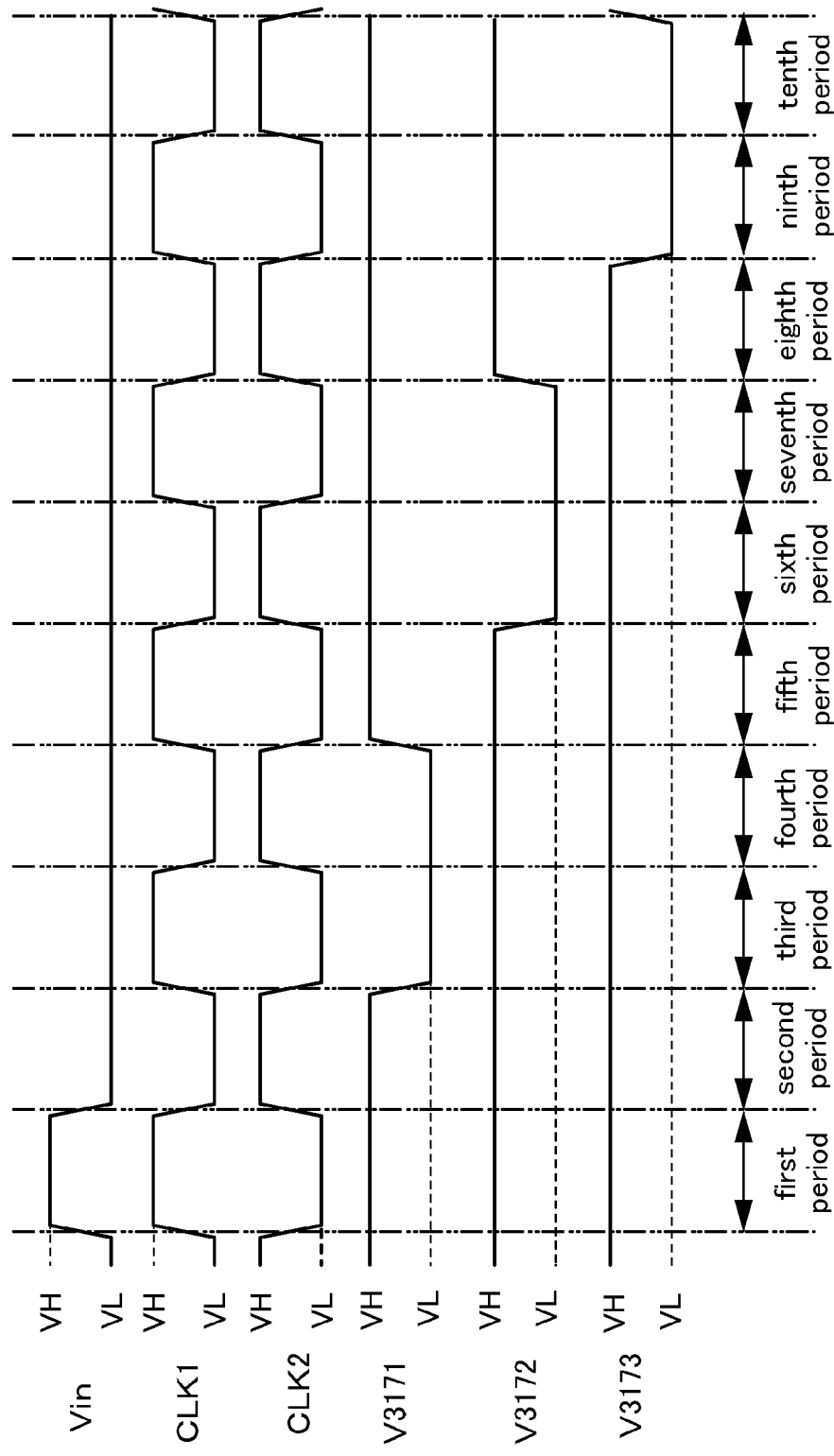
FIG. 14 is a timing chart illustrating operation of a logic circuit in Embodiment 2.

Next, operation of the shift register illustrated in FIG. 11 will be described with reference to FIG. 14. FIG. 14 is a timing chart illustrating the operation of the shift register in FIG. 11.

In the shift register in FIG. 11, the operations of the logic circuit, which are illustrated in FIGS. 4A and 4B, FIGS. 5A and 5B, and FIG. 6, are sequentially performed in each of the sequential logic circuits 3011 to 3013. For the operation of each logic circuit, the description of the operation of the logic circuit illustrated in FIGS. 4A and 4B, FIGS. 5A and 5B, and FIG. 6 is employed as appropriate.

The operation of the shift register in this embodiment is classified into ten periods as illustrated in FIG. 14. In a first period, a potential Vin of an input signal to the sequential logic circuit 3011 is VH. In a second period and a third period, a potential (V3171) of a node 3171 between the sequential logic circuit 3011 and the sequential logic circuit 3012 is changed from VH to VL. Further, in the third period and a fourth period, a potential of an output signal from the NAND circuit 3140 is VH.

In the fourth period and a fifth period, a potential of an input signal to the sequential logic circuit 3012 (an output signal from the sequential logic circuit 3011) is changed from VL to VH. In the fifth period and a sixth period, a potential (V3172) of a node 3172 between the sequential logic circuit 3012 and the sequential logic circuit 3013 is changed from VH to VL. In the sixth period and a seventh period, a potential of an output signal from the NAND circuit 3141 is VH.

In the seventh period and an eighth period, a potential of an input signal to the sequential logic circuit 3013 (an output signal from the sequential logic circuit 3012) is changed from VL to VH. In the eighth period and a ninth period, a potential (V3173) of a node 3173 between the sequential logic circuit 3013 and a next-stage logic circuit is changed from VH to VL. In the ninth period and a tenth period, a potential of an output signal from the NAND circuit 3142 is VH.

When another logic circuit is connected to an output terminal of the sequential logic circuit 3013, a potential of an input signal is changed from VL to VH in a given period and a potential of an output signal is changed to VH in another given period as described above. Moreover, in a period where a potential of the output signal from another logic circuit is VL, a potential of an output signal from the NAND circuit 3143 is VH.

As described above, a shift register can be configured using logic circuits including TFTs using an oxide semiconductor and having the same conductivity type. The TFT using the oxide semiconductor has a higher mobility than a conventional TFT using amorphous silicon; therefore, by applying the TFT using the oxide semiconductor to the shift register, the shift register can operate at high speed.

Note that this embodiment can be implemented in combination with any of other embodiments as appropriate.

Embodiment 3

In this embodiment, a circuit configuration of the combinational logic circuit of one embodiment of the invention described in Embodiment 1, to which a transistor whose threshold voltage can be controlled with a fourth terminal is applied, will be described with reference to FIGS. 16A and 16B and FIGS. 17A to 17D.

In a logic circuit illustrated in FIGS. 16A and 16B and FIGS. 17A to 17D, in addition to the circuit configuration of the logic circuit in FIG. 1, the transistor 101 or the transistor 102 has a fourth terminal. The description of the logic circuit in FIG. 1 is employed as appropriate for the same portion of the logic circuit in FIGS. 16A and 16B and FIGS. 17A to 17D as that in the logic circuit in FIG. 1.

The transistor 101 or the transistor 102 described in this embodiment as an example has a total of four terminals which are connected to a gate electrode, a source electrode, a drain electrode, and a back gate electrode. The back gate electrode is disposed to face the gate electrode with a semiconductor layer of the transistor interposed therebetween, and an insulating layer is formed between the back gate electrode and the semiconductor layer. The back gate electrode is an electrode for applying an electric field to the semiconductor layer through the insulating layer, like the gate electrode. A threshold voltage of the transistor changes depending on a potential of the back gate electrode.

Specifically, when a voltage is applied such that a potential of the back gate electrode becomes equal to or higher than a potential of the source electrode, the threshold voltage of the transistor is shifted to a lower side (in a negative direction), and when a negative bias is applied such that the potential of the back gate electrode becomes lower than the potential of the source electrode, the threshold voltage of the transistor is shifted to a higher side (in a positive direction). Note that in this specification, the potential of the back gate electrode with respect to the potential of the source electrode is referred to as Vbkg.

For example, in the case of a depletion transistor, the threshold voltage can be shifted to a higher side when the potential of the back gate electrode is set sufficiently lower than that of the source electrode (Vbkg<0). Accordingly, by using the back gate electrode, the characteristics of the transistor can be changed from a depletion type to an enhancement type.

In the case of an enhancement transistor, the threshold voltage can be shifted to a lower side when the potential of the back gate electrode is set sufficiently higher than that of the source electrode (Vbkg>0). Accordingly, by using the back gate electrode, the characteristics of the transistor can be changed from an enhancement type to a depletion type.

In addition, in the case of an enhancement transistor, the threshold voltage can be further shifted to a higher side when the potential of the back gate electrode is set sufficiently lower than that of the source electrode (Vbkg<0). Accordingly, characteristics of a transistor which turns on at Vbkg=0 in accordance with a high signal input to a gate electrode can be changed to characteristics with which the transistor remains off regardless of the high input signal, by applying a sufficiently low potential to the back gate electrode.

In the above manner, the threshold voltage of a transistor having a back gate electrode can be controlled by a voltage which is applied to the back gate electrode. Therefore, by forming a combinational logic circuit using the transistor 101 or the transistor 102 whose threshold voltage can be controlled by a voltage which is applied to the back gate electrode, a combinational logic circuit whose operation changes depending on a voltage applied to the back gate electrode can be provided.

The case where a depletion transistor 101 having a back gate electrode is applied to the combinational logic circuit is described. First, in the case where a voltage applied to the back gate electrode is equal to or higher than that applied to the source electrode, the transistor 101 behaves as a depletion transistor. Thus, the combinational logic circuit operates as an inverter in a manner similar to the operation described in Embodiment 1 with reference to FIGS. 2A and 2B.

Next, in the case where a voltage applied to the back gate electrode is sufficiently lower than that applied to the source electrode, the transistor 101 behaves as an enhancement transistor. As a result, the operation is partly different from the operation described in Embodiment 1 with reference to FIGS. 2A and 2B. The operation of the combinational logic circuit in the case where a voltage applied to the back gate electrode is sufficiently lower than that applied to the source electrode is described with reference to FIGS. 16A and 16B.

Figure 16A:
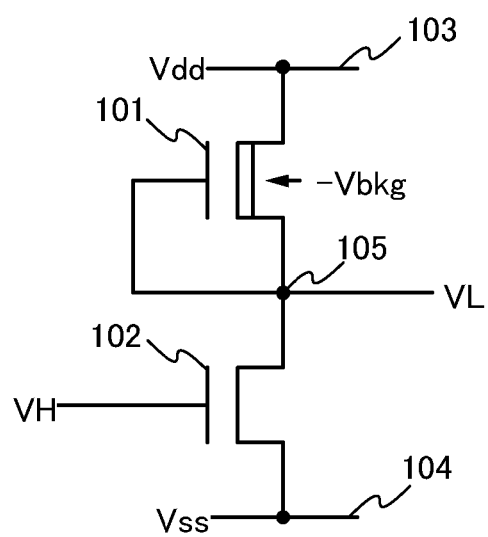
FIGS. 16A and 16B are circuit diagrams for illustrating operation of a logic circuit in Embodiment 3.

FIG. 16A illustrates the operation in the case where a potential (V1) of the first signal is high (i.e., V1=VH). As illustrated in FIG. 16A, in the case where V1=VH, the transistor 102 is turned on. On the other hand, because of the sufficiently low voltage applied to the back gate electrode, the transistor 101 behaves as an enhancement transistor. When the transistor 102 is on, the resistance (R102) of the transistor 102 is lower than the resistance (R101) of the transistor 101 (i.e., R102<R101); accordingly, a potential (V105) of the node 105 is VL and a potential (V2) of the second signal is VL.

Figure 16B:
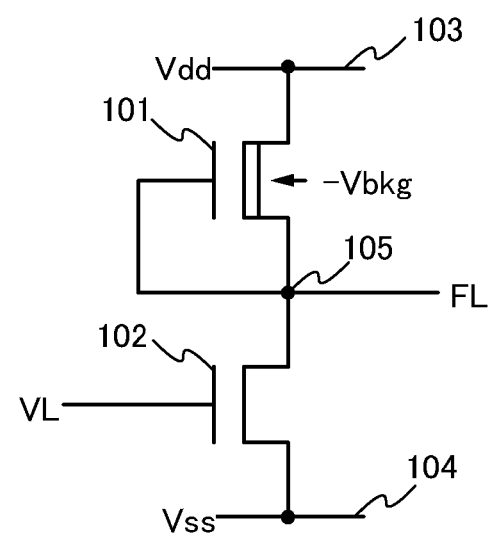

In addition, FIG. 16B illustrates the operation in the case where V1=VL. As illustrated in FIG. 16B, in the case where V1=VL, the transistor 102 is turned off. On the other hand, because of the sufficiently low voltage applied to the back gate electrode, the transistor 101 behaves as an enhancement transistor. Thus, the transistors 101 and 102 are both off and have high resistance, and the node 105 enters into a floating state (FL). The above is the operation of the logic circuit illustrated in FIGS. 16A and 16B.

Next, the case where an enhancement transistor 101 having a back gate electrode is applied to the combinational logic circuit is described. First, in the case where the back gate electrode is held at the same voltage as the source electrode, the transistor 101 behaves as an enhancement transistor. Thus, the combinational logic circuit operates as an inverter in a manner similar to the operation described in Embodiment 1 with reference to FIGS. 2A and 2B.

Figure 17A:
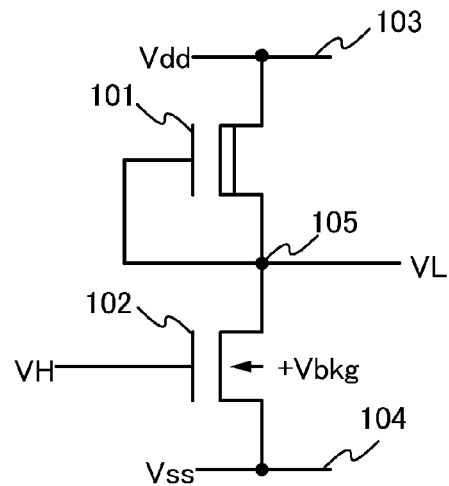
FIGS. 17A to 17D are circuit diagrams for illustrating operation of a logic circuit in Embodiment 3.
Figure 17B:
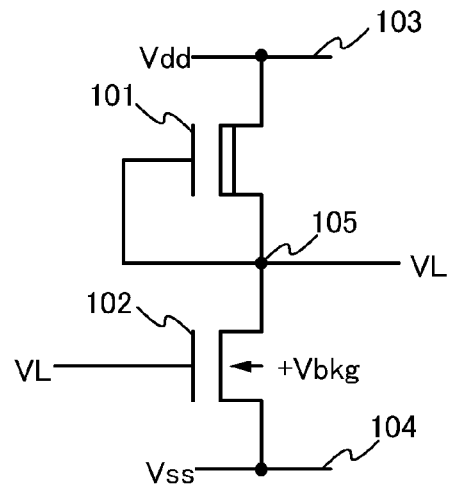

Next, in the case where a voltage applied to the back gate electrode is sufficiently higher than that applied to the source electrode, the transistor 101 behaves as a depletion transistor. As a result, the combinational logic circuit operates as illustrated in FIGS. 17A and 17B. Specifically, regardless of a potential (V1) of the first signal, the transistor 101 is constantly on, and a potential (V105) of the node 105 is VL and a potential (V2) of the second signal is VL.

Figure 17C:
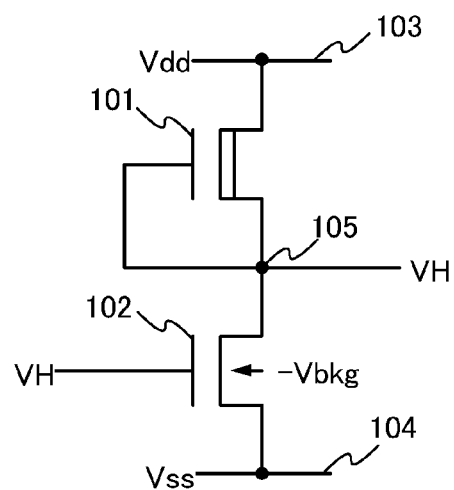
Figure 17D:
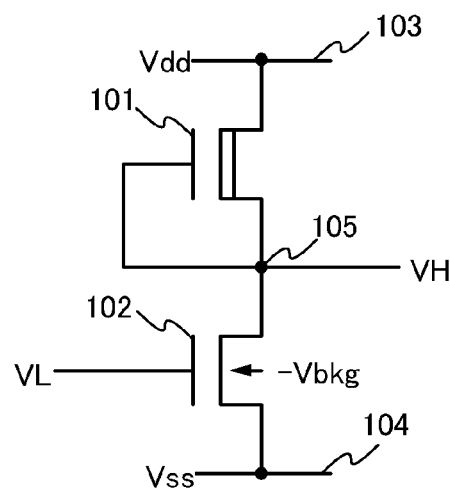

In addition, in the case where a voltage applied to the back gate electrode is sufficiently lower than that applied to the source electrode, the transistor 102 behaves as a depletion transistor, and has a further higher threshold voltage than in the case where the gate electrode is held at the same voltage as the source electrode. As a result, the combinational logic circuit operates as illustrated in FIGS. 17C and 17D. Specifically, regardless of a potential (V1) of the first signal, the transistor 102 is constantly off, and a potential (V) of the node 105 is VH and a potential (V2) of the second signal is VH. The above is the operation of the combinational logic circuit illustrated in FIGS. 17A to 17D.

By forming a shift register using the above-described combinational logic circuit whose operation changes depending on a voltage applied to the back gate electrode, the shift register can be configured to be partly or wholly selected and operated.

For example, the shift register illustrated in FIG. 11 in Embodiment 2 includes the sequential logic circuit 3011, the sequential logic circuit 3012, the sequential logic circuit 3013, the NAND circuit 3140, the NAND circuit 3141, the NAND circuit 3142, and the NAND circuit 3143. Note that although FIG. 11 illustrates three (also referred to as three-stage) unit sequential logic circuits, one embodiment of the invention is not limited thereto and may include at least two-stage unit sequential logic circuits.

For example, by applying the logic circuit described with reference to FIGS. 16A and 16B to the inverter 3123B of the sequential logic circuit 3012, a shift register can be configured to be partly or wholly selected and operated. In a state where a voltage applied to the back gate electrode of the depletion transistor included in the inverter 3123B is equal to or higher than that applied to the source electrode, the inverter 3123B operates as an inverter. However, in a state where a voltage applied to the back gate electrode of the depletion transistor is sufficiently lower than that applied to the source electrode, the inverter 3123B does not operate as an inverter, and a potential (V3172) of the node 3172 remains at VL or a previous potential. When the potential (V3172) of the node 3172 remains at VL, the sequential logic circuit 3013 whose input terminal is connected to the node 3172 does not operate and the shift register stops at the sequential logic circuit 3012.

In addition, when the logic circuit described with reference to FIGS. 17A and 17B is applied to the inverter 3123B of the sequential logic circuit 3012 and a voltage applied to the back gate electrode of the enhancement transistor is sufficiently higher than that applied to the source electrode, the sequential logic circuit 3013 does not operate and the shift register can be stopped at the sequential logic circuit 3012.

In addition, by applying the logic circuit described with reference to FIGS. 17C and 17D to the inverter 3121B of the sequential logic circuit 3012, a shift register can be configured to be partly or wholly selected and operated. In a state where a voltage applied to the back gate electrode of the enhancement transistor included in the inverter 3121B is equal to that applied to the source electrode, the inverter 3121B operates as an inverter. However, in a state where a voltage applied to the back gate electrode of the enhancement transistor is sufficiently lower than that applied to the source electrode, the inverter 3121B does not operate as an inverter and continues to output VH to the input terminal of the inverter 3123B connected thereto. As a result, the inverter 3123B holds a potential (V3172) of the node 3172 at VL, the sequential logic circuit 3013 whose input terminal is connected to the node 3172 does not operate, and the shift register stops at the sequential logic circuit 3012.

The shift register which can be partly or wholly selected and operated as described above can be used for partial driving of a driver circuit. Specifically, the shift register can be used in a display device for partial display. By performing partial display, power consumption can be reduced.

Embodiment 4

In this embodiment, a logic circuit including a transistor having a structure different from that in the above embodiment will be described.

Figure 15A:
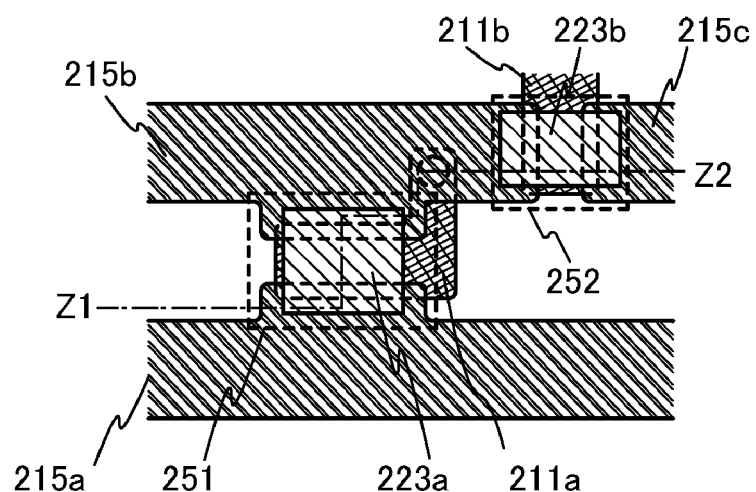
FIGS. 15A and 15B illustrate a structure of a logic circuit in Embodiment 4.
Figure 15B:
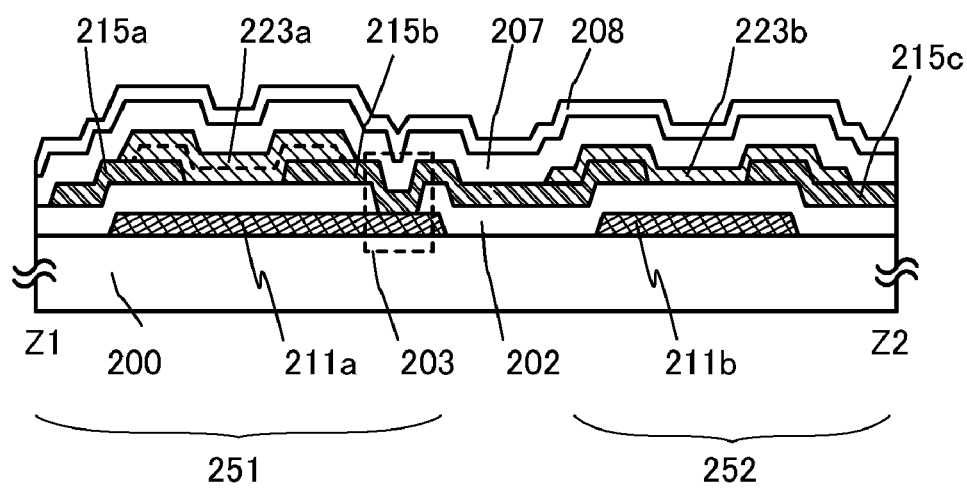

A logic circuit which is one embodiment of the invention disclosed in this specification can be formed using not only transistors with the structures illustrated in FIGS. 9A to 9C and FIGS. 10A and 10B but also transistors with another structure. A logic circuit to which a transistor with another structure is applied will be described with reference to FIGS. 15A and 15B. FIGS. 15A and 15B illustrate a structure of the logic circuit in this embodiment. FIG. 15A is a top view, and FIG. 15B is a cross-sectional view of the logic circuit along a section line Z1-Z2 in FIG. 15A. Note that for the same portion of the logic circuit illustrated in FIGS. 15A and 15B as that of the logic circuit in FIGS. 9A to 9C and FIGS. 10A and 10B, the description of the logic circuit illustrated in FIGS. 9A to 9C and FIGS. 10A and 10B is employed as appropriate.

Like the logic circuit in FIGS. 10A and 10B, the logic circuit in FIGS. 15A and 15B includes the transistor 251 and the transistor 252.

Moreover, in the transistor 251 of the logic circuit in FIGS. 15A and 15B, the gate electrode 211a is provided over the substrate 200. The gate insulating layer 202 is provided over the gate electrode 211a. The electrodes 215a and 215b, which are a pair of electrodes, are provided over the gate insulating layer 202. The oxide semiconductor layer 223a is provided over the gate insulating layer 202 and the electrodes 215a and 215b. In addition, the oxide insulating film 207 is formed to cover the oxide semiconductor layer 223a provided between the electrodes 215a and 215b, and the protective insulating layer 208 is provided over the oxide insulating film.

In the transistor 252, the gate electrode 211b is provided over the substrate 200. The gate insulating layer 202 is provided over the gate electrode 211b. The electrodes 215b and 215c, which are a pair of electrodes, are provided over the gate insulating layer 202. The oxide semiconductor layer 223b is provided over the gate insulating layer 202 and the electrodes 215b and 215c. In addition, the oxide insulating film 207 is formed to cover the oxide semiconductor layer 223b provided between the electrodes 215b and 215c, and the protective insulating layer 208 is provided over the oxide insulating film.

The logic circuit illustrated in FIGS. 15A and 15B includes the transistors in which the oxide semiconductor layer 223a is provided over the electrodes 215a and 215b and the oxide semiconductor layer 223b is provided over the electrodes 215b and 215c (such a transistor is also referred to as a bottom-contact transistor). Note that the oxide semiconductor layer 223a is thicker than the oxide semiconductor layer 223b. In the logic circuit of this embodiment to which the bottom-contact transistors are applied, the area where the oxide semiconductor layers and the electrodes are in contact with each other can be increased, so that peeling or the like can be prevented.

Further, in the logic circuit in FIGS. 15A and 15B, the gate electrode 211a and the electrode 215b of the transistor 252 are in contact with each other through the contact hole 203 provided in the gate insulating layer 202, as in the logic circuit illustrated in FIGS. 10A and 10B.

Note that this embodiment can be implemented in combination with any of other embodiments in this specification as appropriate.

Embodiment 5

In this embodiment, a method for manufacturing a logic circuit will be described. Note that in this embodiment, a method for manufacturing the logic circuit illustrated in FIGS. 10A and 10B is described as an example.

The method for manufacturing the logic circuit in this embodiment will be described with reference to FIGS. 18A to 18E. FIGS. 18A to 18E are cross-sectional views illustrating the method for manufacturing the logic circuit in this embodiment.

First, after a conductive film is formed over the substrate 200 having an insulating surface, first wiring layers including the gate electrodes 211a and 211b are formed by a first photolithography step. Note that the edge portions of the gate electrodes formed are preferably tapered.

Note that a resist mask may be formed by an inkjet method. A photomask is not used when the resist mask is formed by an inkjet method, which results in reducing manufacturing cost.

As a material of the conductive film used for forming the gate electrodes 211a and 211b, an element selected from Al, Cr, Ta, Ti, Mo, and W, an alloy including the above element, an alloy including any of these elements in combination, or the like can be used. The gate electrodes can also be formed using a single-layer conductive film containing a metal material such as copper, neodymium, or scandium as well as the aforementioned metal or an alloy material including the element as a main component, or a stacked layer thereof. Note that the gate electrodes can also be formed using a light transmitting conductive film. As an example of a material of the light transmitting conductive film, a transparent conductive oxide or the like can be given.

As a glass substrate used as the substrate, if the temperature of the heat treatment to be performed later is high, a glass substrate having a strain point of 730° C. or higher is preferably used. In addition, for example, a glass material such as aluminosilicate glass, aluminoborosilicate glass, or barium borosilicate glass is used for a glass substrate. By containing a larger amount of barium oxide (BaO) than boric oxide, a more practical heat-resistant glass substrate is obtained. Therefore, a glass substrate containing a larger amount of BaO than $B_2O_3$ is preferably used.

Note that a substrate formed from an insulator such as a ceramic substrate, a quartz substrate, or a sapphire substrate may be used instead of the glass substrate. Alternatively, crystallized glass or the like can be used.

An insulating film serving as a base film may be provided between the substrate 200 and the gate electrodes 211a and 211b. The base film functions to prevent diffusion of an impurity element from the substrate 200 and can be formed using one film or stacked films selected from a silicon nitride film, a silicon oxide film, a silicon nitride oxide film, and a silicon oxynitride film.

Next, an insulating film serving as the gate insulating layer 202 is formed over the gate electrodes 211a and 211b.

The gate insulating layer 202 can be formed using a single layer or a stacked layer of a silicon oxide layer, a silicon nitride layer, a silicon oxynitride layer, and/or a silicon nitride oxide layer. Note that the layer may be doped with phosphorus (P) or boron (B).

A silicon oxide layer, a silicon nitride layer, a silicon oxynitride layer, or a silicon nitride oxide layer can be formed using a plasma CVD method, a sputtering method, or the like. For example, a silicon oxynitride layer may be formed by a plasma CVD method using $SiH_4$, oxygen, and nitrogen as deposition gases. The gate insulating layer 202 has a thickness of 100 nm to 500 nm. In the case of a stacked-layer structure, a first gate insulating layer having a thickness of 50 nm to 200 nm and a second gate insulating layer having a thickness of 5 nm to 300 nm are stacked in this order.

In this embodiment, the gate insulating layer 202 is a silicon oxynitride (SiON (composition ratio: N<O)) layer having a thickness of 100 nm which is formed by a plasma CVD method.

Next, the contact hole 203 is formed in the gate insulating layer 202 by a second photolithography step.

Note that after the contact hole reaching the gate electrode 211a is formed by selectively etching the gate insulating layer by the second photolithography step, it is preferable that the gate insulating layer be subjected to heat treatment (at 400° C. or higher and lower than a strain point of the substrate) in an inert gas atmosphere (nitrogen, helium, neon, argon, or the like). By this heat treatment, impurities such as hydrogen and water contained in the gate insulating layer 202 can be eliminated before an oxide semiconductor film is formed.

Then, oxide semiconductor films having different thicknesses are formed over the gate insulating layer 202. In this embodiment, a thick oxide semiconductor film is formed over the gate electrode 211a and a thin oxide semiconductor film is formed over the gate electrode 211b with the gate insulating layer 202 interposed therebetween. Note that in this embodiment, a film formation method in which an oxide semiconductor film is stacked over an island-shaped oxide semiconductor layer is described as an example of a method for forming a thick oxide semiconductor layer over the gate electrode 211a.

First, a first oxide semiconductor layer is formed. As an oxide semiconductor film, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film can be used. The oxide semiconductor film can be formed by a sputtering method in a noble gas (typically, argon) atmosphere, an oxygen atmosphere, or a noble gas (typically, argon) and oxygen atmosphere. In the case of using a sputtering method, it is preferable to form the oxide semiconductor film using a target including $SiO_2$ at 2 wt % to 10 wt % such that $SiO_x$ (x>0) which inhibits crystallization is contained in the oxide semiconductor film in order to prevent the oxide semiconductor film from being crystallized in heat treatment performed later for dehydration or dehydrogenation.

In this embodiment, the oxide semiconductor film is formed using an oxide semiconductor target including In, Ga, and Zn (at a composition ratio of $In_2O_3:Ga_2O_3:ZnO=1:1:1$ [mol %], In:Ga:Zn=1:1:0.5 [at. %]) under the conditions where the distance between the substrate and the target is 100 mm, the pressure is 0.6 Pa, the direct-current (DC) power is 0.5 kW, and the atmosphere is oxygen (the proportion of the oxygen flow is 100%). Note that a pulsed direct-current (DC) power source is preferable because dust can be reduced and the film thickness can be uniform. In this embodiment, as the oxide semiconductor film, an In—Ga—Zn—O-based non-single-crystal film is formed by a sputtering method using an In—Ga—Zn—O-based oxide semiconductor target.

In this embodiment, the oxide semiconductor film is formed such that the total thickness of the first oxide semiconductor film and the second oxide semiconductor film stacked thereover is in the range of 50 nm to 100 nm Note that an appropriate thickness differs depending on an oxide semiconductor material, and the thickness may be set as appropriate depending on the material.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition of a thin compound film thereof, and a bias sputtering method in which a voltage is also applied to a substrate during deposition.

Note that before the oxide semiconductor film is formed by a sputtering method, reverse sputtering in which an argon gas is introduced and plasma is generated is preferably performed to remove dust from a surface of the gate insulating layer 202. The reverse sputtering refers to a method in which an RF power source is used for voltage application to a substrate in an argon atmosphere and plasma is generated in the vicinity of the substrate to modify the surface. Note that instead of an argon atmosphere, nitrogen, helium, oxygen, or the like may be used.

Figure 18A:
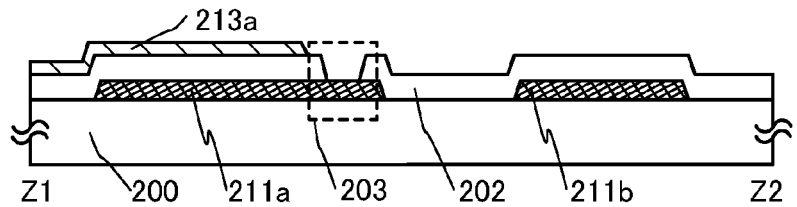
FIGS. 18A to 18E are cross-sectional views illustrating a method for manufacturing a logic circuit in Embodiment 5.
Figure 18B:
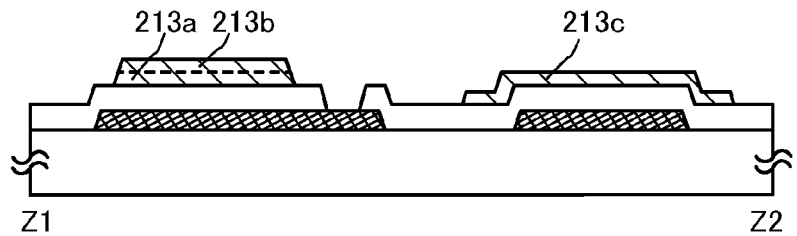

Next, a first oxide semiconductor layer 213a is formed by processing the first oxide semiconductor film into an island shape by a third photolithography step (see FIG. 18A). Note that after the third photolithography step, it is preferable that the first oxide semiconductor layer 213a be subjected to heat treatment (at 400° C. or higher and lower than 750° C.) in an inert gas atmosphere (such as nitrogen, helium, neon, or argon) to remove impurities such as hydrogen and water from the layer, and then the second oxide semiconductor film be formed.

Then, the second oxide semiconductor film is formed. In this embodiment, an In—Ga—Zn—O-based non-single-crystal film is formed. The second oxide semiconductor film preferably has a thickness of 5 nm to 30 nm Note that an appropriate thickness differs depending on an oxide semiconductor material, and the thickness may be set as appropriate depending on the material.

Over the gate electrode 211a, the second oxide semiconductor film is stacked over the first oxide semiconductor layer 213a, and thus a thick oxide semiconductor layer is formed. On the other hand, over the gate electrode 211b, the second oxide semiconductor film is formed in contact with the gate insulating layer 202, and thus a thin oxide semiconductor layer is formed.

Next, the first oxide semiconductor layer and the second oxide semiconductor film are processed into an island shape by a fourth photolithography step. A thick, island-shaped oxide semiconductor layer in which the first oxide semiconductor layer 213a and a second oxide semiconductor layer 213b are stacked is formed over the gate electrode 211a. In addition, a first oxide semiconductor layer 213c is formed over the gate electrode 211b (see FIG. 18B).

Note that a resist mask for forming an island-shaped oxide semiconductor layer may be formed by an inkjet method. A photomask is not used when the resist mask is formed by an inkjet method, which results in reducing manufacturing cost.

In this embodiment, the contact hole 203 reaching the gate electrode 211a is formed by selectively etching the gate insulating layer by the second photolithography step. Note that one embodiment of the invention is not limited to this method. For example, after the second oxide semiconductor film is etched, a resist mask may be formed over the second oxide semiconductor layer, and a contact hole reaching the gate electrode 211a may be formed. Note that in that case, reverse sputtering is preferably performed to remove a resist residue or the like from a surface of the oxide semiconductor layer and the gate insulating layer 202.

Alternatively, after the second oxide semiconductor film is formed, a resist mask may be formed over the second oxide semiconductor film, and a contact hole reaching the gate electrode 211a may be formed. After the contact hole is formed, the process may proceed as follows: removing the resist mask, forming a resist mask over the oxide semiconductor film using another photomask, and processing the second oxide semiconductor film into an island-shaped oxide semiconductor layer by selective etching.

Next, the oxide semiconductor layers are subjected to dehydration or dehydrogenation. First heat treatment for dehydration or dehydrogenation is performed at a temperature equal to or higher than 400° C. and lower than 750° C., preferably, 425° C. or higher. Note that at 425° C. or higher, the heat treatment time may be one hour or shorter, whereas at a temperature lower than 425° C., the heat treatment time is longer than one hour. Here, the substrate is introduced into an electric furnace which is one of heat treatment apparatuses, and the heat treatment of the oxide semiconductor layers is performed in a nitrogen atmosphere. After that, the oxide semiconductor layers are prevented from being exposed to air, which prevents water or hydrogen from re-entering the oxide semiconductor layers; thus, the oxide semiconductor layers are obtained. In this embodiment, one furnace is continuously used during the heat treatment up to the time when the temperature is lowered from the heating temperature T for dehydration or dehydrogenation of the oxide semiconductor layers to a temperature at which water does not re-enter. Specifically, slow cooling is performed in a nitrogen atmosphere up to the time when the temperature becomes lower than the heating temperature T by 100° C. or more. Without limitation to a nitrogen atmosphere, dehydration or dehydrogenation is performed in helium, neon, argon, or the like.

Note that the heat treatment apparatus is not limited to the electric furnace and may be, for example, a rapid thermal annealing (RTA) apparatus such as a gas rapid thermal annealing (GRTA) apparatus or a lamp rapid thermal annealing (LRTA) apparatus. An LRTA apparatus is an apparatus for heating an object to be treated by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be treated by heat conduction from a heated high temperature gas. As the high temperature gas, an inert gas which does not react with an object to be treated by heat treatment, such as nitrogen or a noble gas like argon, is used. An LRTA apparatus or a GRTA apparatus may include not only a lamp but also a device for heating an object to be treated by heat conduction or heat radiation from a heater such as a resistance heater.

In addition, in the first heat treatment, it is preferable that nitrogen or a noble gas such as helium, neon, or argon do not include water, hydrogen, or the like. Alternatively, it is preferable that nitrogen or a noble gas such as helium, neon, or argon introduced into the heat treatment apparatus have a purity of 6N (99.9999%) or more, preferably, 7N (99.99999%) or more (in other words, the impurity concentration be set to 1 ppm or lower, preferably, 0.1 ppm or lower).

Note that the oxide semiconductor layers are crystallized and changed into microcrystalline films or polycrystalline films in some cases depending on the conditions of the first heat treatment or the material of the oxide semiconductor layers. For example, the oxide semiconductor layers may be crystallized into microcrystalline oxide semiconductor films having a degree of crystallization of 90% or more, or 80% or more. Further, depending on the conditions of the first heat treatment or the material of the oxide semiconductor layers, the oxide semiconductor layers may be amorphous oxide semiconductor films containing no crystalline component.

The oxide semiconductor layers are changed to oxygen-deficient and low-resistance oxide semiconductor layers after the first heat treatment. An oxide semiconductor film after the first heat treatment is performed has a higher carrier concentration than the oxide semiconductor film shortly after the formation and preferably has a carrier concentration of $1 \times 10^{18}/cm^3$ or more.

Note that the gate electrodes 211a and 211b may be crystallized into microcrystalline films or polycrystalline films depending on the conditions of the first heat treatment or the material of the gate electrodes. For example, in the case where films of an alloy of indium oxide and tin oxide are used as the gate electrodes 211a and 211b, the gate electrodes 211a and 211b are crystallized by the first heat treatment at 450° C. for one hour, but in the case where films of an alloy of indium oxide and tin oxide containing silicon oxide are used, the gate electrodes 211a and 211b are not crystallized.

The first heat treatment of the oxide semiconductor layers may be performed on the oxide semiconductor film before it is processed into the island-shaped oxide semiconductor layers. In that case, after the first heat treatment, the substrate is taken out of the heating apparatus and subjected to the fourth photolithography step to form the island-shaped oxide semiconductor layers.

Next, a conductive film used for forming source electrodes and drain electrodes of thin film transistors is formed over the gate electrodes 211a and 211b with the gate insulating layer 202, the oxide semiconductor layer 213b, the oxide semiconductor layer 213c, and the contact hole 203 interposed therebetween.

As a material of the conductive film, an element selected from Ti, Mo, W, Al, Cr, Cu, and Ta, an alloy containing any of these elements as a component, an alloy containing any of these elements in combination, or the like is used. The conductive film is not limited to a single layer containing the above-described element and may be a stacked layer of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

Note that in the case of performing heat treatment at 200° C. to 600° C., the conductive film preferably has heat resistance so as to be able to withstand this heat treatment. For example, it is preferable to use an aluminum alloy to which a hillock preventing element is added, or a conductive film stacked with a heat-resistance conductive film. Note that as a method for forming the conductive film, a sputtering method, a vacuum evaporation method (an electron beam evaporation method or the like), an arc discharge ion plating method, or a spray method is used. Alternatively, the conductive film may be formed by selectively applying a conductive nanopaste of silver, gold, copper, or the like by a screen printing method, an inkjet method, or the like and then baking the paste.

Figure 18C:
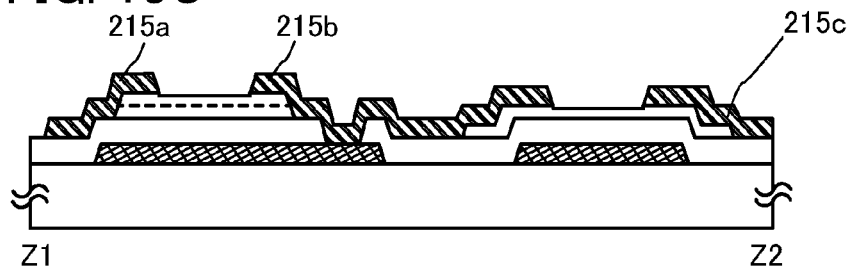

Next, by a fifth photolithography step, a resist mask is formed and the conductive film is selectively removed by etching to form second wiring layers including the electrodes (215a, 215b, and 215c) serving as source electrodes and drain electrodes (see FIG. 18C). Note that the electrode 215b is directly connected to the gate electrode 211a through the contact hole 203 as illustrated in FIG. 18C.

In the fifth photolithography step, there are portions where the oxide semiconductor layers are left remaining and only portions of the conductive film which are on and in contact with the oxide semiconductor layers are selectively removed. When an ammonia peroxide mixture (at a composition weight ratio of hydrogen peroxide:ammonia:water=5:2:2) or the like is used as an alkaline etchant in order to selectively remove only portions of the conductive film which are on and in contact with the oxide semiconductor layers, the conductive film can be selectively removed and the oxide semiconductor layers containing an In—Ga—Zn—O-based oxide semiconductor can be left remaining.

Although it depends on the etching conditions, exposed regions of the oxide semiconductor layers may be etched in the fifth photolithography step. In that case, the oxide semiconductor layer is thinner in a region sandwiched between the source electrode and the drain electrode (a region sandwiched between the electrodes 215a and 215b) than in a region covered with the source electrode layer or the drain electrode layer over the gate electrode 211a. In addition, the oxide semiconductor layer is thinner in a region sandwiched between the source electrode and the drain electrode (a region sandwiched between the electrodes 215b and 215c) than in a region covered with the source electrode or the drain electrode over the gate electrode 211b (see FIG. 18C).

Note that a resist mask for forming the second wiring layers including the electrodes (215a, 215b, and 215c) serving as source electrodes and drain electrodes may be formed by an inkjet method. A photomask is not used when the resist mask is formed by an inkjet method, which results in reducing manufacturing cost.

Next, the oxide insulating film 207 is formed over the gate insulating layer 202, the oxide semiconductor layer 213b, and the oxide semiconductor layer 213c. In this stage, regions where the oxide insulating film 207 is in contact with the oxide semiconductor layers are formed. Note that channels are formed in regions of the oxide semiconductor layers which overlap the gate electrodes and are in contact with and sandwiched between the oxide insulating film 207 and the gate insulating layer 202.

The oxide insulating film 207 has a thickness of at least 1 nm and can be formed as appropriate by a method, such as a sputtering method, which can prevent impurities such water and hydrogen from entering the oxide insulating film. In this embodiment, a silicon oxide film is formed as the oxide insulating film by a sputtering method. The substrate temperature in film formation may be in the range from room temperature to 300° C., and is 100° C. in this embodiment. The silicon oxide film can be formed by a sputtering method in a noble gas (typically, argon) atmosphere, an oxygen atmosphere, or a noble gas (typically, argon) and oxygen atmosphere. Moreover, a silicon oxide target or a silicon target can be used as a target. For example, with the use of a silicon target, a silicon oxide film can be formed by a sputtering method in an oxygen and noble gas atmosphere. As the oxide insulating film which is formed in contact with the oxide semiconductor layer whose resistance has been lowered, an inorganic insulating film in which impurities such as moisture, hydrogen ions, and OH⁻ have been reduced and which blocks the entry of these impurities from the outside is preferable. Typically, a silicon oxide film, a silicon nitride oxide film, an aluminum oxide film, or an aluminum oxynitride film is preferable. Note that an oxide insulating film formed by a sputtering method is particularly dense and even a single layer thereof can be used as a protective film for suppressing diffusion of impurities into a layer in contact with the oxide insulating film. In addition, phosphorus (P) or boron (B) can be added to the oxide insulating film by using a target doped with phosphorus (P) or boron (B).

In this embodiment, the oxide insulating film 207 is formed by a pulsed DC sputtering method using a columnar, boron-doped polycrystalline silicon target which has a purity of 6N (the resistivity is 0.01 Ωcm), in which the distance between the substrate and the target (T-S distance) is 89 mm, the pressure is 0.4 Pa, the direct-current (DC) power is 6 kW, and the atmosphere is oxygen (the proportion of the oxygen flow is 100%). The thickness thereof is 300 nm.

Note that the oxide insulating film 207 is provided on and in contact with the channel formation regions of the oxide semiconductor layers, and functions as a channel protective layer.

Figure 18D:
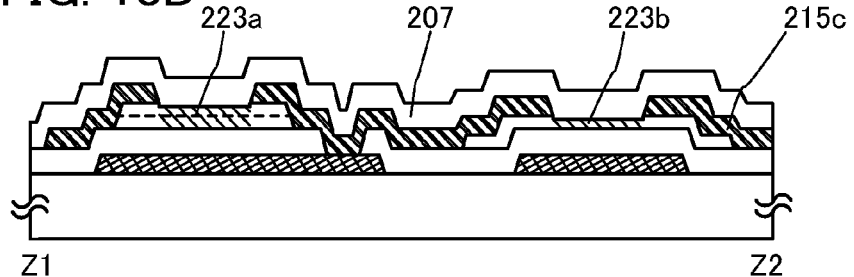

Next, second heat treatment (preferably, at 200° C. to 400° C., for example, at 250° C. to 350° C.) is performed in an inert gas atmosphere or in a nitrogen gas atmosphere (see FIG. 18D). For example, the second heat treatment is performed at 250° C. for one hour in a nitrogen atmosphere. By the second heat treatment, portions of the oxide semiconductor layers 213b and 213c are heated while being in contact with the oxide insulating film 207, and other portions of the oxide semiconductor layers 213b and 213c are heated while being in contact with the second wiring layers (215a, 215b, and 215c).

When the oxide semiconductor layers (213b and 213c) whose resistance has been lowered by the first heat treatment are subjected to the second heat treatment while being in contact with the oxide insulating film 207, regions thereof in contact with the oxide insulating film 207 are put in an oxygen-excess state. As a result, the oxide semiconductor layers (213b and 213c) are changed into high resistance (i-type) oxide semiconductor layers in the depth direction from the regions in contact with the oxide insulating film 207.

Specifically, in the oxide semiconductor layer 213c having a small thickness, the oxide semiconductor layer 223b including a high resistance (i-type) region is formed from the interface in contact with the oxide insulating film 207 to the gate insulating layer 202.

On the other hand, in the oxide semiconductor layer having a large thickness in which the first oxide semiconductor layer 213a and the second oxide semiconductor layer 213b are stacked, a high resistance (i-type) region is formed from the interface in contact with the oxide insulating film 207 toward the gate insulating layer 202. However, since this oxide semiconductor layer has a large thickness, an increase in resistance (a change into i-type conductivity) does not proceed to the vicinity of the interface in contact with the gate insulating layer 202, and the oxide semiconductor layer 223a including a region whose resistance has been lowered and remains low in a channel formation region is obtained.

In this manner, the transistors included in the logic circuit described in this embodiment as an example include oxide semiconductor layers, which include high resistance (i-type) regions in different portions, in channel formation regions thereof. As a result, the transistors have different operating characteristics.

The transistor 251 has a thick oxide semiconductor layer and includes an oxide semiconductor layer whose resistance has been lowered and remains low in a portion of the channel formation region. Thus, the transistor 251 has a negative threshold voltage and behaves as a depletion transistor. The transistor 252 has a thin oxide semiconductor layer and includes a high resistance (i-type) oxide semiconductor layer in the channel formation region. Thus, the transistor 252 has a positive threshold voltage and behaves as an enhancement transistor.

Note that when a region where the electrodes (215a, 215b, and 215c) serving as source electrodes and drain electrodes and formed using a metal conductive film are in contact with the oxide semiconductor layer 213b or the oxide semiconductor layer 213c is subjected to the second heat treatment, oxygen in the oxide semiconductor layer easily moves to the metal conductive film side and the oxide semiconductor layer becomes n-type. In the case where the oxide semiconductor layer has a thickness of 30 nm or more, the vicinity of the interface with the metal conductive film becomes n-type, whereas the underlying portion is i-type or becomes n$^-$-type.

The timing of the second heat treatment is not limited to the timing shortly after the fifth photolithography step as long as it is after the fifth photolithography step.

Figure 18E:
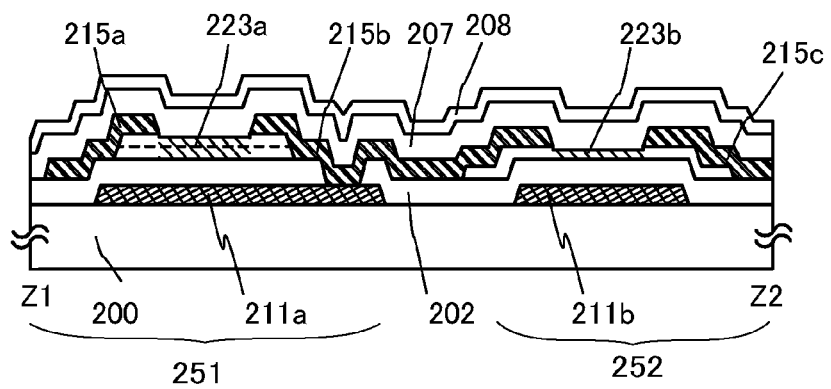

Next, the protective insulating layer 208 is formed over the oxide insulating film 207 (see FIG. 18E). As the protective insulating layer 208, a silicon nitride film, a silicon nitride oxide film, an aluminum nitride film, or the like is used. In this embodiment, a silicon nitride film is formed as the protective insulating layer 208 by an RF sputtering method.

Through the above process, the transistor 251 and the transistor 252, which are two kinds of thin film transistors whose channel formation regions have different thicknesses, can be manufactured over the same substrate.

Note that as the method for forming oxide semiconductor layers having different thicknesses, various methods other than the above-mentioned method can be given.

Specifically, a thick oxide semiconductor film is formed over the gate insulating layer 202, and a resist mask is formed to cover a region of the oxide semiconductor film over the gate electrode 211a but not a region thereof over the gate electrode 211b. Then, an exposed portion of the oxide semiconductor film is thinned by careful etching in a photolithography step. Accordingly, a thick oxide semiconductor film can be formed over the gate electrode 211a, and a thin oxide semiconductor film can be formed over the gate electrode 211b.

In the above method, a resist mask formed using a multi-tone mask can also be used. A multi-tone mask can achieve three levels of light exposure to obtain an exposed portion, a half-exposed portion, and an unexposed portion; one-time exposure and development process enables a resist mask with regions of plural thicknesses (typically, two kinds of thicknesses) to be formed. Thus, the use of a multi-tone mask allows the number of photomasks to be reduced. Typical examples of multi-tone masks include a gray-tone mask and a half-tone mask.

A gray-tone mask includes a light-transmitting substrate and a light-blocking portion and a diffraction grating which are provided over the light-transmitting substrate. The light transmittance of the light-blocking portion is 0%. On the other hand, the diffraction grating has a light-transmitting portion in a slit form, a dot form, a mesh form, or the like with intervals which are less than or equal to the resolution limit of light used for the light exposure; thus, light transmittance can be controlled. Note that the diffraction grating can be either in a regular slit form, a regular dot form, or a regular mesh form, or in an irregular slit form, an irregular dot form, or an irregular mesh form.

As the light-transmitting substrate, a light-transmitting substrate such as a quartz substrate can be used. The light-blocking portion and the diffraction grating can be formed using a light-blocking material which absorbs light, such as chromium or chromium oxide.

When the gray-tone mask is irradiated with light for exposure, the light transmittance of the light-blocking portion is 0% and that of a region where neither the light-blocking portion nor the diffraction grating is provided is 100%. The light transmittance of the diffraction grating can be controlled in the range of from 10% to 70%. The light transmittance of the diffraction grating can be controlled by controlling the interval and pitch of the slits, dots, or mesh of the diffraction grating.

A half-tone mask includes a light-transmitting substrate and a semi-light-transmitting portion and a light-blocking portion which are provided over the light-transmitting substrate. The semi-light-transmitting portion can be formed using MoSiN, MoSi, MoSiO, MoSiON, CrSi, or the like. The light-blocking portion can be formed using a light-blocking material which absorbs light, such as chromium or chromium oxide.

When the half-tone mask is irradiated with light for exposure, the light transmittance of the light-blocking portion is 0% and the light transmittance of a region where neither the light-blocking portion nor the semi-light-transmitting portion is provided is 100%. The light transmittance of the semi-light-transmitting portion can be controlled in the range of from 10% to 70%. The light transmittance of the semi-lighttransmitting portion can be controlled with the material of the semi-light-transmitting portion.

After light exposure with the use of the multi-tone mask, a resist mask having regions with different thicknesses can be formed.

Specifically, the oxide semiconductor film over the gate electrode 211a is covered with a thick island-shaped resist mask, and the oxide semiconductor film over the gate electrode 211b is covered with a thin island-shaped resist mask. Next, an exposed portion of the oxide semiconductor film is etched by a photolithography step to form an island-shaped oxide semiconductor layer. Furthermore, the thin island-shaped resist mask over the gate electrode 211b is removed by $O_2$ ashing or the like, and then, an exposed portion of the oxide semiconductor film over the gate electrode 211b is thinned by careful etching.

Note that when the logic circuit described in this embodiment is formed, another circuit can also be formed over the same substrate. For example, a thin film transistor for driving a display element can be formed in a display portion of a display device.

By the method described in this embodiment as an example, a depletion and an enhancement thin film transistors can be formed over the same substrate. In addition, a logic circuit including a depletion and an enhancement thin film transistors formed over the same substrate can be provided.

The thin film transistors included in the logic circuit described in this embodiment as an example, in which an oxide semiconductor layer having high field effect mobility is applied to the channel formation regions, have excellent electrical characteristics. In addition, the thin film transistors, for which the oxide semiconductor layers having been subjected to dehydration or dehydrogenation are used, have little variation in threshold voltage and have high reliability. The logic circuit of one embodiment of the invention including thin film transistors having such characteristics has high reliability as well as being capable of operating at high speed.

In addition, in the configuration in this embodiment, the electrode 215b and the gate electrode 211a are directly connected to each other through the contact hole 203 formed in the gate insulating layer 202. Only one contact hole is needed to connect the electrode 215b and the gate electrode 211a, which leads to a reduction in electric resistance due to the connection. In addition, the area occupied by the connection portion in a circuit is smaller, which is an advantage in reducing the size of the logic circuit.

Note that this embodiment can be implemented in combination with any of other embodiments in this specification as appropriate.

Embodiment 6

In this embodiment, a display device will be described as an example of a device to which the logic circuit shown in the above embodiments can be applied.

Figure 19:
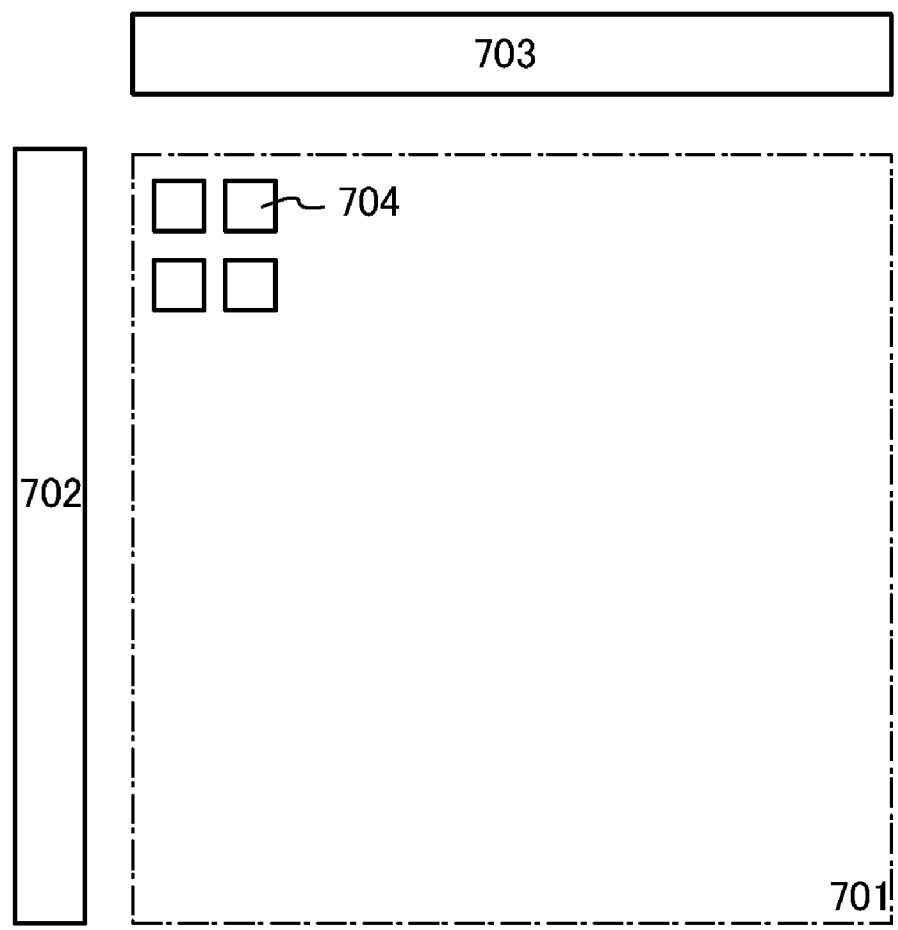
FIG. 19 is a block diagram illustrating a structure of a display device in Embodiment 6.

The logic circuits shown in the above embodiments can be applied to a variety of display devices such as a liquid crystal display device and an electroluminescent display device. A structure of a display device in this embodiment will be described with reference to FIG. 19. FIG. 19 is a block diagram illustrating a structure of the display device in this embodiment.

As illustrated in FIG. 19, the display device in this embodiment includes a pixel portion 701, a scan line driver circuit 702, and a signal line driver circuit 703.

The pixel portion 701 includes a plurality of pixels 704 and has a dot matrix structure. Specifically, the plurality of pixels 704 are arranged in the row and column directions. Each pixel 704 is electrically connected to the scan line driver circuit 702 through a scan line and electrically connected to the signal line driver circuit 703 through a signal line. Note that in FIG. 19, the scan line and the signal line are not illustrated for simplification.

The scan line driver circuit 702 is a circuit for selecting the pixel 704 to which a data signal is input, and outputs a selection signal to the pixel 704 through the scan line.

The signal line driver circuit 703 is a circuit for outputting data written to the pixel 704 as a signal, and outputs pixel data as a signal through the signal line to the pixel 704 selected by the scan line driver circuit 702.

The pixel 704 includes at least a display element and a switching element. A liquid crystal element or a light-emitting element such as an EL element can be applied to the display element, for example. A transistor can be applied to the switching element, for example.

Figure 20A:
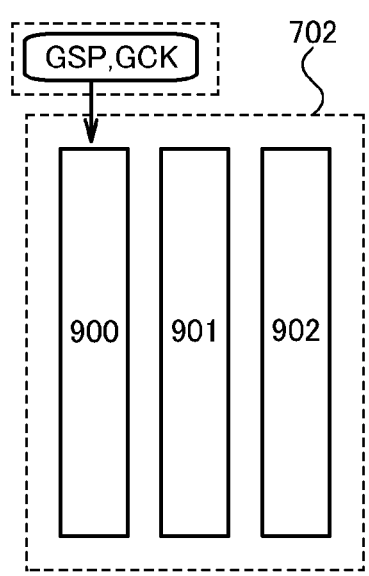
FIGS. 20A and 20B are block diagrams each illustrating a structure of a driver circuit in a display device shown in Embodiment 6.
Figure 20B:
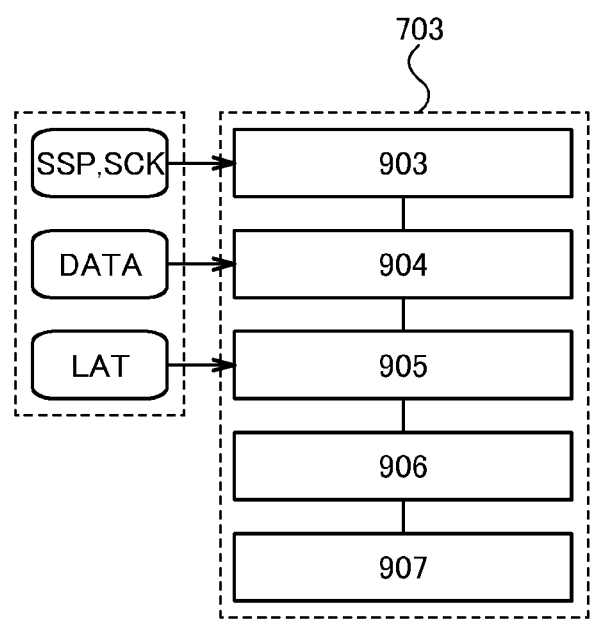

Next, an example of structures of the scan line driver circuit 702 and the signal line driver circuit 703 will be described with reference to FIGS. 20A and 20B. FIGS. 20A and 20B are block diagrams each illustrating a structure of the driver circuit. FIG. 20A is a block diagram illustrating a structure of the scan line driver circuit. FIG. 20B is a block diagram illustrating a structure of the signal line driver circuit.

As illustrated in FIG. 20A, the scan line driver circuit 702 includes a shift register 900, a level shifter 901, and a buffer 902.

Signals such as a gate start pulse (GSP) and a gate clock signal (GCK) are input to the shift register 900, and selection signals are sequentially output from sequential logic circuits. Moreover, the shift register shown in Embodiment 2 can be applied to the shift register 900.

Further, as illustrated in FIG. 20B, the signal line driver circuit 703 includes a shift register 903, a first latch circuit 904, a second latch circuit 905, a level shifter 906, and a buffer 907.

A signal such as a start pulse (SSP) is input to the shift register 903, and selection signals are sequentially output from the sequential logic circuits.

A data signal is input to the first latch circuit 904. The first latch circuit can include one or more of the logic circuits shown in the above embodiments, for example.

The buffer 907 has a function of amplifying a signal and includes an operational amplifier or the like. The buffer 907 can be constituted by one or more of the logic circuits shown in the above embodiments, for example.

The second latch circuit 905 can hold a latch (LAT) signal temporarily and outputs the held latch signals all at once to the pixel portion 701 in FIG. 19. This is referred to as line sequential driving. Therefore, in the case of using a pixel in which not line sequential driving but dot sequential driving is performed, the second latch circuit 905 is not necessary. The second latch circuit 905 can be constituted by one or more of the logic circuits shown in the above embodiments, for example.

Next, operation of the display device illustrated in FIG. 19 will be described.

First, a scan line is selected by the scan line driver circuit 702. To the pixel 704 connected to the selected scan line, a data signal is output from the signal line driver circuit 703 through a signal line by a signal input from the scan line driver circuit 702. Accordingly, data is written to the pixel 704, and the pixel 704 enters into a display state. Scan lines are selected by the scan line driver circuit 702, and data is written to all the pixels 704. The above is the operation of the display device in this embodiment.

The circuits in the display device illustrated in FIG. 19 can all be provided over one substrate, or can be constituted by transistors of the same conductivity type. By providing the circuits over one substrate, the size of the display device can be reduced. By using transistors of the same conductivity type, the process can be simplified.

Note that this embodiment can be implemented in combination with any of other embodiments as appropriate.

Embodiment 7

In this embodiment, a liquid crystal display device will be described as an example of the display device shown in Embodiment 6.

Figure 21:
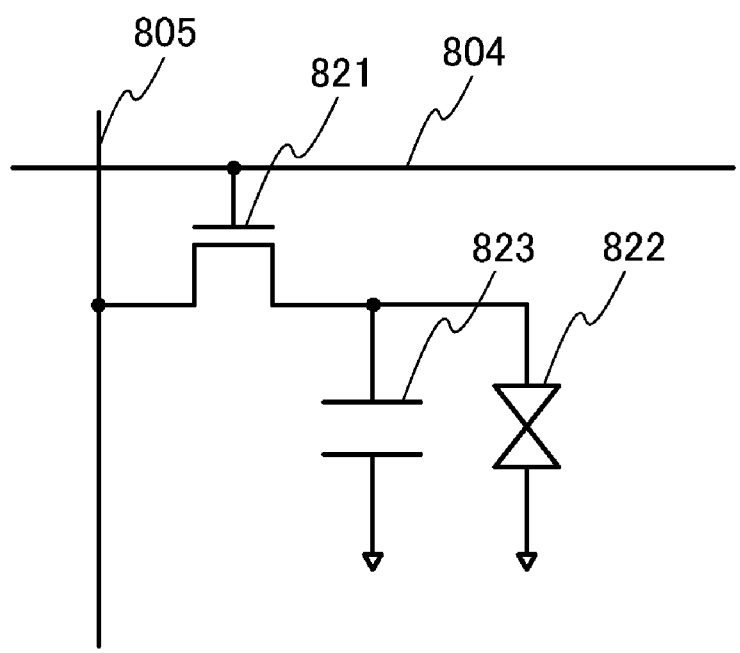
FIG. 21 is a circuit diagram illustrating a circuit configuration of a pixel in a display device in Embodiment 7.

An example of a circuit configuration of a pixel in a display device in this embodiment will be described with reference to FIG. 21. FIG. 21 is a circuit diagram illustrating a circuit configuration of a pixel in the display device in this embodiment.

As illustrated in FIG. 21, the pixel includes a transistor 821, a liquid crystal element 822, and a storage capacitor 823.

The transistor 821 functions as a selection switch. A gate of the transistor 821 is electrically connected to a scan line 804, and one of a source and a drain thereof is electrically connected to a signal line 805.

The liquid crystal element 822 has a first terminal and a second terminal. The first terminal is electrically connected to the other of the source and the drain of the transistor 821. A ground potential or a potential with a given value is applied to the second terminal. The liquid crystal element 822 includes a first electrode which serves as the entire first terminal or part thereof, a second electrode which serves as the entire second terminal or part thereof, and a layer including liquid crystal molecules whose transmittance is changed by applying voltage between the first electrode and the second electrode (such a layer is referred to as a liquid crystal layer).

The storage capacitor 823 has a first terminal and a second terminal. The first terminal is electrically connected to the other of the source and the drain of the transistor 821. The ground potential or a potential with a given value is applied to the second terminal. The storage capacitor 823 includes a first electrode which serves as the entire first terminal or part thereof, a second electrode which serves as the entire second terminal or part thereof, and a dielectric layer. Note that although the storage capacitor 823 is not necessarily provided, the provision of the storage capacitor 823 can reduce adverse effects due to leakage current of the transistor 821.

Note that for the display device in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Alternatively, blue-phase liquid crystal for which an alignment film is not necessary may be used. The blue phase is a kind of liquid crystal phase and appears just before phase transition from a cholesteric phase to an isotropic phase when temperature of cholesteric liquid crystal rises. Since the blue phase appears only in a narrow temperature range, a liquid crystal composition in which 5 wt. % or more of a chiral material is mixed is used for the liquid crystal layer in order to improve the temperature range. As for the liquid crystal composition which contains blue-phase liquid crystal and the chiral material, the response speed is as high as 10 μs to 100 μs, alignment treatment is not necessary due to optical isotropy, and viewing angle dependence is low.

Next, operation of the pixel illustrated in FIG. 21 will be described.

First, a pixel to which data is written is selected, and the transistor 821 in the selected pixel is turned on by a signal input from the scan line 804.

At this time, a data signal from the signal line 805 is input through the transistor 821, so that the first terminal of the liquid crystal element 822 has the same potential as the data signal, and the transmittance of the liquid crystal element 822 is set depending on voltage applied between the first terminal and the second terminal. After data writing, the transistor 821 is turned off by a signal input from the scan line 804, the transmittance of the liquid crystal element 822 is maintained during a display period, and the pixel enters into a display state. The above operation is sequentially performed per scan line 804 included in a display device, and the above operation is performed in all the pixels. The above is the operation of the pixel.

In displaying moving images in a liquid crystal display device, there is a problem in that an afterimage or motion blur occurs because of slow response of liquid crystal molecules themselves. In order to improve moving image characteristics of the liquid crystal display device, there is a driving technique called black insertion, in which the entire screen is displayed as black every other frame.

Moreover, there is a driving technique called double-frame rate driving, in which a vertical synchronizing frequency is set 1.5 times or more, preferably, 2 times or more as high as a normal vertical synchronizing frequency in order to increase the response speed, and grayscale level to be written is selected for a plurality of divided fields in each frame.

Further, in order to improve moving image characteristics of the liquid crystal display device, there is a driving technique in which a plurality of LED (light-emitting diode) light sources, a plurality of EL light sources, or the like are used as backlights to form an area light source, and the light sources forming the area light source are independently lit intermittently in one frame period. For the area light source, LEDs of three kinds or more or an LED which emits white light may be used. Since a plurality of LEDs can be independently controlled, the timing when the LED emits light can be synchronized with the timing when optical modulation of the liquid crystal layer is changed. Part of the LEDs can be turned off in this driving technique, so that power consumption can be reduced particularly in the case of displaying an image in which a black display region occupies a large area in one screen.

By combining these driving techniques, display characteristics such as moving image characteristics of the liquid crystal display device can be improved as compared to those of a conventional liquid crystal display device.

Figure 22A:
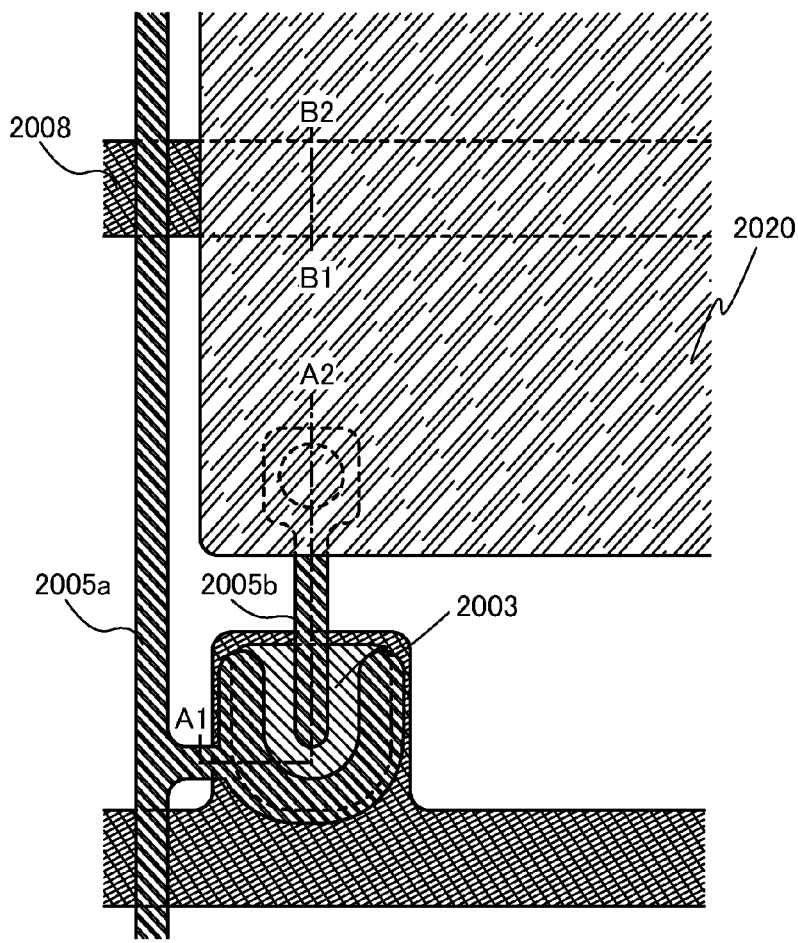
FIGS. 22A and 22B illustrate a structure of a pixel in a display device in Embodiment 7.
Figure 22B:
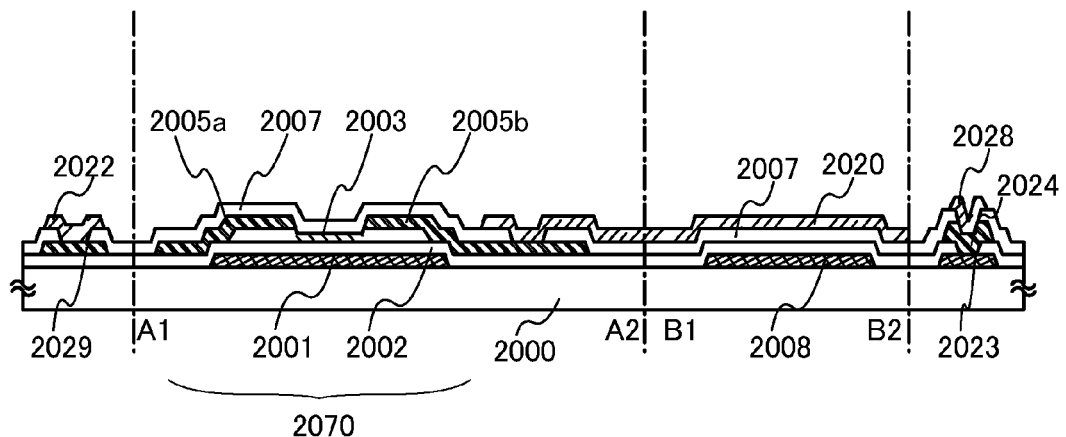

Next, a structure of a display device in this embodiment, which includes the above pixel, will be described with reference to FIGS. 22A and 22B. FIGS. 22A and 22B illustrate a structure of the pixel in the display device in this embodiment. FIG. 22A is a top view, and FIG. 22B is a cross-sectional view. Note that dotted lines A1-A2 and B1-B2 in FIG. 22A correspond to cross sections A1-A2 and B1-B2 in FIG. 22B, respectively.

As illustrated in FIGS. 22A and 22B, the display device in this embodiment includes, in the cross section A1-A2, a gate electrode 2001 over a substrate 2000; an insulating film 2002 provided over the gate electrode 2001; an oxide semiconductor layer 2003 provided over the insulating film 2002; a pair of electrodes 2005a and 2005b provided over the oxide semiconductor layer 2003; a protective insulating layer 2007 provided over the electrodes 2005a and 2005b and the oxide semiconductor layer 2003; and an electrode 2020 which is in contact with the electrode 2005b through an opening portion provided in the protective insulating layer 2007.

Moreover, the display device includes, in the cross section B1-B2, an electrode 2008 over the substrate 2000; the insulating film 2002 over the electrode 2008; the protective insulating layer 2007 provided over the insulating film 2002; and the electrode 2020 provided over the protective insulating layer 2007.

Electrodes 2022 and 2029 and electrodes 2023, 2024, and 2028 serve as a wiring or an electrode for connection with an FPC.

Since a thin film transistor used in this embodiment can be formed in a similar manner to the enhancement transistor described in Embodiment 5, detailed description thereof is omitted here.

The electrodes 2020, 2022, and 2028 are formed using indium oxide ($In_2O_3$), an alloy of indium oxide and tin oxide ($In_2O_3$—$SnO_2$, referred to as ITO), or the like by a sputtering method, a vacuum evaporation method, or the like. Such a material is etched with a hydrochloric acid-based solution. Note that since etching of ITO particularly tends to leave residue, an alloy of indium oxide and zinc oxide ($In_2O_3$—ZnO) may be used in order to improve the etching processability.

FIGS. 23A1 and 23A2 are a cross-sectional view and a top view of a gate wiring terminal portion at this stage, respectively. FIG. 23A1 is a cross-sectional view along C1-C2 in FIG. 23A2. In FIG. 23A1, a transparent conductive film 2055 formed over a protective insulating film 2054 is a terminal electrode for connection, which functions as an input terminal. Further, in FIG. 23A1, in the terminal portion, a first terminal 2051 which is formed of the same material as a gate wiring and a connection electrode 2053 which is formed of the same material as a source wiring overlap with each other with a gate insulating layer 2052 therebetween and are electrically connected through the transparent conductive film 2055 to allow electrical continuity. Moreover, the connection electrode 2053 and the transparent conductive film 2055 are in direct contact with each other through a contact hole provided in the protective insulating film 2054 to allow electrical continuity.

FIGS. 23B1 and 23B2 are a cross-sectional view and a top view of a source wiring terminal portion, respectively. FIG. 23B1 is a cross-sectional view along D1-D2 in FIG. 23B2. In FIG. 23B1, the transparent conductive film 2055 formed over the protective insulating film 2054 is a terminal electrode for connection, which functions as an input terminal. Moreover, in FIG. 23B1, in the terminal portion, an electrode 2056 which is formed of the same material as the gate wiring is placed below a second terminal 2050 which is electrically connected to the source wiring, so as to overlap with the second terminal 2050 with the gate insulating layer 2052 therebetween. The electrode 2056 is not electrically connected to the second terminal 2050. When the electrode 2056 is set to have a potential different from that of the second terminal 2050, for example, a floating potential, GND, or 0 V, capacitance for preventing noise or static electricity can be formed. Further, the second terminal 2050 is electrically connected to the transparent conductive film 2055 through the protective insulating film 2054.

A plurality of gate wirings, source wirings, and capacitor wirings are provided depending on the pixel density. Moreover, a plurality of first terminals at the same potential as the gate wiring, a plurality of second terminals at the same potential as the source wiring, a plurality of third terminals at the same potential as the capacitor wiring, and the like are arranged in the terminal portion. The number of each of the terminals can be a given number and is determined as appropriate by a practitioner.

Accordingly, a pixel TFT portion including a TFT 2070, which is a bottom-gate n-channel TFT, and a storage capacitor can be completed. Then, they are arranged in matrix corresponding to pixels so that a pixel portion is formed; thus, a substrate for manufacturing an active matrix display device can be formed. In this specification, such a substrate is referred to as an active matrix substrate for convenience.

When an active matrix liquid crystal display device is formed, a liquid crystal layer is provided between an active matrix substrate and a counter substrate provided with a counter electrode, and the active matrix substrate and the counter substrate are fixed. A common electrode which is electrically connected to the counter electrode provided on the counter substrate is provided over the active matrix substrate, and a fourth electrode which is electrically connected to the common electrode is provided in a terminal portion. The fourth terminal is a terminal for making the common electrode have a fixed potential, for example, GND or 0 V.

The n-channel transistor obtained in this embodiment uses the In—Ga—Zn—O-based non-single-crystal film for a channel formation region and thus has favorable dynamic characteristics, whereby the above driving techniques can be used in combination.

Further, when a light-emitting display device is formed, in order to set one electrode (also referred to as a cathode) of an organic light-emitting element to have a low power supply potential, for example, GND or 0 V, a fourth terminal for making the cathode have the low power supply potential such as GND or 0 V is provided in a terminal portion. Moreover, when the light-emitting display device is formed, a power supply line is provided in addition to a source wiring and a gate wiring. Accordingly, a fifth terminal electrically connected to the power supply line is provided in the terminal portion.

A gate line driver circuit or a source line driver circuit is constituted by TFTs using an oxide semiconductor, whereby manufacturing costs are reduced. Moreover, a gate electrode of the TFT included in the driver circuit is directly connected to a source wiring or a drain wiring so that the number of contact holes is reduced, whereby a display device can be provided in which the area occupied by the driver circuit is reduced.

Therefore, according to this embodiment, a highly reliable display device with high electric characteristics can be provided at low cost.

Note that this embodiment can be implemented in combination with any of other embodiments as appropriate.

Embodiment 8

In this embodiment, a light-emitting display device will be described as an example of the display device shown in Embodiment 6. As an example, a light-emitting display device in which electroluminescence is used for a light-emitting element will be described in this embodiment.

Light-emitting elements utilizing electroluminescence are classified according to whether a light-emitting material is an organic compound or an inorganic compound. In general, the former is referred to as an organic EL element, and the latter as an inorganic EL element.

In an organic EL element, by application of voltage to the light-emitting element, electrons and holes are separately injected from a pair of electrodes into a layer containing a light-emitting organic compound, and there flows a current. Then, these carriers (the electrons and the holes) are recombined, so that the light-emitting organic compound is set in an excited state. The light-emitting organic compound emits light when it returns from the excited state to a ground state. Based on such a mechanism, such a light-emitting element is referred to as a current-excitation light-emitting element.

Inorganic EL elements are classified according to the element structures into a dispersion inorganic EL elements and thin-film inorganic EL elements. A dispersion inorganic EL element includes a light-emitting layer where particles of a light-emitting material are dispersed in a binder, and its light emission mechanism is donor-acceptor recombination light emission utilizing a donor level and an acceptor level. A thin-film inorganic EL element has a structure in which a light-emitting layer is sandwiched between dielectric layers, which are further sandwiched between electrodes, and its light emission mechanism is localized light emission utilizing inner-shell electron transition of metal ions. Note that here, an organic EL element is described as a light-emitting element.

Figure 24:
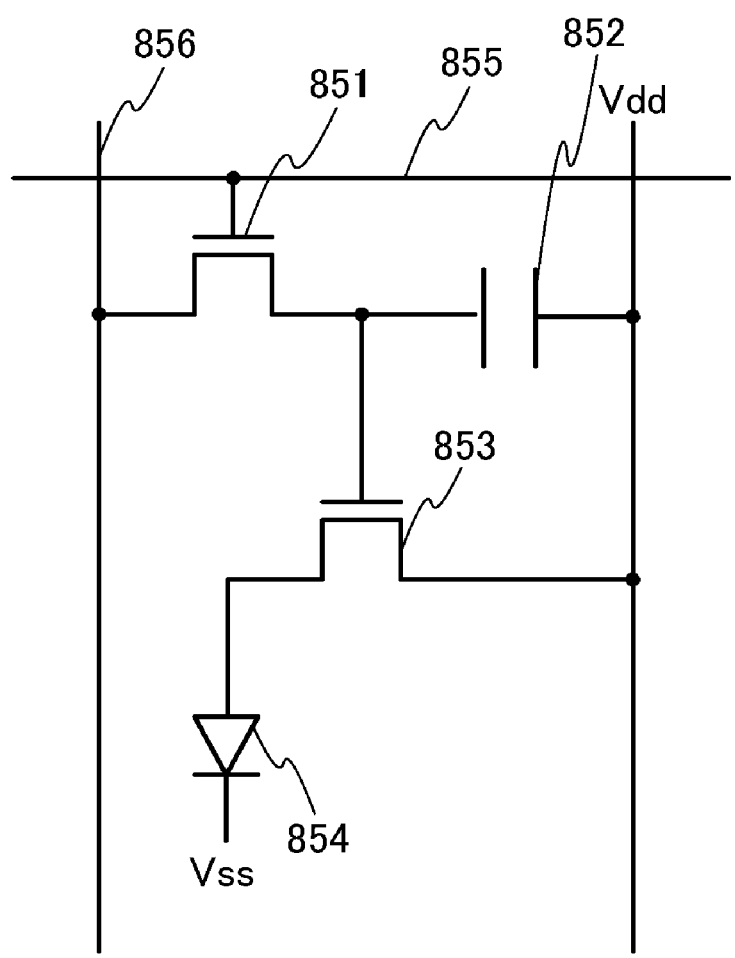
FIG. 24 is a circuit diagram illustrating a circuit configuration of a pixel in a display device in Embodiment 8.

A circuit configuration of a pixel in a display device in this embodiment will be described with reference to FIG. 24. FIG. 24 is a circuit diagram illustrating a circuit configuration of a pixel of the display device in this embodiment.

As illustrated in FIG. 24, the pixel of the display device in this embodiment includes a transistor 851, a storage capacitor 852, a transistor 853, and a light-emitting element 854.

A gate of the transistor 851 is electrically connected to a scan line 855, and one of a source and a drain thereof is electrically connected to a signal line 856. A high power supply potential is applied to the other of the source and the drain of the transistor 851 through the storage capacitor 852.

A gate of the transistor 853 is electrically connected to the other of the source and the drain of the transistor 851. The high power supply potential is applied to one of a source and a drain of the transistor 853.

The light-emitting element 854 has a first terminal and a second terminal. The first terminal is electrically connected to the other of the source and the drain of the transistor 853. A low power supply potential is applied to the second terminal.

Next, operation of the pixel illustrated in FIG. 24 will be described.

An example of display operation of the pixel in the display device in this embodiment is described.

First, a pixel to which data is written is selected. In the selected pixel, the transistor 851 is turned on by a scan signal input from the scan line 855, and a video signal (also referred to as a data signal), which is a fixed potential, is input from the signal line 856 to the gate of the transistor 853.

The transistor 853 is turned on or off by a potential in response to the data signal input to the gate. When the transistor 853 is on, the potential of the light-emitting element 854 has a value which depends on the gate potential of the transistor 853 and on the high power supply potential. At this time, current flows through the light-emitting element 854 depending on the voltage applied between the first terminal and the second terminal, and the light-emitting element 854 emits light with luminance in response to the amount of current flowing therethrough. Further, since the gate potential of the transistor 853 is held for a certain period by the storage capacitor 852, the light-emitting element 854 maintains a light-emitting state for a certain period.

When the data signal input from the signal line 856 to the pixel is digital, the pixel enters into a light-emitting state or a non-light-emitting state by switching on and off of the transistor 851. Accordingly, gradation can be expressed by an area ratio grayscale method or a time ratio grayscale method. An area ratio grayscale method refers to a driving method by which one pixel is divided into a plurality of subpixels and each of the subpixels with the circuit structure illustrated in FIG. 24 is independently driven in accordance with a data signal so that gradation is expressed. Further, a time ratio grayscale method refers to a driving method by which a period during which a pixel is in a light-emitting state is controlled so that gradation is expressed.

Since the response speed of light-emitting elements is higher than that of liquid crystal elements or the like, the light-emitting elements are suitable for a time ratio grayscale method as compared to the liquid crystal elements. Specifically, when display is performed by a time ratio grayscale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of a period in which pixels actually emit light in one frame period can be controlled with video signals, and gradation can be expressed.

Among driver circuits in the light-emitting display device, part of a driver circuit which can be constituted by n-channel TFTs can be formed over a substrate where TFTs in a pixel portion are formed. Moreover, a signal line driver circuit and a scan line driver circuit can be constituted only by n-channel TFTs.

Next, a structure of a light-emitting element will be described with reference to FIGS. 25A to 25C. Here, a cross-sectional structure of a pixel in the case of an n-channel driving TFT is described as an example. TFTs 7001, 7011, and 7021, which are driving TFTs used in display devices in FIGS. 25A, 25B, and 25C respectively, can be formed in a similar manner to the enhancement-type TFTs shown in the above embodiments, include an oxide semiconductor layer as a semiconductor layer, and have high reliability.

In order to extract light emitted from a light-emitting element, at least one of an anode and a cathode needs to be transparent. A TFT and a light-emitting element are formed over a substrate. There are light-emitting elements having a top emission structure in which light is extracted through the surface opposite to the substrate, having a bottom emission structure in which light is extracted through the surface on the substrate side, and having a dual emission structure in which light is extracted through the surface on the substrate side and the surface opposite to the substrate. The pixel structure of the present invention can be applied to a light-emitting element having any of these emission structures.

A light-emitting element having a top emission structure will be described with reference to FIG. 25A.

Figure 25A:
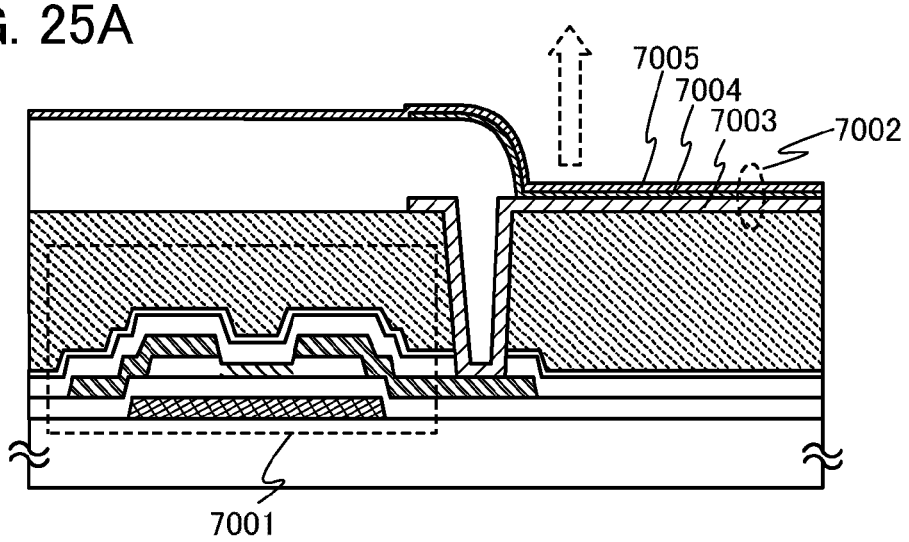
FIGS. 25A to 25C are cross-sectional views each illustrating a structure of a pixel in a display device in Embodiment 8.
Figure 25B:
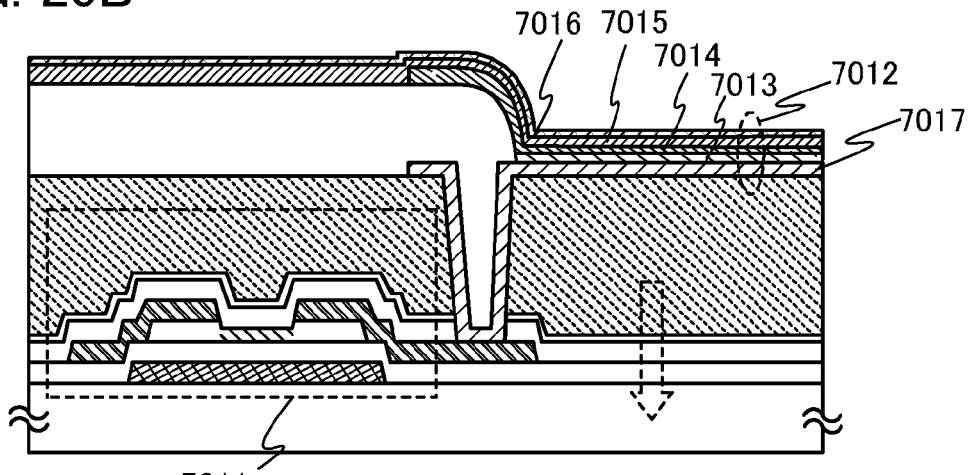
Figure 25C:
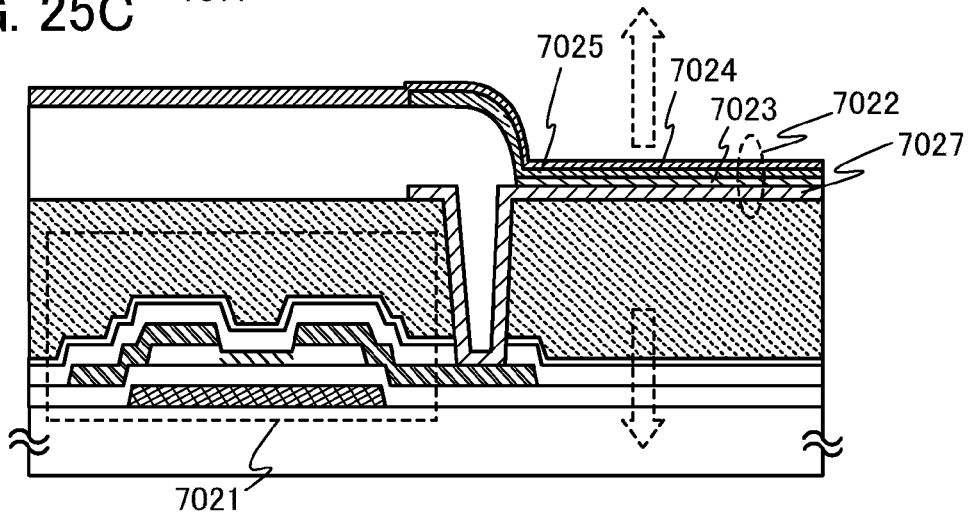

FIG. 25A is a cross-sectional view of a pixel in the case where the TFT 7001, which is the driving TFT, is an n-channel TFT and light emitted from a light-emitting element 7002 passes through an anode 7005. In FIG. 25A, a cathode 7003 of the light-emitting element 7002 and the TFT 7001, which is the driving TFT, are electrically connected to each other, and a light-emitting layer 7004 and the anode 7005 are sequentially stacked over the cathode 7003. As the cathode 7003, any conductive film can be used as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in order over the cathode 7003. Note that it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the pixel illustrated in FIG. 25A, light is emitted from the light-emitting element 7002 to the anode 7005 side as shown by an arrow.

Next, a light-emitting element having a bottom emission structure will be described with reference to FIG. 25B. FIG. 25B is a cross-sectional view of a pixel in the case where the driving TFT 7011 is an n-channel TFT and light emitted from a light-emitting element 7012 passes through a cathode 7013. In FIG. 25B, the cathode 7013 of the light-emitting element 7012 is formed over a light-transmitting conductive film 7017 which is electrically connected to the driving TFT 7011, and a light-emitting layer 7014 and an anode 7015 are sequentially stacked over the cathode 7013. Note that when the anode 7015 has a light-transmitting property, a light-blocking film 7016 for reflecting or blocking light may be formed so as to cover the anode 7015. As in the case of FIG. 25A, a variety of materials can be used for the cathode 7013 as long as a material is a conductive material having a low work function. Note that the thickness of the cathode 7013 is set so that light is transmitted therethrough (preferably, approximately 5 nm to 30 nm). For example, a 20-nm-thick aluminum film can be used as the cathode 7013. The light-emitting layer 7014 may be formed of a single layer or by stacking a plurality of layers as in FIG. 25A. The anode 7015 does not need to transmit light, but can be formed using a light-transmitting conductive film as in FIG. 25A. The light-blocking film 7016 can be formed using, for example, a metal which reflects light; however, one embodiment of the invention is not limited to a metal film. For example, a resin to which a black pigment is added can be used.

The light-emitting element 7012 corresponds to a region where the light-emitting layer 7014 is sandwiched between the cathode 7013 and the anode 7015. In the pixel illustrated in FIG. 25B, light is emitted from the light-emitting element 7012 to the cathode 7013 side as shown by an arrow.

Next, a light-emitting element having a dual emission structure will be described with reference to FIG. 25C. In FIG. 25C, a cathode 7023 of a light-emitting element 7022 is formed over a light-transmitting conductive film 7027 which is electrically connected to the driving TFT 7021, and a light-emitting layer 7024 and an anode 7025 are sequentially stacked over the cathode 7023. As in the case of FIG. 25A, a variety of materials can be used for the cathode 7023 as long as a material is a conductive material with a low work function. Note that the thickness of the cathode 7023 is set so that light is transmitted therethrough. For example, Al having a thickness of 20 nm can be used as the cathode 7023. As in FIG. 25A, the light-emitting layer 7024 may be formed using a single layer or a stack of a plurality of layers. The anode 7025 can be formed using a light-transmitting conductive film as in FIG. 25A.

The light-emitting element 7022 corresponds to a region where the cathode 7023, the light-emitting layer 7024, and the anode 7025 overlap with each other. In the pixel illustrated in FIG. 25C, light is emitted from the light-emitting element 7022 to both the anode 7025 side and the cathode 7023 side as shown by arrows.

Note that although an organic EL element is described here as a light-emitting element, an inorganic EL element can also be provided as a light-emitting element.

Note that in this embodiment, the example is described in which a TFT (also referred to as a driving TFT) which controls driving of a light-emitting element is electrically connected to the light-emitting element; alternatively, a structure may be employed in which a TFT for current control is connected between the driving TFT and the light-emitting element.

Next, the appearance and cross section of the display device (also referred to as a light-emitting panel) in this embodiment will be described with reference to FIGS. 26A and 26B. FIG. 26A is a top view of the display device in this embodiment, in which a TFT and a light-emitting element formed over a first substrate are sealed between the first substrate and a second substrate by a sealing material. FIG. 26B is a cross-sectional view along H-I in FIG. 26A.

A sealing material 4505 is provided so as to surround a pixel portion 4502, a signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with a filler 4507, with the first substrate 4501, the sealing material 4505, and the second substrate 4506. In such a manner, it is preferable to pack (seal) the pixel portion 4502, the signal line driver circuits 4503a and 4503b, and the scan line driver circuits 4504a and 4504b with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the air.

The pixel portion 4502, the signal line driver circuits 4503a and 4503b, and the scan line driver circuits 4504a and 4504b, which are formed over the first substrate 4501, each include a plurality of TFTs. In FIG. 26B, a TFT 4510 included in the pixel portion 4502 and a TFT 4509 included in the signal line driver circuit 4503a are illustrated as an example.

As the TFTs 4509 and 4510, the highly reliable TFT shown in Embodiment 4, which includes the oxide semiconductor layer as a semiconductor layer, can be used. Alternatively, the TFT shown in Embodiment 5 may be used. In this embodiment, the TFTs 4509 and 4510 are n-channel TFTs.

Moreover, reference numeral 4511 denotes a light-emitting element. A first electrode 4517 which is a pixel electrode included in the light-emitting element 4511 is electrically connected to a source electrode or a drain electrode of the TFT 4510. Note that the light-emitting element 4511 has a layered structure of the first electrode 4517, an electroluminescent layer 4512, and a second electrode 4513; however, the structure of the light-emitting element is not limited to that shown in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. In particular, it is preferable that the bank 4520 be formed using a photosensitive material to have an opening portion over the first electrode 4517, and a sidewall of the opening portion be formed as an inclined surface with a continuous curvature.

The electroluminescent layer 4512 may be formed using a single layer or a stack of a plurality of layers.

In order to prevent oxygen, hydrogen, moisture, carbon dioxide, or the like from entering the light-emitting element 4511, a protective layer may be formed over the second electrode 4513 and the bank 4520. As the protective layer, a silicon nitride film, a silicon nitride oxide film, a DLC (diamond like carbon) film, or the like can be formed.

Further, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film as the first electrode 4517 included in the light-emitting element 4511. A terminal electrode 4516 is formed using the same conductive film as the source electrodes and the drain electrodes of the TFTs 4509 and 4510.

The connection terminal electrode 4515 is electrically connected to a terminal of the FPC 4518a through an anisotropic conductive film 4519.

A substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used other than an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

If necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment by which reflected light can be dispersed on an uneven surface to reduce glare can be performed.

As the signal line driver circuits 4503a and 4503b and the scan line driver circuits 4504a and 4504b, a driver circuit formed using a single crystal semiconductor film or a polycrystalline semiconductor film may be mounted on a substrate separately prepared. Alternatively, only the signal line driver circuit or part thereof, or the scan line driver circuit or part thereof may be separately formed to be mounted. This embodiment is not limited to the structure in FIGS. 26A and 26B.

Through the above steps, a highly reliable light-emitting display device (display panel) can be manufactured.

Note that this embodiment can be combined with any of the structures disclosed in other embodiments as appropriate.

Embodiment 9

In this embodiment, electronic paper will be described as an example of the display device shown in Embodiment 6.

The logic circuit shown in the above embodiments can be used in electronic paper. Electronic paper is also referred to as an electrophoretic display device (an electrophoretic display) and has advantages of having high readability which is equivalent to normal paper and lower power consumption than other display devices, and being thin and lightweight.

A variety of modes of electrophoretic displays can be considered. An electrophoretic display includes a plurality of microcapsules which include first particles having a positive charge and second particles having a negative charge, and are dispersed in a solvent or a solute. By applying an electric field to the microcapsules, the particles in the microcapsules move in opposite directions to each other, and only a color of the particles gathered on one side is displayed. Note that the first particles or the second particles contain a dye and do not move when there is no electric field. Moreover, colors (including colorless) of the first particles and the second particles are different from each other.

Accordingly, the electrophoretic display utilizes a so-called dielectrophoretic effect, in which a substance with a high dielectric constant moves to a region with high electric fields. An electrophoretic display device does not need to use a polarizing plate which is required in a liquid crystal display device.

A substance in which the microcapsules are dispersed in a solvent is called electronic ink, and the electronic ink can be applied to a surface of glass, plastic, fabric, paper, or the like. Moreover, color display is possible with the use of a color filter or particles including a coloring matter.

Further, an electrode over an active matrix substrate is used as one electrode and a plurality of the aforementioned microcapsules is arranged so as to be interposed between a pair of electrodes. In this manner, an active matrix display device is completed. Then, display can be performed by application of electric fields to the microcapsules. For example, an active matrix substrate obtained using the enhancement-type TFT exemplified in Embodiment 5 can be used.

Note that for the first particles and the second particles in the microcapsule, one or a composite material of a conductive material, an insulating material, a semiconductor material, a magnetic material, a liquid crystal material, a ferroelectric material, an electroluminescent material, an electrochromic material, or a magnetophoretic material may be used.

Figure 27:
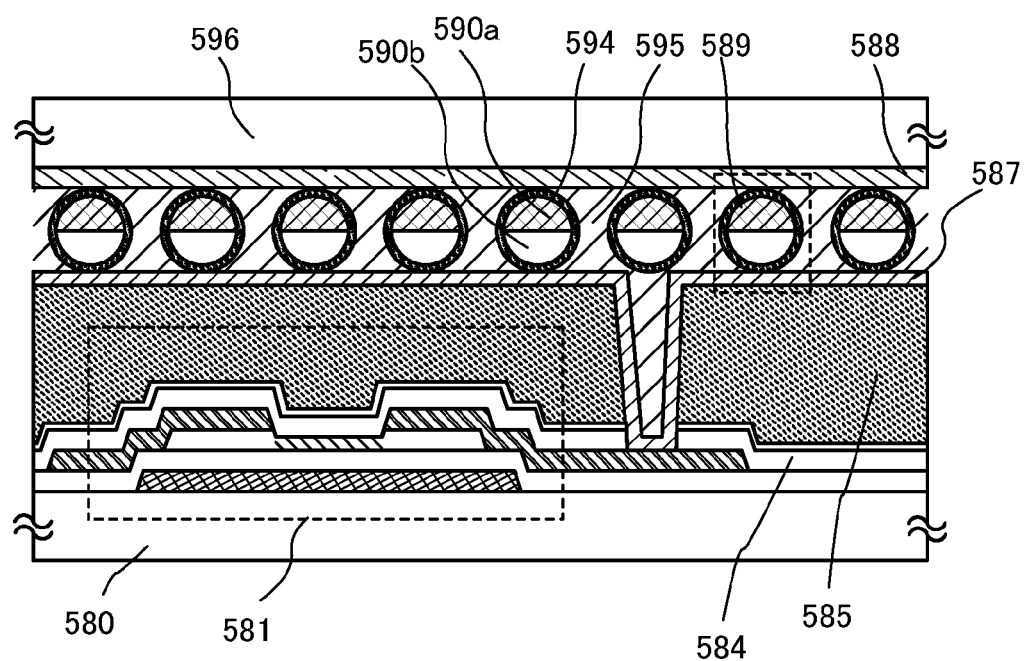
FIG. 27 is a cross-sectional view illustrating a structure of electronic paper in Embodiment 9.

Next, an example of a structure of electronic paper in this embodiment will be described with reference to FIG. 27. FIG. 27 is a cross-sectional view illustrating a structure of the electronic paper in this embodiment.

The electronic paper illustrated in FIG. 27 includes a TFT 581 over a substrate 580; insulating layers 584 and 585 which are stacked over the TFT 581; an electrode 587 which is in contact with a source electrode or a drain electrode of the TFT 581 through an opening portion provided in the insulating layers 584 and 585; and includes between the electrode 587 and an electrode 588 provided on a substrate 596, spherical particles 589, each of which includes a black region 590a, a white region 590b, and a cavity 594 which surrounds the black region 590a and the white region 590b and is filled with a liquid; and a filler 595 provided around the spherical particles 589.

The TFT 581 can be formed in a similar manner to the TFT shown in Embodiment 4 and is a highly reliable TFT including an oxide semiconductor layer as a semiconductor layer. Alternatively, the TFT shown in Embodiment 5 can be applied to the TFT 581 in this embodiment.

A method of using the spherical particles 589 is called a twisting ball display method. In the twisting ball display system, spherical particles each colored in black and white are arranged between a first electrode and a second electrode, which are electrodes used for a display element, and potential difference is generated between the first electrode and the second electrode to control orientation of the spherical particles; accordingly, display is performed.

Further, instead of the spherical element, an electrophoretic element can also be used. A microcapsule having a diameter of approximately 10 μm to 200 μm, in which a transparent liquid, positively charged white microparticles, and negatively charged black microparticles are encapsulated, is used. In the microcapsule provided between the first electrode and the second electrode, when an electric field is applied by the first electrode and the second electrode, the white microparticles and the black microparticles move to opposite directions to each other, so that white or black can be displayed. An electrophoretic display element is a display element to which this principle is applied. The electrophoretic display element has higher reflectivity than a liquid crystal display element, and thus, an assistant light is unnecessary. Moreover, power consumption is low, and a display portion can be recognized in a dusky place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

The logic circuit which is one embodiment of the invention disclosed in the specification can be used, for example, as a driver circuit for the electronic paper in this embodiment. Further, since a thin film transistor using an oxide semiconductor layer can be applied to a transistor in the display portion, the driver circuit and the display portion can be provided over one substrate, for example.

Figure 28:
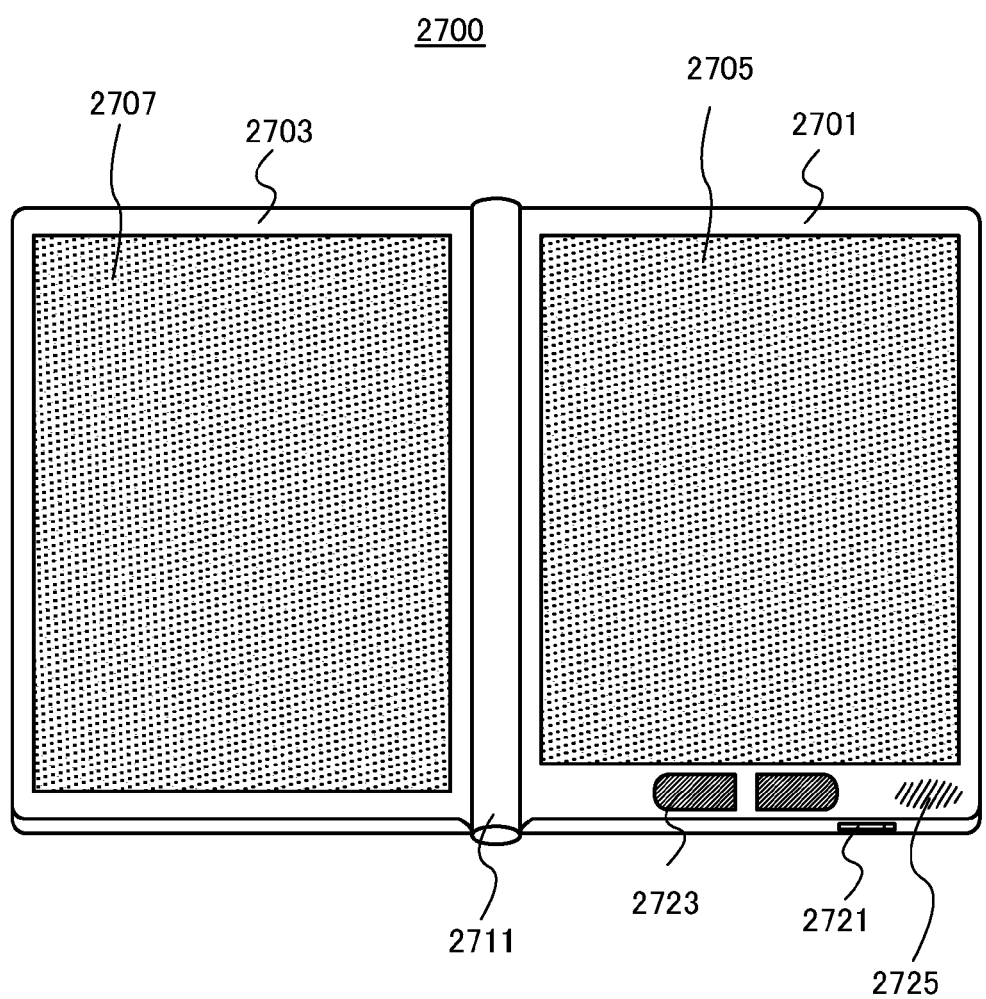
FIG. 28 illustrates an electronic device to which electronic paper in Embodiment 9 is applied.

The electronic paper can be used in electronic devices of various fields, which display information. For example, the electronic paper can be applied to e-book readers (electronic books), posters, advertisements on vehicles such as trains, or displays on a variety of cards such as credit cards. An example of such an electronic device will be illustrated in FIG. 28. FIG. 28 illustrates an example of an electronic book reader.

As illustrated in FIG. 28, an e-book reader 2700 has two housings 2701 and 2703. The housings 2701 and 2703 are united with an axis portion 2711, and the e-book reader 2700 can be opened and closed with the axis portion 2711 as an axis. With such a structure, the e-book reader 2700 can be operated like a paper book.

A display portion 2705 is incorporated into the housing 2701. A display portion 2707 is incorporated into the housing 2703. The display portions 2705 and 2707 may display one image or different images. When the display portions display different images, text can be displayed on the right display portion (the display portion 2705 in FIG. 28) and an image can be displayed on the left display portion (the display portion 2707 in FIG. 28), for example.

Further, FIG. 28 illustrates an example where the housing 2701 is provided with an operation portion and the like. For example, the housing 2701 is provided with a power supply switch 2721, operation keys 2723, a speaker 2725, and the like. Pages can be turned by the operation key 2723. Note that a keyboard, a pointing device, or the like may be provided on the same side as the display portion in the housing. Moreover, a terminal for external connection (e.g., an earphone terminal, a USB terminal, and a terminal capable of connecting a variety of cables such as an AC adapter and a USB cable), a portion for inserting recording media, or the like may be provided on a rear surface or a side surface of the housing. Furthermore, the e-book reader 2700 may functions as an electronic dictionary.

In addition, the e-book reader 2700 may be configured to wirelessly transmit and receive information. The e-book reader 2700 can have a structure where desired book data or the like is wirelessly purchased and downloaded from an e-book server.

Embodiment 10

In this embodiment, a system-on-panel display device will be described as one embodiment of the display device in Embodiment 6.

The logic circuit which is one embodiment of the invention disclosed in this specification can be applied to a system-on-panel display device in which a display portion and a driver circuit are provided over one substrate. A specific structure of the display device will be described below.

The display device in this embodiment includes a display element. As the display element, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Further, a display medium whose contrast is changed by an electric effect, such as electronic ink, can be used.

In addition, the display device in this embodiment includes, in its category, a panel in which a display element is sealed, and a module in which an IC and the like including a controller are mounted on the panel. Moreover, this embodiment relates to an element substrate before a display element is completed in a process of manufacturing the display device. The element substrate is provided with a means for supplying current to the display element in each of a plurality of pixels. Specifically, the element substrate may be in a state where only a pixel electrode of the display element is provided, a state after a conductive film to serve as a pixel electrode is formed and before the conductive film is etched to form the pixel electrode, or other states.

Note that a display device in this specification refers to an image display device, a display device, or a light source (including a lighting device). Further, the display device includes any of the following modules in its category: a module including a connector such as a flexible printed circuit (FPC), tape automated bonding (TAB) tape, or tape carrier package (TCP); a module including TAB tape or TCP which is provided with a printed wiring board at the end thereof; and a module including an integrated circuit (IC) which is directly mounted on a display element by a chip on glass (COG) method.

Next, the appearance and cross section of a liquid crystal display panel which is one embodiment of the display device in this embodiment will be described with reference to FIGS. 29A1, 29A2, and 29B.

Each of FIGS. 29A1 and 29A2 is a top view of the display device in this embodiment, in which a liquid crystal element 4013 and TFTs 4010 and 4011 including the In—Ga—Zn—O-based non-single-crystal film shown in Embodiment 4, which is formed over a first substrate 4001, as a semiconductor layer are sealed between the first substrate 4001 and a second substrate 4006 with a sealing material 4005. FIG. 29B is a cross-sectional view along M-N in FIGS. 29A1 and 29A2.

In the display device in this embodiment, the sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 as well as a liquid crystal layer 4008 are sealed with the first substrate 4001, the sealing material 4005, and the second substrate 4006. Moreover, a signal line driver circuit 4003, which is formed using a single crystal semiconductor film or a polycrystalline semiconductor film over a substrate prepared separately, is provided in a region different from the region surrounded by the sealing material 4005 over the first substrate 4001.

Note that there is no particular limitation on a connection method of the driver circuit which is separately formed, and a COG method, a wire bonding method, a TAB method, or the like can be used. FIG. 29A1 illustrates an example where the signal line driver circuit 4003 is mounted by a COG method. FIG. 29A2 illustrates an example where the signal line driver circuit 4003 is mounted by a TAB method.

The pixel portion 4002 and the scan line driver circuit 4004, which are provided over the first substrate 4001, each include a plurality of TFTs. FIG. 29B illustrates the TFT 4010 included in the pixel portion 4002 and the TFT 4011 included in the scan line driver circuit 4004. Insulating layers 4020 and 4021 are provided over the TFTs 4010 and 4011.

As the TFTs 4010 and 4011, the highly reliable TFT shown in Embodiment 4, which includes the oxide semiconductor layer as a semiconductor layer, can be used. Alternatively, the TFT shown in Embodiment 5 may be used. In this embodiment, the TFTs 4010 and 4011 are n-channel TFTs.

A pixel electrode 4030 included in the liquid crystal element 4013 is electrically connected to the TFT 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. The pixel electrode 4030 and the counter electrode 4031 are provided with insulating layers 4032 and 4033 functioning as alignment films, respectively, between which the liquid crystal layer 4008 is sandwiched with the insulating layers 4032 and 4033 therebetween.

To the first substrate 4001 and the second substrate 4006, a material and a manufacturing method which can be applied to those of the substrate 200 in the above embodiments can be applied.

A spacer 4035 is a columnar partition obtained by selective etching of an insulating film, and is provided in order to control a distance (a cell gap) between the pixel electrode 4030 and the counter electrode 4031. Note that a spherical spacer may be used. Further, the counter electrode 4031 is electrically connected to a common potential line provided over the same substrate as the TFT 4010. The counter electrode 4031 and the common potential line can be electrically connected to each other through conductive particles arranged between the pair of substrates. Note that the conductive particles are included in the sealing material 4005.

Note that although this embodiment shows an example of a transmissive liquid crystal display device, the present invention can also be applied to a reflective liquid crystal display device or a transflective liquid crystal display device.

As the liquid crystal display device in this embodiment, an example is shown in which a polarizing plate is provided on the outer side of the substrate (on the viewer side) and a coloring layer and the electrode used for the display element are sequentially provided on the inner side; alternatively, a polarizing plate may be provided on the inner side of the substrate. Moreover, a layered structure of the polarizing plate and the coloring layer is not limited to that in this embodiment, and may be determined as appropriate depending on materials of the polarizing plate and the coloring layer or the conditions of the manufacturing process. Further, a light-blocking film functioning as a black matrix may be provided.

In this embodiment, in order to reduce surface unevenness of the TFT and improve the reliability of the TFT, the TFT is covered with an insulating layer (the insulating layers 4020 and 4021) functioning as a protective layer or a planarization insulating film. Note that the protective layer prevents penetration of contaminating impurities such as an organic matter, metal, or moisture included in the air, and thus is preferably dense. The protective layer may be formed by a sputtering method with a single layer or a stack of a silicon oxide film, a silicon nitride film, a silicon oxynitride film, a silicon nitride oxide film, an aluminum oxide film, an aluminum nitride film, an aluminum oxynitride film, or an aluminum nitride oxide film. The example where the protective layer is formed by a sputtering method is shown in this embodiment; however, one embodiment of the invention is not particularly limited thereto, and the protective layer may be formed by a variety of methods. Further, by using a non-reducible film, the protective layer can also function as a reduction prevention layer.

Here, the insulating layer 4020 with a layered structure is formed as the protective layer. In this case, as a first layer of the insulating layer 4020, a silicon oxide film is formed by a sputtering method. The use of the silicon oxide film as the protective layer is effective in preventing hillocks in an aluminum film used as a source electrode and a drain electrode.

Moreover, an insulating layer is formed as a second layer of the protective layer. Here, as the second layer of the insulating layer 4020, a silicon nitride film is formed by a sputtering method. The use of the silicon nitride film as the protective layer can prevent mobile ions such as sodium from entering the semiconductor region and changing electric characteristics of the TFT.

Further, after the protective layer is formed, annealing (250° C. to 400° C.) may be performed on the semiconductor layer.

Then, the insulating layer 4021 is formed as a planarization insulating film. An organic material having heat resistance, such as polyimide, acrylic, benzocyclobutene, polyamide, or epoxy can be used for the insulating layer 4021. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of such materials.

Note that a siloxane-based resin is a resin formed from a siloxane-based material as a starting material and having a Si—O—Si bond. The siloxane-based resin may include an organic group (e.g., an alkyl group or an aryl group) or a fluoro group as a substituent. The organic group may include a fluoro group.

There is no particular limitation on the method of forming the insulating layer 4021, and the insulating layer 4021 can be formed by any of the following methods and means depending on its material: a sputtering method, an SOG method, spin coating, dip coating, spray coating, a droplet discharging method (e.g., an ink-jet method, screen printing, or offset printing), a doctor knife, a roll coater, a curtain coater, a knife coater, and the like. When the insulating layer 4021 is formed using a material liquid, the semiconductor layer may be annealed (300° C. to 400° C.) in a step of baking the insulating layer 4021. The step of baking the insulating layer 4021 serves to anneal the semiconductor layer, whereby the display device can be efficiently manufactured.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode 4031 can be formed using a conductive composition containing a conductive macromolecule (also referred to as a conductive polymer). The pixel electrode formed using a conductive composition preferably has a sheet resistance of 10000 ohms/square or less and a light transmittance of 70% or more at a wavelength of 550 nm Moreover, the resistivity of the conductive polymer contained in the conductive composition is preferably equal to or less than 0.1 $\Omega \cdot$cm.

As the conductive polymer, a so-called π-electron conjugated conductive polymer can be used. For example, polyaniline or a derivative thereof, polypyrrole or a derivative thereof, polythiophene or a derivative thereof, a copolymer of two or more kinds of these materials, and the like can be given.

Further, a variety of signals and potentials are supplied to the signal line driver circuit 4003, which is formed separately, the scan line driver circuit 4004, and the pixel portion 4002 from an FPC 4018.

In this embodiment, a connection terminal electrode 4015 is formed using the same conductive film as the pixel electrode 4030 included in the liquid crystal element 4013. A terminal electrode 4016 is formed using the same conductive film as the source electrodes and the drain electrodes of the TFTs 4010 and 4011.

The connection terminal electrode 4015 is electrically connected to a terminal of the FPC 4018 through an anisotropic conductive film 4019.

Note that FIGS. 29A1, 29A2, and 29B illustrate the example in which the signal line driver circuit 4003 is separately formed and mounted on the first substrate 4001; however, this embodiment is not limited to this structure. The scan line driver circuit may be separately formed and then mounted, or only part of the signal line driver circuit or part of the scan line driver circuit may be separately formed and then mounted.

As described above, a system-on-panel display device can be formed. For the display device in this embodiment, the logic circuit in the above embodiments can be used in the driver circuit, for example, and the logic circuit can be formed in the same process as the TFT in the display portion.

Note that this embodiment can be combined with any of the structures disclosed in other embodiments as appropriate.

Embodiment 11

The display devices shown in Embodiments 6 to 10 can be applied to a variety of electronic devices (including amusement machines). Examples of electronic devices are television devices (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, and large game machines such as pachinko machines.

Figure 30A:
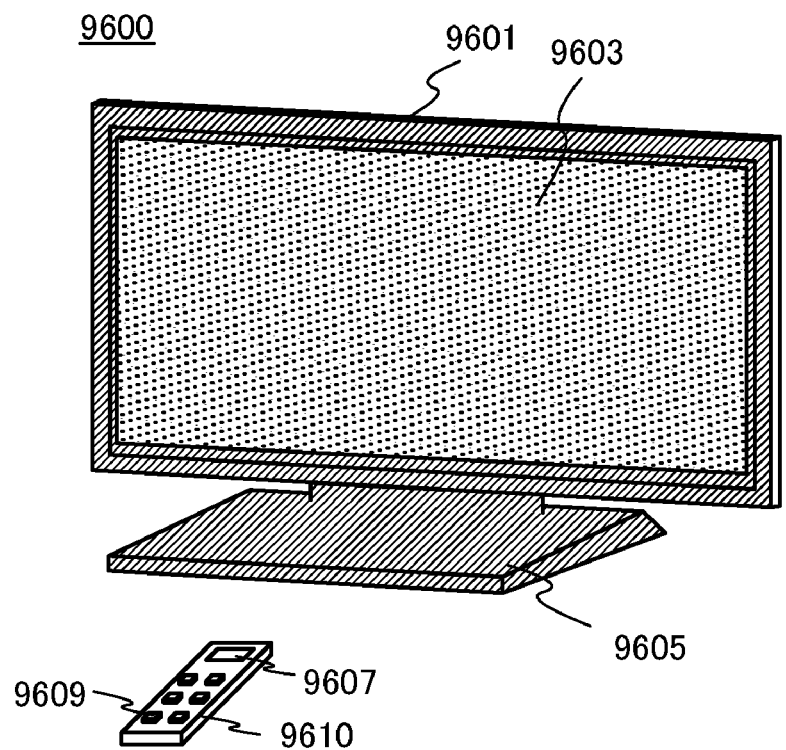
FIGS. 30A and 30B each illustrate an electronic device in Embodiment 11.

FIG. 30A illustrates an example of a television device 9600. In the television device 9600, a display portion 9603 is incorporated into a housing 9601. The display portion 9603 can display an image. Further, the housing 9601 is supported by a stand 9605 here.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television device 9600 is provided with a receiver, a modem, and the like. With the receiver, general television broadcast can be received. Further, when the television device 9600 is connected to a communication network by wired or wireless connection via the modem, one-way (from a transmitter to a receiver) or two-way (between a transmitter and a receiver or between receivers) data communication can be performed.

Figure 30B:
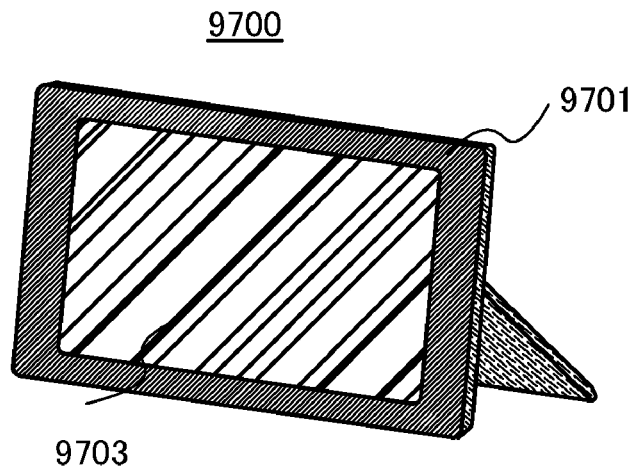

FIG. 30B illustrates an example of a digital photo frame 9700. For example, in the digital photo frame 9700, a display portion 9703 is incorporated into a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal, or a terminal which can be connected to various cables such as a USB cable), a recording medium insertion portion, and the like. Although these components may be provided on the surface on which the display portion is provided, it is preferable to provide them on the side surface or the rear surface for the design of the digital photo frame 9700. For example, a memory storing data of an image taken with a digital camera is inserted in the recording medium insertion portion of the digital photo frame, and the image data can be transferred and then displayed on the display portion 9703.

Further, the digital photo frame 9700 may be configured to transmit and receive data wirelessly. The structure may be employed in which desired image data is transferred wirelessly to be displayed.

Figure 31A:
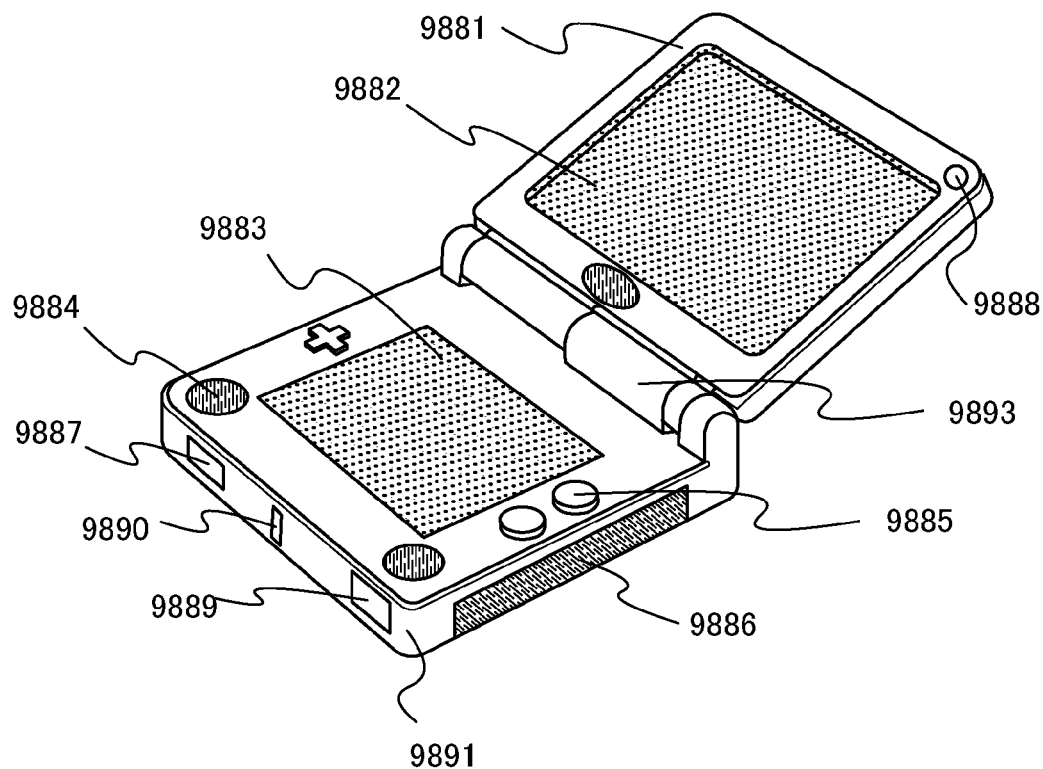
FIGS. 31A and 31B each illustrate an electronic device in Embodiment 11.

FIG. 31A is a portable game machine and includes two housings of a housing 9881 and a housing 9891, which are connected with a joint portion 9893 so that the portable game machine can be opened and folded. A display portion 9882 is incorporated into the housing 9881, and a display portion 9883 is incorporated into the housing 9891. Moreover, the portable game machine illustrated in FIG. 31A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least a display device is provided. The portable game machine in FIG. 31A has a function of reading a program or data stored in a recording medium to display an image on the display portion, and a function of sharing information with another portable game machine by wireless communication. Note that a function of the portable game machine in FIG. 31A is not limited to those described above, and the portable game machine can have a variety of functions.

Figure 31B:
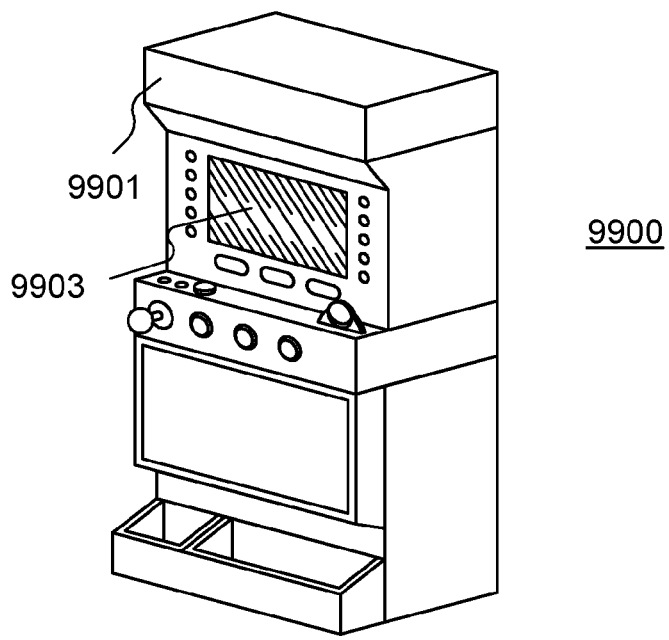

FIG. 31B illustrates an example of a slot machine 9900, which is a large amusement machine. In the slot machine 9900, a display portion 9903 is incorporated into a housing 9901. Moreover, the slot machine 9900 is provided with operation means such as a start lever and a stop switch, a coin slot, a speaker, and the like. Needless to say, the structure of the slot machine 9900 is not limited to the above structure. The slot machine may have a structure in which additional accessory equipment is provided as appropriate as long as at least the display device according to the present invention is provided.

Figure 32A:
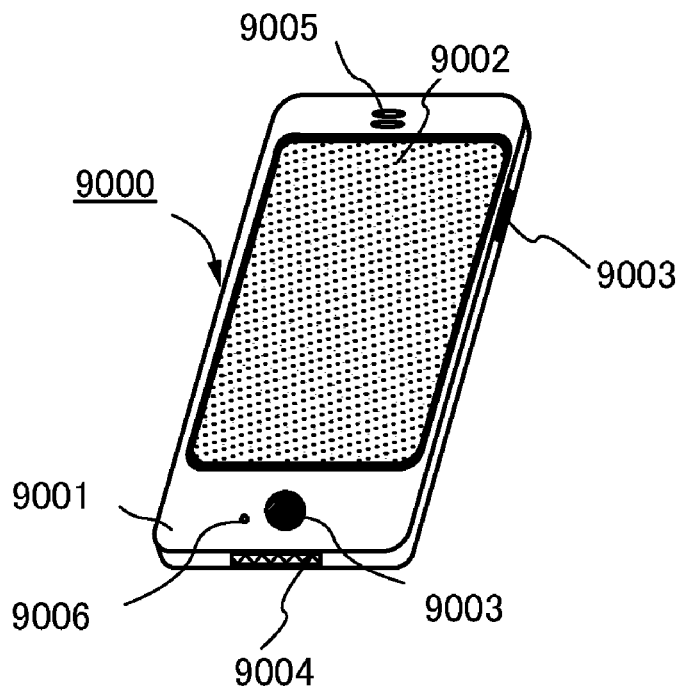
FIGS. 32A and 32B each illustrate an electronic device in Embodiment 11.

FIG. 32A illustrates an example of a mobile phone 9000. The mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 32A is touched with a finger or the like, data can be input into the mobile phone 9000. Further, operation such as making calls and texting can be performed by touching the display portion 9002 with a finger or the like.

There are mainly three screen modes of the display portion 9002. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, a text input mode mainly for inputting text is selected for the display portion 9002 so that characters displayed on a screen can be input. In that case, it is preferable to display a keyboard or number buttons on almost all area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation buttons 9003 of the housing 9001. Alternatively, the screen modes may be changed depending on the kind of the image displayed on the display portion 9002. For example, when a signal of an image displayed on the display portion is data of moving images, the screen mode is changed to the display mode. When the signal is text data, the screen mode is changed to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, when a backlight or a sensing light source which emits near-infrared light is provided in the display portion, an image of a finger vein, a palm vein, or the like can be taken.

Figure 32B:
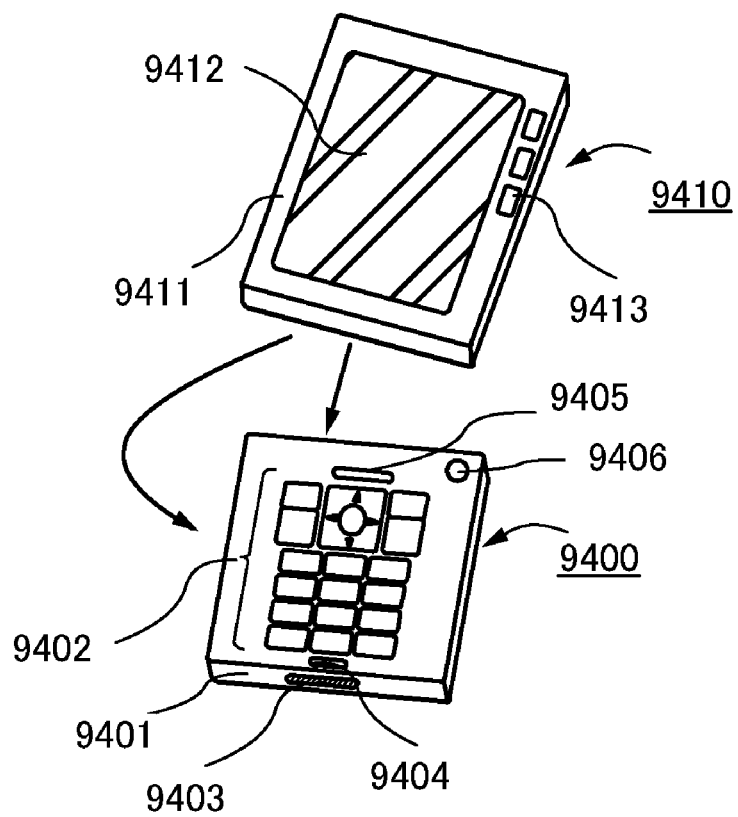

FIG. 32B illustrates another example of a mobile phone. The mobile phone in FIG. 32B includes a display device 9410 in a housing 9411, which includes a display portion 9412 and operation buttons 9413; and a communication device 9400 in a housing 9401, which includes operation buttons 9402, an external input terminal 9403, a microphone 9404, a speaker 9405, and a light-emitting portion 9406 that emits light when receiving a call. The display device 9410 having a display function can be detached from and attached to the communication device 9400 having a telephone function in two directions shown by arrows. Accordingly, short axes of the display device 9410 and the communication device 9400 can be attached to each other, or long axes of the display device 9410 and the communication device 9400 can be attached to each other. Further, when only a display function is necessary, the display device 9410 may be detached from the communication device 9400 so that the display device 9410 can be used by itself. The communication device 9400 and the display device 9410 can transmit and receive images or input information to/from each other by wireless communication or wired communication, and each of the communication device 9400 and the display device 9410 has a rechargeable battery.

Note that this embodiment can be combined with any of the structures disclosed in other embodiments as appropriate.

Example 1

Figure 33A:
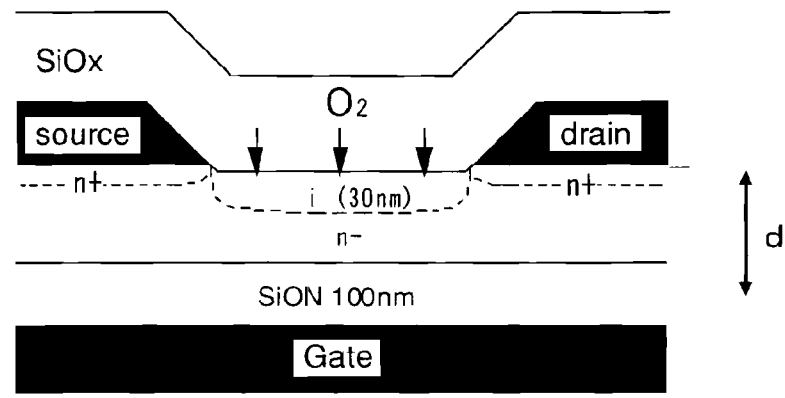
FIGS. 33A to 33C illustrate a thin film transistor in Example 1.

In this example, the results of computational verification of characteristics of transistors included in a logic circuit of one embodiment of the invention will be described. Specifically, characteristics of thin film transistors having oxide semiconductor layers with different thicknesses are compared. A cross-sectional structure of a thin film transistor used as a calculation model is illustrated in FIG. 33A. Note that a device simulation software "Atlas" manufactured by Silvaco Data Systems Inc. is used for the calculation.

Parameters used for the calculation are given below. A gate insulating film included in each thin film transistor is an SiON film having a thickness of 100 nm and a relative dielectric constant of 4.1. In addition, an oxide semiconductor layer has a band gap Eg of 3.05 eV, a relative dielectric constant of 10, an intrinsic electron mobility $\mu_n$ of 15 cm$^2$/Vs, and an intrinsic hole mobility $\mu_p$ of 0.1 cm$^2$/Vs.

Each thin film transistor has a channel length L of 10 μm and a channel width W of 100 μm. A region of the oxide semiconductor layer from an interface in contact with the oxide insulating film to a depth of 30 nm is assumed to be an i-type layer, and a region from the depth of 30 nm to the gate insulating film is assumed to be an n$^-$-type region (with a carrier concentration of 10$^{17}$/cm$^3$). Furthermore, regions of the oxide semiconductor layer in contact with a source electrode and a drain electrode are assumed to be regions where electrons generated by oxygen deficiency are present (also referred to as an n$^+$ region).

Figure 33B:
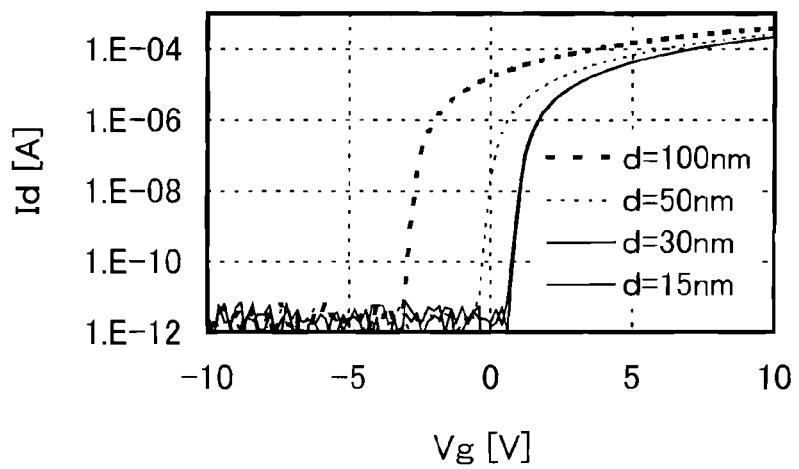
Figure 33C:
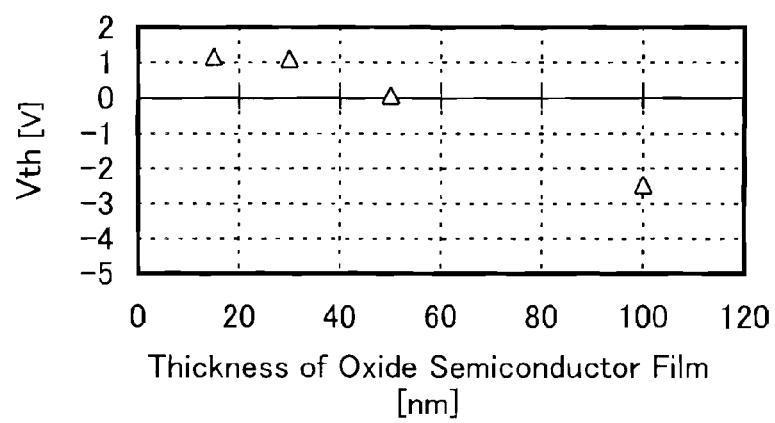

The thicknesses of oxide semiconductor layers are 15 nm, 30 nm, 50 nm, and 100 nm, and the results of calculation of Vg-Id curves are shown in FIG. 33B. Note that in the case of the oxide semiconductor layers having thicknesses of 15 nm and 30 nm, an oxide semiconductor layer in contact with and sandwiched between the oxide insulating film and the gate insulating film is assumed to be an i-type layer. In addition, the results of plotting the threshold voltage with respect to the thickness of the oxide semiconductor layer are shown in FIG. 33C.

It can be confirmed that in the case where an oxide semiconductor layer is 30 nm or less (specifically, in the cases of 15 nm and 30 nm), a thin film transistor has a positive threshold voltage and behaves as an enhancement transistor. On the other hand, it can be confirmed that in the case where an oxide semiconductor layer is 50 nm or more (specifically, in the cases of 50 nm and 100 nm), a thin film transistor has a negative threshold voltage and behaves as a depletion transistor.

A thin film transistor using an oxide semiconductor film for a channel formation region is turned on with electrons accumulated at the interface between the oxide semiconductor film and a gate insulating film to form a channel when a positive bias is applied to a gate electrode. On the other hand, a depletion layer is formed when a negative bias is applied to the gate electrode. The depletion layer expands from the gate insulating film interface to the interlayer film side as the absolute value of the negative bias for the gate electrode increases, and a transistor is turned off when fully depleted.

The oxide semiconductor layer included in a channel formation region of the thin film transistor of one embodiment of the invention, which has been subjected to dehydration or dehydrogenation and then provided with an oxide insulating film in contact with each other, has a suppressed carrier concentration. As a result, a transistor using a thin oxide semiconductor layer in a channel formation region behaves as an enhancement transistor.

In addition, as the thickness of the oxide semiconductor layer increases, the absolute value of a negative bias for the gate electrode which is needed to fully deplete the oxide semiconductor layer increases. As a result, a transistor using a thick oxide semiconductor layer in a channel formation region behaves as a depletion transistor.

This application is based on Japanese Patent Application serial no. 2009-215081 filed with Japan Patent Office on Sep. 16, 2009, the entire contents of which are hereby incorporated by reference.

EXPLANATION OF REFERENCE

101: transistor, 102: transistor, 103: power supply line, 104: power supply line, 105: node, 106: transistor, 107: transistor, 108: capacitor, 109: capacitor, 110: node, 111: transistor, 113: transistor, 114: node, 115: node, 125: node, 200: substrate, 202: gate insulating layer, 203: contact hole, 207: oxide insulating film, 208: protective insulating layer, 210: substrate, 211a: gate electrode, 211b: gate electrode, 212: gate insulating layer, 212a: gate electrode, 213: oxide semiconductor layer, 213a: oxide semiconductor layer, 213b: oxide semiconductor layer, 213c: oxide semiconductor layer, 214a: oxide semiconductor layer, 214b: oxide semiconductor layer, 214c: oxide semiconductor layer, 214d: oxide semiconductor layer, 215: electrode, 215a: electrode, 215b: electrode, 215c: electrode, 216: electrode, 217: electrode, 223a: oxide semiconductor layer, 223b: oxide semiconductor layer, 251: transistor, 252: transistor, 321: transistor, 322: transistor, 323: transistor, 324: power supply line, 325: power supply line, 326: node, 580: substrate, 581: TFT, 584: insulating layer, 585: insulating layer, 587: electrode, 588: electrode, 589: spherical particle, 590a: black region, 590b: white region, 594: cavity, 595: filler, 596: substrate, 701: pixel portion, 702: scan line driver circuit, 703: signal line driver circuit, 704: pixel, 803: scan line driver circuit, 804: scan line, 805: signal line, 821: transistor, 822: liquid crystal element, 823: capacitor, 851: transistor, 852: capacitor, 853: transistor, 854: light-emitting element, 855: scan line, 856: signal line, 900: shift register, 901: level shifter, 902: buffer, 903: shift register, 904: latch circuit, 905: latch circuit, 906: level shifter, 907: buffer, 1121: inverter, 1122: inverter, 1123: inverter, 2000: substrate, 2001: gate electrode, 2002: insulating film, 2003: oxide semiconductor layer, 2004a: oxide semiconductor layer, 2004b: oxide semiconductor layer, 2005a: electrode, 2005b: electrode, 2007: protective insulating layer, 2008: electrode, 2020: electrode, 2022: electrode, 2023: electrode, 2024: electrode, 2028: electrode, 2029: electrode, 2050: terminal, 2051: terminal, 2052: gate insulating layer, 2053: connection electrode, 2054: protective insulating film, 2055: transparent conductive film, 2056: electrode, 2070: TFT, 2111: gate electrode, 2112: gate electrode, 2131: oxide semiconductor layer, 2132: oxide semiconductor layer, 2141a: oxide semiconductor layer, 2141b: oxide semiconductor layer, 2142a: oxide semiconductor layer, 2142b: oxide semiconductor layer, 2700: e-book reader, 2701: housing, 2703: housing, 2705: display portion, 2707: display portion, 2711: axis portion, 2721: power supply switch, 2723: operation key, 2725: speaker, 3011: logic circuit, 3012: logic circuit, 3013: logic circuit, 3111: transistor, 3112: transistor, 3113: transistor, 3121A: inverter, 3121B: inverter, 3121C: inverter, 3122A: inverter, 3122B: inverter, 3122C: inverter, 3123A: inverter, 3123B: inverter, 3123C: inverter, 3131: transistor, 3131B: inverter, 3132: transistor, 3133: transistor, 3140: NAND circuit, 3141: NAND circuit, 3142: NAND circuit, 3143: NAND circuit, 3171: node, 3172: node, 3173: node, 4001: substrate, 4002: pixel portion, 4003: signal line driver circuit, 4004: scan line driver circuit, 4005: sealing material, 4006: substrate, 4008: liquid crystal layer, 4010: TFT, 4011: TFT, 4013: liquid crystal element, 4015: connection terminal electrode, 4016: terminal electrode, 4018: FPC, 4019: anisotropic conductive film, 4020: insulating layer, 4021: insulating layer, 4030: pixel electrode, 4031: counter electrode, 4032: insulating layer, 4035: spacer, 4501: substrate, 4502: pixel portion, 4503a: signal line driver circuit, 4504a: scan line driver circuit, 4505: sealing material, 4506: substrate, 4507: filler, 4509: TFT, 4510: TFT, 4511: light-emitting element, 4512: electroluminescent layer, 4513: electrode, 4515: connection terminal electrode, 4516: terminal electrode, 4517: electrode, 4518a: FPC, 4519: anisotropic conductive film, 4520: bank, 7001: TFT, 7002: light-emitting element, 7003: cathode, 7004: light-emitting layer, 7005: anode, 7011: driving TFT, 7012: light-emitting element, 7013: cathode, 7014: light-emitting layer, 7015: anode, 7016: light-blocking film, 7017: conductive film, 7021: driving TFT, 7022: light-emitting element, 7023: cathode, 7024: light-emitting layer, 7025: anode, 7027: conductive film, 9000: mobile phone, 9001: housing, 9002: display portion, 9003: operation button, 9004: external connection port, 9005: speaker, 9006: microphone, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: input means (operation key), 9886: recording medium insertion portion, 9887: connection terminal, 9888: sensor, 9889: microphone, 9890: LED lamp, 9891: housing, 9893: joint portion, 9900: slot machine, 9901: housing, and 9903: display portion.

The invention claimed is:

1. A logic circuit comprising:
   a depletion-type transistor in which a high power supply potential is applied to one of a source and a drain and a gate is connected to the other of the source and the drain; and
   an enhancement-type transistor in which one of a source and a drain is connected to the gate of the depletion-type transistor and a low power supply potential is applied to the other of the source and the drain, wherein the depletion-type transistor and the enhancement-type transistor each comprise:
a first gate electrode;
a gate insulating film over the first gate electrode;
an oxide semiconductor layer over the gate insulating film;
a source electrode and a drain electrode which overlap with edge portions of the first gate electrode and which are in contact with the oxide semiconductor layer;
an oxide insulating film in contact with the oxide semiconductor layer and over a channel formation region; and
a protective insulating layer in contact with the oxide insulating film and over the oxide insulating film,
wherein a thickness of the oxide semiconductor layer of the depletion-type transistor is larger than a thickness of the oxide semiconductor layer of the enhancement-type transistor,
wherein a first signal is input to the first gate electrode of the enhancement-type transistor,
wherein a potential of a portion where the enhancement-type transistor and the depletion-type transistor are connected to each other is output as a second signal, and
wherein one of the depletion-type transistor and the enhancement-type transistor comprises a second gate electrode.

2. A logic circuit comprising:
a first transistor in which a first clock signal is input to a gate and an input signal is input to one of a source and a drain;
a first inverter circuit whose input terminal is electrically connected to the other of the source and the drain of the first transistor;
a second inverter circuit whose input terminal is electrically connected to an output terminal of the first inverter circuit;
a third inverter circuit whose input terminal is electrically connected to the output terminal of the first inverter circuit and which outputs an output signal from an output terminal; and
a second transistor in which a second clock signal is input to a gate, one of a source and a drain is electrically connected to the other of the source and the drain of the first transistor, and the other of the source and the drain is electrically connected to an output terminal of the second inverter circuit,
wherein the first inverter circuit and the second inverter circuit include the logic circuit according to claim 1.

3. The logic circuit according to claim 1 or 2, wherein the oxide semiconductor layer comprises indium, gallium, and zinc.

4. The logic circuit according to claim 1,
wherein the oxide semiconductor layer of the depletion-type transistor includes a first layer and a second layer on the first layer, and
wherein the oxide semiconductor layer of the enhancement-type transistor is a single layer.

5. The logic circuit according to claim 4, wherein a thickness of the second layer of the depletion-type transistor is the same as a thickness of the oxide semiconductor layer of the enhancement-type transistor.

6. The logic circuit according to claim 1, wherein the source electrode or the drain electrode is connected to the first gate electrode through a contact hole in the gate insulating film in the depletion-type transistor.

7. A logic circuit comprising:
a depletion-type transistor in which a high power supply potential is applied to one of a source and a drain and a gate is connected to the other of the source and the drain; and
an enhancement-type transistor in which one of a source and a drain is connected to the gate of the depletion-type transistor and a low power supply potential is applied to the other of the source and the drain,
wherein the depletion-type transistor and the enhancement-type transistor each comprise:
a gate electrode;
a gate insulating film over the gate electrode;
a source electrode and a drain electrode which overlap with edge portions of the gate electrode and which are provided over the gate insulating film;
an oxide semiconductor layer over the gate electrode, the oxide semiconductor layer being over and covering edge portions of the source electrode and the drain electrode;
an oxide insulating film in contact with the oxide semiconductor layer and over a channel formation region; and
a protective insulating layer in contact with the oxide insulating film and over the oxide insulating film,
wherein a thickness of the oxide semiconductor layer of the depletion-type transistor is larger than a thickness of the oxide semiconductor layer of the enhancement-type transistor,
wherein a first signal is input to the gate electrode of the enhancement-type transistor, and
wherein a potential of a portion where the enhancement-type transistor and the depletion-type transistor are connected to each other is output as a second signal.

8. A logic circuit comprising:
a first transistor in which a first clock signal is input to a gate and an input signal is input to one of a source and a drain;
a first inverter circuit whose input terminal is electrically connected to the other of the source and the drain of the first transistor;
a second inverter circuit whose input terminal is electrically connected to an output terminal of the first inverter circuit;
a third inverter circuit whose input terminal is electrically connected to the output terminal of the first inverter circuit and which outputs an output signal from an output terminal; and
a second transistor in which a second clock signal is input to a gate, one of a source and a drain is electrically connected to the other of the source and the drain of the first transistor, and the other of the source and the drain is electrically connected to an output terminal of the second inverter circuit,
wherein the first inverter circuit and the second inverter circuit include the logic circuit according to claim 7.

9. The logic circuit according to claim 7 or 8, wherein the oxide semiconductor layer comprises indium, gallium, and zinc.

10. The logic circuit according to claim 7,
wherein one of the depletion-type transistor and the enhancement-type transistor comprises a second gate electrode.

11. The logic circuit according to claim 7,
wherein the oxide semiconductor layer of the depletion-type transistor includes a first layer and a second layer on the first layer, and wherein the oxide semiconductor layer of the enhancement-type transistor is a single layer.

12. The logic circuit according to claim 11, wherein a thickness of the second layer of the depletion-type transistor is the same as a thickness of the oxide semiconductor layer of the enhancement-type transistor.

13. The logic circuit according to claim 7, wherein the source electrode or the drain electrode is connected to the gate electrode through a contact hole in the gate insulating film in the depletion-type transistor.

14. A light emitting device comprising the logic circuit according to any one of claims 1, 2, 7, and 8.

15. A light emitting device comprising the logic circuit according to claim 14, wherein the light emitting device is a lighting device.

16. A semiconductor device comprising the logic circuit according to any one of claims 1, 2, 7, and 8.

17. An electronic device comprising the logic circuit according to any one of claims 1, 2, 7, and 8.

18. A logic circuit comprising:
a first transistor in which a high power supply potential is applied to one of a source and a drain and a gate is connected to the other of the source and the drain; and
a second transistor in which one of a source and a drain is connected to the gate of the first transistor and a low power supply potential is applied to the other of the source and the drain,
wherein the first transistor and the second transistor each comprise:
a first gate electrode;
a gate insulating film over the first gate electrode;
an oxide semiconductor layer over the gate insulating film;
a source electrode and a drain electrode which overlap with edge portions of the first gate electrode and which are in contact with the oxide semiconductor layer;
an oxide insulating film in contact with the oxide semiconductor layer and over a channel formation region; and
a protective insulating layer in contact with the oxide insulating film and over the oxide insulating film,
wherein a thickness of the oxide semiconductor layer of the first transistor is larger than a thickness of the oxide semiconductor layer of the second transistor,
wherein a first signal is input to the first gate electrode of the second transistor,
wherein a potential of a portion where the second transistor and the first transistor are connected to each other is output as a second signal, and wherein one of the first transistor and the second transistor comprises a second gate electrode.

19. The logic circuit according to claim 18, wherein the first transistor is a depletion-type transistor and the second transistor is an enhancement-type transistor.

20. The logic circuit according to claim 18, wherein the oxide semiconductor layer comprises indium, gallium, and zinc.

21. A logic circuit comprising:
a first transistor in which a high power supply potential is applied to one of a source and a drain and a gate is connected to the other of the source and the drain; and
a second transistor in which one of a source and a drain is connected to the gate of the first transistor and a low power supply potential is applied to the other of the source and the drain,
wherein the first transistor and the second transistor each comprise:
a gate electrode;
a gate insulating film over the gate electrode;
a source electrode and a drain electrode which overlap with edge portions of the gate electrode and which are provided over the gate insulating film;
an oxide semiconductor layer over the gate electrode, the oxide semiconductor layer being over and covering edge portions of the source electrode and the drain electrode;
an oxide insulating film in contact with the oxide semiconductor layer and over a channel formation region; and
a protective insulating layer in contact with the oxide insulating film and over the oxide insulating film,
wherein a thickness of the oxide semiconductor layer of the first transistor is larger than a thickness of the oxide semiconductor layer of the second transistor,
wherein a first signal is input to the gate electrode of the second transistor, and
wherein a potential of a portion where the second transistor and the first transistor are connected to each other is output as a second signal.

22. The logic circuit according to claim 21, wherein the first transistor is a depletion-type transistor and the second transistor is an enhancement-type transistor.

23. The logic circuit according to claim 21, wherein the oxide semiconductor layer comprises indium, gallium, and zinc.

24. The logic circuit according to claim 21,
wherein one of the first transistor and the second transistor comprises a second gate electrode.

* * * * *